(12) United States Patent
Yagishita et al.

(10) Patent No.: US 6,346,438 B1
(45) Date of Patent: Feb. 12, 2002

(54) METHOD OF MANUFACTURING A SEMICONDUCTOR DEVICE

(75) Inventors: Atsushi Yagishita; Kouji Matsuo; Yasushi Akasaka; Kyoichi Suguro; Yoshitaka Tsunashima, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/105,960

(22) Filed: Jun. 29, 1998

(30) Foreign Application Priority Data

Jun. 30, 1997 (JP) .............................................. 9-174195

(51) Int. Cl.[7] ............................................ H01L 21/336
(52) U.S. Cl. ..................... 438/197; 438/300; 438/586; 438/589; 438/926; 438/259
(58) Field of Search ............................... 438/259, 270, 438/589, 296, 585, 586, 595, 197, 211, 272, 279, 283, 213, 218, 219, 221, 225, 294, 295, 297, 300, 926

(56) References Cited

U.S. PATENT DOCUMENTS 6,001,692 A * 12/1999 Gil .............................. 438/279
6,228,729 B1 * 5/2001 Ni ............................... 438/300

FOREIGN PATENT DOCUMENTS

JP      9-312391      12/1997

* cited by examiner

*Primary Examiner*—Mary Wilczewski
(74) *Attorney, Agent, or Firm*—Finnegan, Henderson, Farabow, Garrett, & Dunner, L.L.P.

(57) ABSTRACT

A method of manufacturing a semiconductor device according to this invention is characterized by including the steps of a) forming, on one major surface of a substrate, a gate structure constituted by either one of a dummy gate electrode and a gate electrode having an insulating film at least on bottom surface, and a device isolation insulating film so as to form a first groove divided by the dummy gate electrode or the gate electrode, to position the dummy gate electrode or the gate electrode in the first groove, and to form the gate structure to have an upper surface level not higher than an upper level of the device isolation insulating film, and b) forming source and drain electrodes in the first groove.

32 Claims, 31 Drawing Sheets

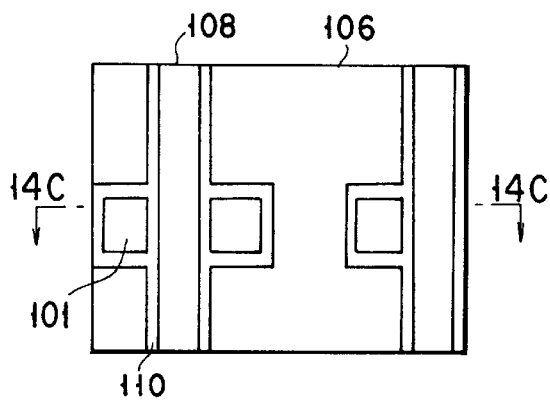
FIG.14A
FIG.14B
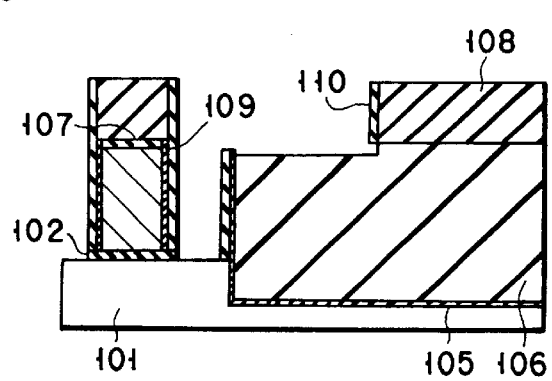
FIG.14D
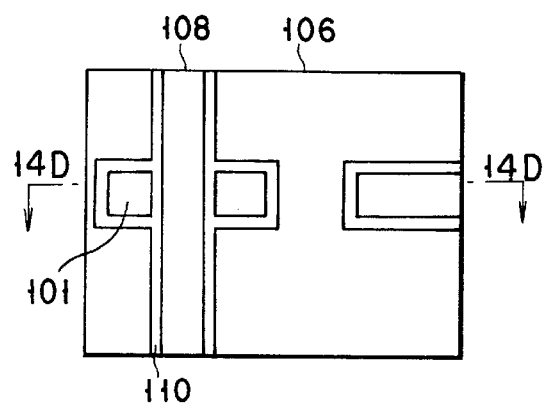
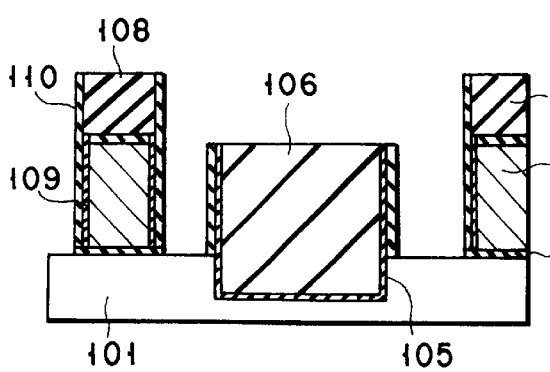
FIG.14C
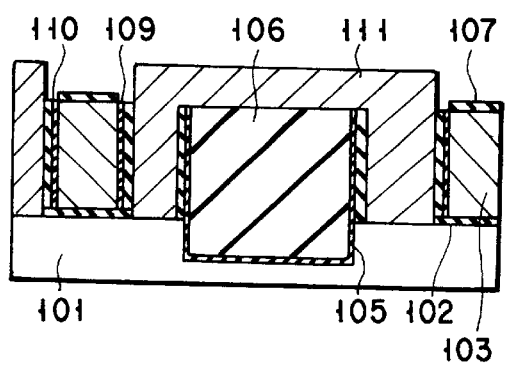
FIG.14E
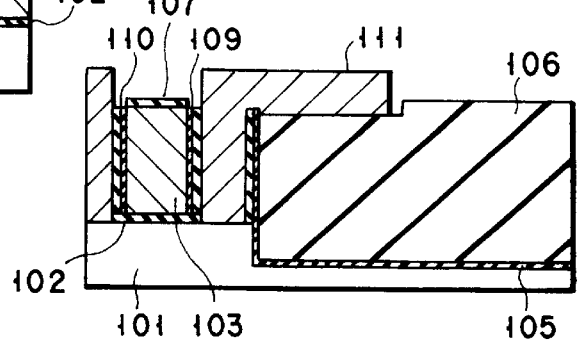
FIG.14F

METHOD OF MANUFACTURING A SEMICONDUCTOR DEVICE

BACKGROUND OF THE INVENTION

The present invention relates to a semiconductor device and a method of manufacturing the same.

Recently, demands have arisen for higher integration degree of LSIs and higher operation speeds thereof. To achieve this purpose, the sizes of respective members constituting a transistor are proportionally reduced. However, a reduction in gate electrode width to about 0.1 $\mu$m poses the following problems.

FIG. 1 is a sectional view schematically showing an example of a conventional MOSFET. In FIG. 1, e.g., an SiO$_2$ gate insulating film 2, and a gate electrode 3 prepared by heavily doping an n-type impurity such as phosphorus in polysilicon at $2 \times 10^{20}$ cm$^{-3}$ or more are sequentially stacked on one major surface of a p-type silicon substrate 1. An insulating gate sidewall 4 is formed on the side surface of the gate electrode 3 via a thermal oxidized film 10. An n-type impurity diffusion region 5 called an extension formed to be shallow below the gate sidewall 4, an n-type impurity diffusion region 6 formed to be deeper than the extension 5, and a device isolation region 7 made of, e.g., SiO$_2$ are formed in the surface region of the substrate 1. And a metal silicide layer 8 is formed on the source/drain region by SALICIDE (Self Align Silicide) method to reduce the resistance value of the source/drain diffusion layers. In the MOSFET shown in FIG. 1, the extension 5 and the n-type impurity diffusion region 6 serve as source and drain diffusion layer. The metal silicide layer 8 is also formed on the gate electrode 3.

In the MOSFET shown in FIG. 1, the extension 5 must be controlled to have a high impurity concentration of about 10$^{19}$ cm$^{-3}$ and a small depth of 0.05 $\mu$m or less in order to suppress increases in short channel effect and electrical resistance value. To make the extension 5 shallow, the ion implantation acceleration voltage must be controlled to be as low as several keV. However, at a low acceleration voltage, the ion current decreases, so ion implantation cannot be complete within an actual processing time.

To prevent the leakage current from increasing by a reverse bias at a p-n junction, the distance must be typically set to 0.07 $\mu$m or more between the bottom surface of the metal silicide layer 8 formed in the surface region of the substrate 1, and the bottom surface of the n-type impurity diffusion region 6. The thickness of the metal silicide layer 8 is determined such that the parasitic resistance value of the source/drain diffusion layer becomes much smaller than the resistance value upon continuous application of a voltage to the gate electrode 3. For this reason, the metal silicide layer 8 must be formed to a predetermined thickness for obtaining lower resistance value, e.g., 0.05 $\mu$m or more. In other words, the n-type impurity diffusion region 6 is formed to position its bottom surface at a depth of 0.12 $\mu$m or more from the surface of the substrate 1. In this case, however, so-called punch-through may occur to flow a current even upon no application of any voltage to the gate electrode 3, i.e., in an OFF state.

As a structure for preventing the punch-through, an elevated source/drain structure shown in FIG. 2B is known.

FIGS. 2A and 2B are sectional views, respectively, schematically showing the steps in manufacturing a conventional MOSFET having an elevated source/drain structure. The same reference numerals as in the MOSFET shown in FIG. 1 denote the same parts in the MOSFET shown in FIGS. 2A and 2B, and a description thereof will be omitted.

In manufacturing a conventional MOSFET having an elevated source/drain structure, Si is selectively epitaxially grown on an n-type impurity diffusion region 5 to form an Si film 9, as shown in FIG. 2A. That is, a region serving as a source/drain diffusion layer is extended to above a substrate 1. The Si film 9 is also formed on a gate electrode 3. As shown in FIG. 2B, ions are implanted to form an n-type impurity diffusion region 6. Further, as described with reference to FIG. 1, a metal silicide layer (not shown) is formed to obtain a MOSFET. In FIGS. 2A and 2B, the gate electrode 3 is formed to be lower than a gate sidewall 4 in order to prevent electrical connection between the gate electrode 3 and the source/drain region due to the lateral growth of the Si film 9 formed on the gate electrode 3.

In the MOSFET formed in this manner, although the n-type impurity diffusion region 6 is formed to a satisfactory thickness, its effective depth, i.e., the depth from the surface of the substrate 1 is smaller than that in the MOSFET shown in FIG. 1. More specifically, according to the MOSFET shown in FIGS. 2A and 2B, a larger distance can be set between the bottom surface of the metal silicide layer (not shown) and the bottom surface of the n-type impurity diffusion region 6. By this method, however, Si grows not only on the n-type impurity diffusion region 5 shown in FIG. 2A but also in the lateral direction. As a result, the Si film 9 is also formed on a device isolation region 7, making it difficult to maintain an insulating state between adjacent transistors.

Although the nMOS has been exemplified, the pMOS also has the same structure as that of the nMOS except for an opposite semiconductor conductivity type. Therefore, the above-described problems also occur in the pMOS.

BRIEF SUMMARY OF THE INVENTION

It is an object of the present invention to provide a semiconductor device capable of reducing its size and preventing punch-through, and a method of manufacturing the same.

It is another object of the present invention to provide a semiconductor device capable of maintaining an insulating state between devices even upon a reduction in size, and a method of manufacturing the same.

It is still another object of the present invention to provide a semiconductor device capable of reducing its size, preventing punch-through, and maintaining an insulating state between devices, and a method of manufacturing the same.

According to the present invention, there is provided a method of manufacturing a semiconductor device, comprising the steps of a) forming, on one major surface of a substrate, a gate structure constituted by either one of a dummy gate electrode and a gate electrode having an insulating film at least on bottom surface, and a device isolation insulating film so as to form a first groove divided by the dummy gate electrode or the gate electrode, to position the dummy gate electrode or the gate electrode in the first groove, and to form the gate structure to have an upper surface level not higher than an upper level of the device isolation insulating film, and b) forming source and drain electrodes in the first groove.

According to the present invention, there is also provided a method of manufacturing a semiconductor device, comprising the steps of forming a dummy gate wiring layer on one major surface of a substrate, forming a semiconductor film on an exposed surface of one major surface of a substrate, forming a semiconductor film on an exposed surface of one major surface of the substrate by using epitaxial growth, and forming, on the semiconductor film, a gate sidewall which is made of an insulator and covers a side surface of the dummy gate wiring layer.

According to the present invention, there is further provided a semiconductor device comprising a substrate, a device isolation insulating film formed on one major surface of the substrate, a gate electrode formed on one major surface of the substrate, a gate wiring layer formed on the device isolation insulating film and connected to the gate electrode, a source electrode and drain electrode arranged on one major surface of the substrate to face each other via the gate electrode, and an insulating film formed on a bottom surface and a side surface of the gate electrode and the gate wiring layer, and wherein the gate electrode, the gate wiring layer, the source electrode, and the drain electrode have upper surface levels equal to or lower than an upper surface level of the device isolation insulating film.

According to the present invention, there is still further provided a semiconductor device comprising a substrate, a gate wiring layer formed on one major surface of the substrate, an insulating film formed between the substrate and the gate wiring layer and on a side surface of the gate wiring layer, a pair of thin films formed by epitaxial growing a semiconductor on one major surface of the substrate, and arranged on two sides of the gate wiring layer, and a gate sidewall formed on the pair of thin films, covering the side surface of the gate wiring layer, and made of an insulator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described below with reference to the several views of the accompanying drawing.

The first embodiment will be explained.

FIGS. 3A to 3K are perspective views, respectively, schematically showing the manufacturing steps according to the first embodiment of the present invention. The first embodiment will be described with reference to FIGS. 3A to 3K.

Figure 1:
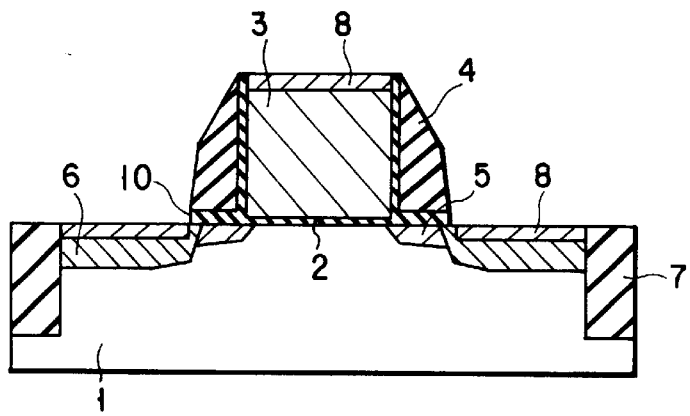
FIG. 1 is a sectional view schematically showing a conventional MOSFET.
Figure 2A:
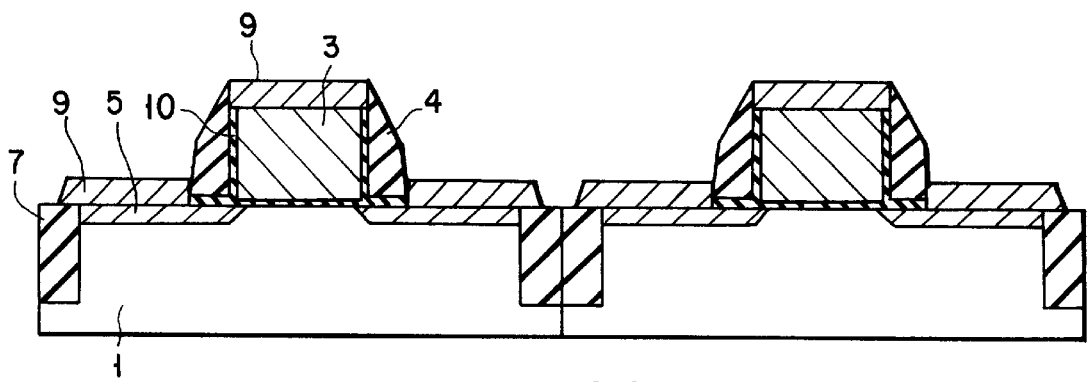
FIGS. 2A and 2B are sectional views, respectively, schematically showing the steps in manufacturing a conventional MOSFET having an elevated source/drain structure.
Figure 2B:
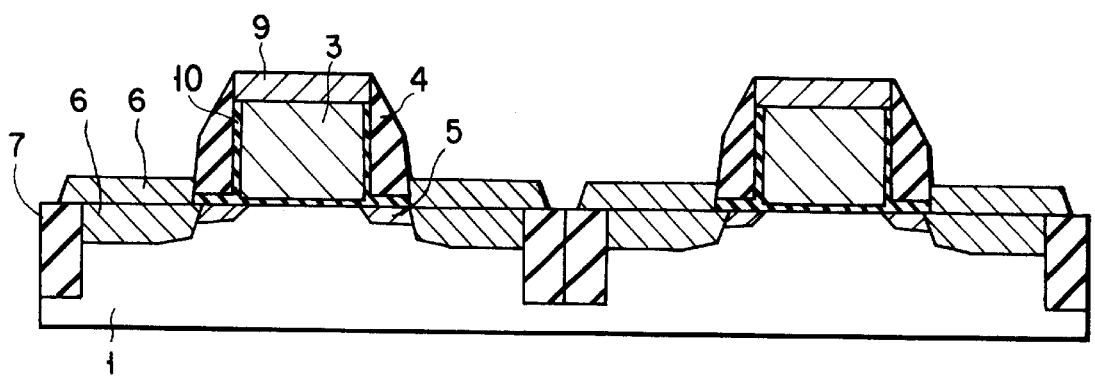
Figure 3A:
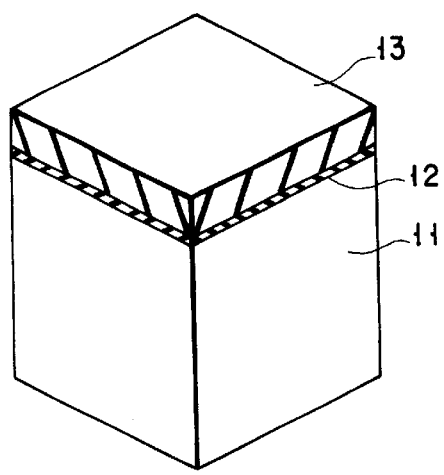
FIGS. 3A to 3K are perspective views, respectively, schematically showing the manufacturing steps according to the first embodiment of the present invention.

As shown in FIG. 3A, a thermal oxide film 12 having a thickness of about 5 nm is formed on an exposed (100) face of a silicon substrate 11. Silicon nitride is deposited by LPCVD on the thermal oxide film 12 to form a silicon nitride film 13 having a thickness of about 150 nm.

A resist pattern (not shown) is formed on the silicon nitride film 13 by photolithography or EB lithography. As shown in FIG. 3B, the silicon nitride film 13, the oxide film 12, and the silicon substrate 11 are etched by RIE (Reactive Ion Etching) to form a device region 15. A groove 14 formed at this time is used for device isolation (STI: Sallow Trench Isolation). The trench depth is set to about 300 nm.

Then, the groove 14 is filled with a TEOS-based oxide by forming a TEOS-based oxide film 16 to a thickness of, e.g., about 600 nm by CVD on the surface of the substrate 11 in which the groove 14 is formed. As shown in FIG. 3C, the TEOS-based oxide film 16 is flattened by CMP (Chemical Mechanical Polishing). At this time, since the silicon nitride film 13 functions as a stopper film, the polishing of the TEOS-based oxide film 16 by CMP can be stopped when the silicon nitride film 13 is exposed. The silicon nitride film 13 becomes slightly thin upon CMP but is left by about 130 nm by controlling CMP conditions.

Figure 3D:
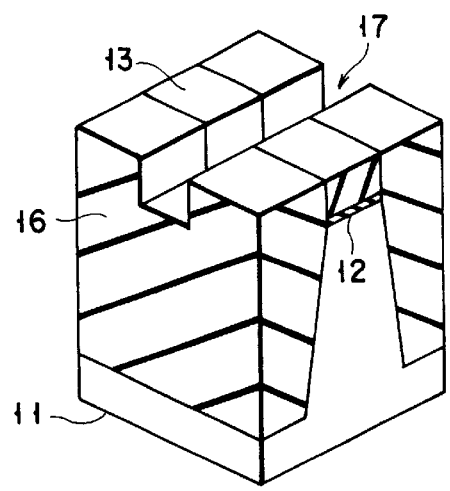
Figure 3B:
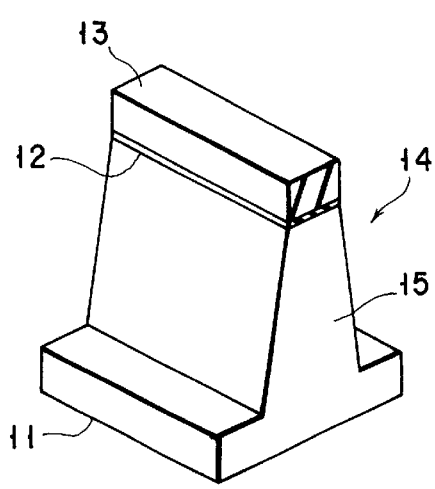

As shown in FIG. 3D, a groove 17 is formed to bury a gate electrode by the following method. First, a resist pattern (not shown) is formed by photolithography or EB lithography on a region except for a gate electrode formation region. The silicon nitride film 13 and the TEOS oxide film 16 formed in the gate electrode formation region are etched and removed by RIE. If necessary, a poly-silicon film may be formed below the silicon nitride film 13. In this case, an RIE of the silicon nitride film can be stopped when the polysilicon film is exposed.

The groove 17 is preferably formed to the same depth as the thickness of the silicon nitride film 13. If RIE is separately performed for the silicon nitride film 13 and the oxide film 16 under the conditions wherein a satisfactory etching selectivity can be obtained, the following merits can be attained. This will be explained with reference to FIGS. 4A to 4C.

Figure 4A:
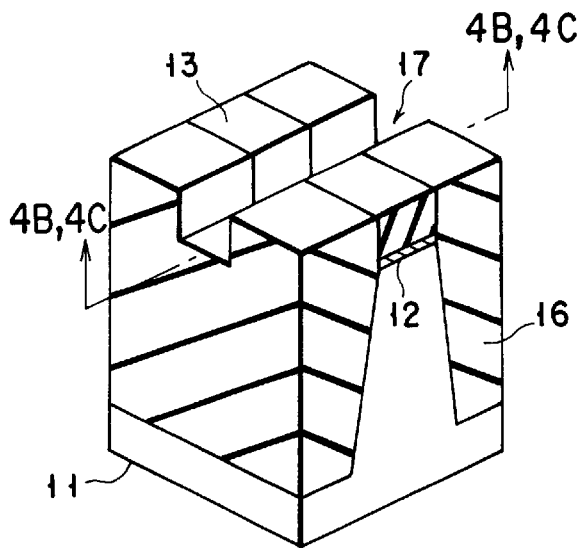
FIG. 4A is a perspective view schematically showing the manufacturing step according to the first embodiment of the present invention.
Figure 4B:
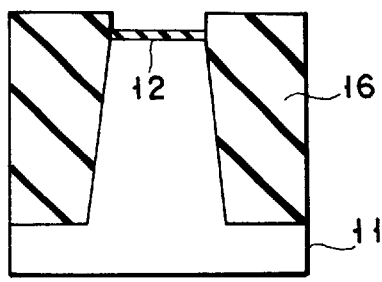
FIGS. 4B to 4C are sectional views taken along the lines 4B—4B and 4C—4C in FIG. 4A, respectively.
Figure 4C:
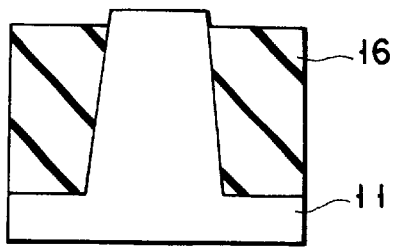

FIG. 4A schematically shows the same step as that shown in FIG. 3D. FIGS. 4B and 4C are sectional views taken along the lines 4B—4B and 4C—4C in FIG. 4A, respectively.

As shown in FIG. 4B, when RIE is performed for the TEOS oxide film 16 and then the nitride film 13, the thermal oxide film 12 is left below the nitride film 13 to prevent the silicon substrate 11 from being damaged by RIE. RIE is relatively slightly performed for the TEOS oxide film 16 and stops before the side surface of the device isolation groove is exposed. With this processing, no parasitic transistor is formed at a channel edge upon forming a transistor.

As shown in FIG. 4C, when RIE is performed for the nitride film 13 and then the oxide film 16, the oxide film 12 below the nitride film 13 is removed, so the silicon substrate 11 is damaged by RIE. Also when RIE is simultaneously performed for the nitride film 13 and the oxide film 16 under the conditions wherein no satisfactory etching selectivity is obtained between the nitride film and the oxide film, the oxide film 12 is removed, and the silicon substrate 11 is damaged by RIE. In this case, a parasitic transistor is formed at a channel edge to degrade the device characteristics.

Figure 3E:
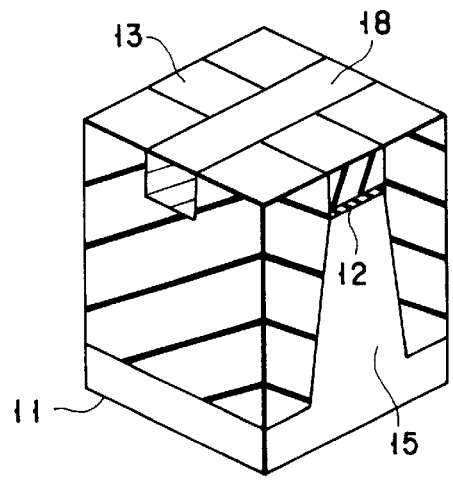
Figure 3C:
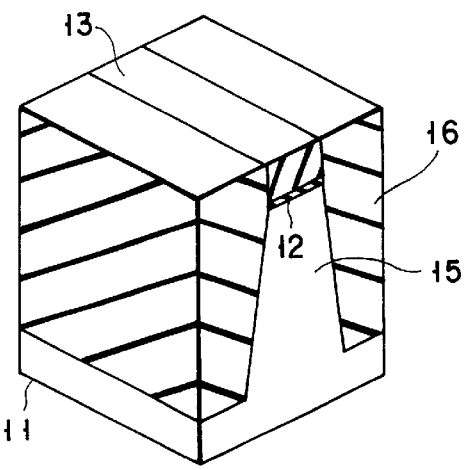

The description of the manufacturing steps shown in FIGS. 3A to 3K will be referred to again. As shown in FIG. 3E, the groove 17 is filled with polysilicon by forming a polysilicon film 18 to a thickness of about 300 nm by LPCVD on the surface of the substrate 11 in which the groove 17 is formed. Further, the polysilicon film 18 is left in only the groove 17 by CMP. This polysilicon film 18 is used as a dummy gate wiring layer. In this way, the upper surface levels of the polysilicon film 18, the TEOS oxide film 16, and the silicon nitride film 13 are aligned with each other to realize a completely flat surface. In this step, CMP conditions are controlled to leave the silicon nitride film 13 and the polysilicon film 18 to a thickness of about 110 nm.

Figure 3F:
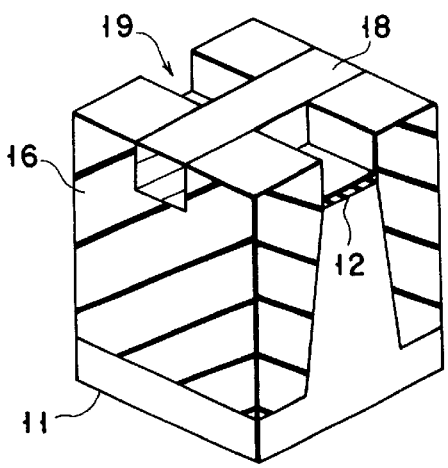

As shown in FIG. 3F, the silicon nitride film 13 is removed by etching with hot phosphoric acid, thereby forming a groove 19. As a result, the level of the polysilicon film 18 serving as a dummy gate electrode is aligned with the level of the TEOS oxide film 16 constituting a device isolation region, obtaining a structure in which source and drain electrode formation regions are recessed.

Figure 3G:
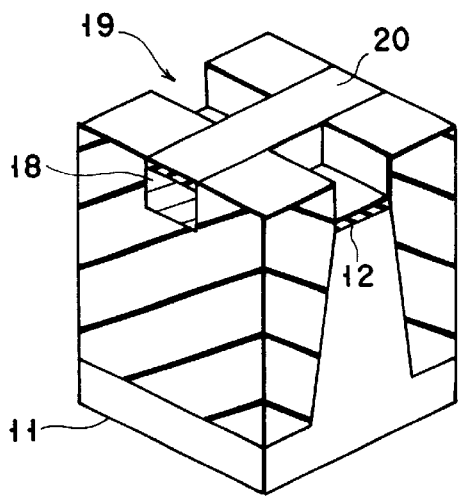

As shown in FIG. 3G, the side and upper surfaces of the polysilicon film 18 are oxidized to form oxide films 20 having a thickness of about 4 nm.

Figure 3J:
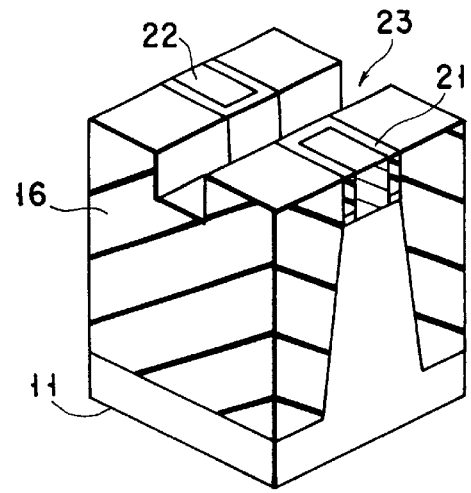
Figure 3H:
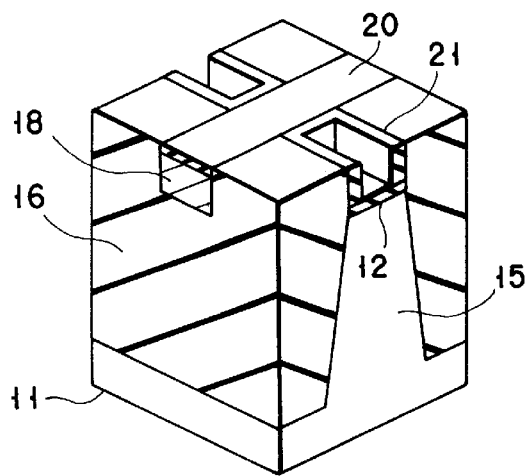

As shown in FIG. 3H, a silicon nitride film 21 having a thickness of about 15 to 20 nm is formed by LPCVD on the surface of the silicon substrate 11 in which the groove 19 is formed. While being selectively left on the sidewall of the groove (the sidewalls of the polysilicon film 18 and the TEOS oxide film 16), the silicon nitride film 21 is removed from the remaining region by entire surface RIE. After that, source and drain diffusion layers (not shown) are formed in surface regions positioned at the bottoms of the grooves in the silicon substrate 11. As the formation method, ion implantation, solid phase diffusion, vapor phase diffusion, or the like is available. If necessary, an elevated source/drain structure in which a source/drain formation region made of silicon is elevated may be formed by epitaxial growth.

Figure 3K:
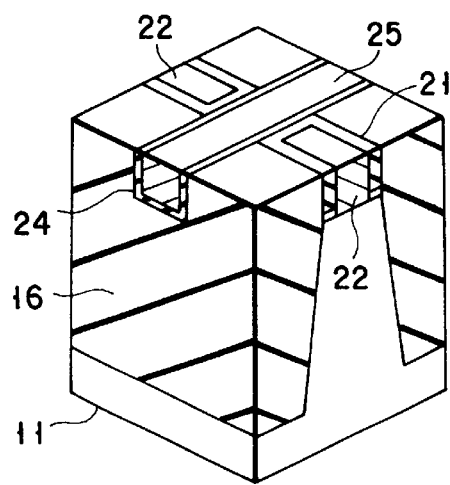
Figure 3I:
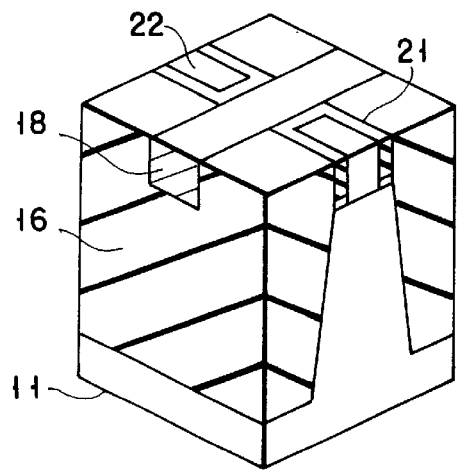

As shown in FIG. 3I, the thermal oxide film 12 is removed from the source/drain region by RIE or the like to expose the silicon surface. A silicide is sputtered to form a silicide (Co silicide or Ti silicide) film 22 having a thickness of about 100 nm. The silicide on the polysilicon film 18 (on the gate region) and on the TEOS oxide film 16 (on the device isolation region) is removed by CMP, thereby leaving the silicide 22 on only the source/drain region. Consequently, the silicide film 22 can be self-aligned on the source/drain region without silicidation annealing. Therefore, crystal defects can be reduced.

Instead of burying the silicide film as in the first embodiment, a tungsten film may be buried because any metal including not only a silicide but also tungsten may be directly adhered to the source/drain region in order to reduce the resistance of the source/drain region. A transistor formed in this manner exhibits good electrical characteristics at high speeds because of a small resistance in the source/drain region. In the following description, the silicide is adhered to the source/drain region, which also applies to tungsten.

Figure 5A:
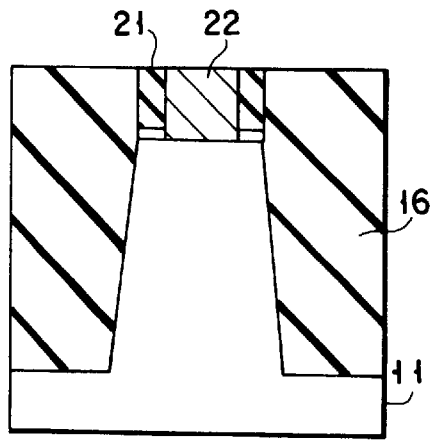
FIGS. 5A to 5C are sectional views, respectively, schematically showing the manufacturing steps according to the first embodiment of the present invention.
Figure 5B:
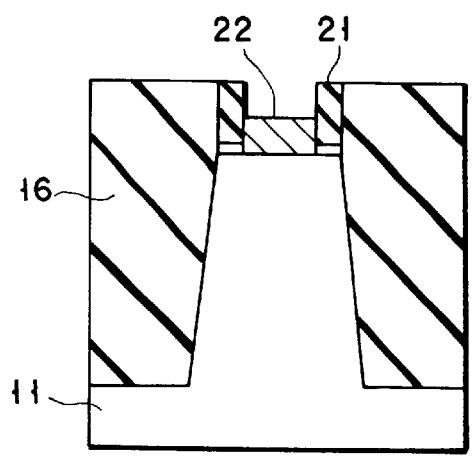
Figure 5C:
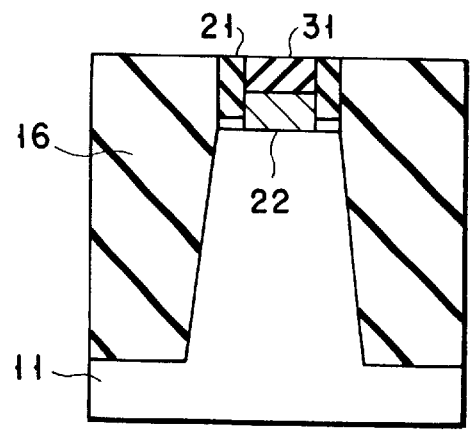

After the silicide film 22 is buried in the step of FIG. 3I, the silicide film 22 on the source/drain region may be recessed by about 50 nm by etching (i.e., the silicide film 22 has a thickness of about 50 nm), and the formed groove may be filled by LPCVD and CMP with a TEOS-based oxide film 31 serving as a cap film, as needed (FIGS. 5A to 5C).

In the first embodiment, after the step shown in FIG. 3I, the polysilicon film 18 serving as a dummy gate wiring layer is removed by RIE or the like, and the underlaying oxide film 12 is removed by an HF-based etching solution to form a groove 23, as shown in FIG. 3J.

As shown in FIG. 3K, a gate insulating film 24 having an effective thickness ($T_{eff}$) of about 3 to 4 nm in conversion into an oxide film is formed by deposition or thermal oxidization. Since the source/drain region has already been formed (and activated), and no high-temperature step is basically performed after this process step, the gate insulating film 24 can be made of a high-dielectric or ferroelectric film such as a $Ta_2O_5$ film or a $(Ba, Sr)TiO_3$ film. As a gate electrode (gate wiring layer), a refractory metal is available. When the gate insulating film is made of a high-dielectric or ferroelectric film, a gate wiring material must be selected in accordance with the type of gate insulating film in use. As the gate wiring layer, Ru, TiN, Al, and the like can be used. In the first embodiment, the gate insulating film 24 is made of a silicon oxide/nitride film. Subsequently, a barrier metal (TiN or tungsten nitride; not shown) having a thickness of about 5 to 10 nm is formed on the gate insulating film 24. A metal gate wiring material such as tungsten is deposited on the barrier metal by CVD and flattened by CMP to form a gate wiring layer 25.

If necessary, the metal gate wiring layer 25 is recessed by etching by about 30 nm (i.e., the metal gate wiring layer 25 has a thickness of about 70 nm). In this case, the formed groove is filled with silicon nitride by LPCVD and CMP to form a silicon nitride film serving as a cap film on the metal gate. By employing this process, even if a contact hole is erroneously formed above the gate wiring layer in the subsequent step, the silicon nitride film functions as an etching stopper to prevent short-circuiting between another wiring layer and the gate wiring layer.

Figure 6:
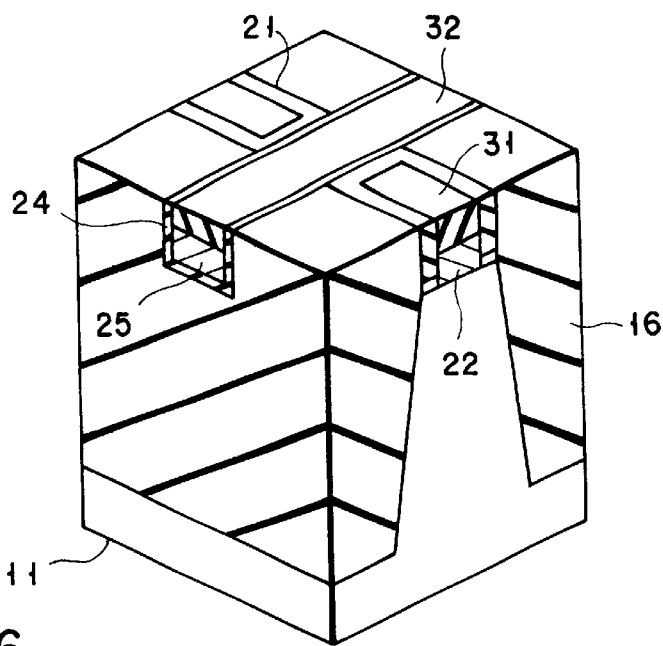
FIG. 6 is a perspective view showing a semiconductor device according to the first embodiment of the present invention.

FIG. 6 shows a case wherein the TEOS oxide film 31 is formed as a cap film on the source/drain electrode, and a silicon nitride film 32 is formed as a cap film on the gate wiring layer 25.

The subsequent steps follow the general LSI manufacturing process. More specifically, e.g., a TEOS interlayer insulating film is deposited, and contact holes for connecting the gate electrode, the source/drain electrode, and the upper wiring layer are formed in the interlayer insulating film. A metal wiring layer made of, e.g., aluminum is formed on the interlayer insulating film in which the contact holes are formed.

The second embodiment of the present invention will be described.

FIGS. 7A to 7D are sectional views, respectively, schematically showing the manufacturing steps according to the second embodiment of the present invention. Note that the steps in the second embodiment are the same as those in the first embodiment except for only the step shown in FIG. 3I. Only a step corresponding to the step shown in FIG. 3I is therefore explained.

Figure 7A:
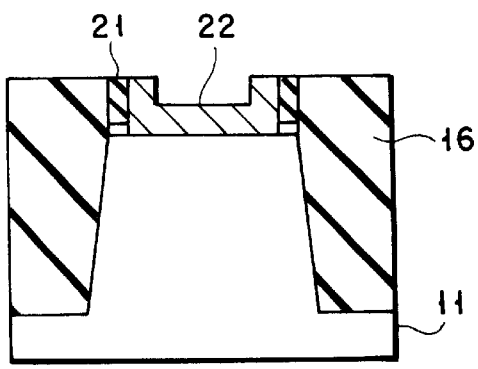
FIGS. 7A to 7D are sectional views, respectively, schematically showing the manufacturing steps according to the second embodiment of the present invention.
Figure 7C:
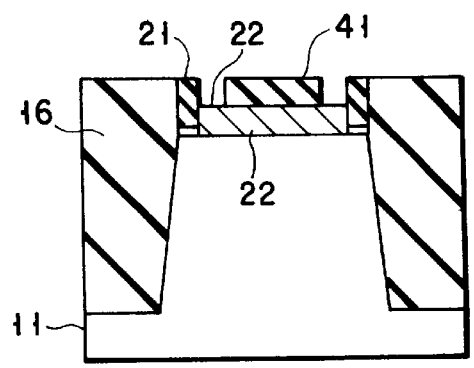
Figure 7B:
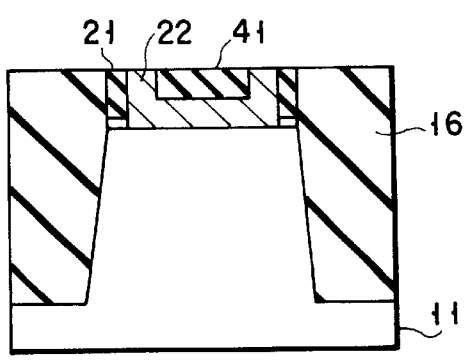
Figure 7D:
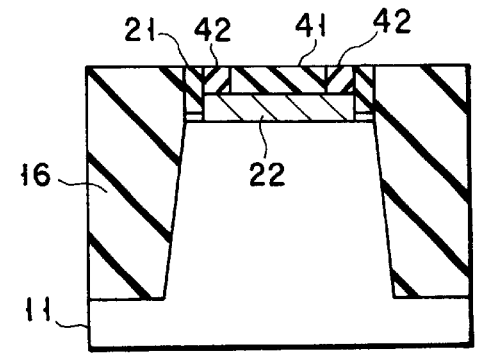

In the second embodiment, as shown in FIG. 7A, a silicide film 22 does not completely fill a groove in the source/drain region. For this reason, the groove formed by the silicide film 22 is filled with a TEOS oxide film 41 by CVD, and its surface is flattened by CMP, as shown in FIG. 7B. If necessary, the silicide film 22 is recessed by about 50 nm after the step in FIG. 7B, as shown in FIG. 7C. The formed groove is filled with a TEOS oxide film 42 by CVD and flattened, as shown in FIG. 7D. Accordingly, cap films made of the TEOS oxide films 41 and 42 can be formed on the silicide film 22. The subsequent steps are the same as those in the first embodiment.

In the second embodiment, even when the groove in the source/drain region cannot be completely filled with the silicide film 22, the remaining groove is filled with the TEOS oxide film to effectively prevent adverse influence on the subsequent steps.

The third embodiment of the present invention will be described.

FIGS. 8A to 8F are perspective views, respectively, schematically showing the manufacturing steps according to the third embodiment of the present invention. Note that the steps in the third embodiment are the same as the steps shown in FIGS. 3A to 3D in the first embodiment, and subsequent steps are different from the steps in the first embodiment. Therefore, steps subsequent to the step shown in FIG. 3D will be explained.

Figure 8A:
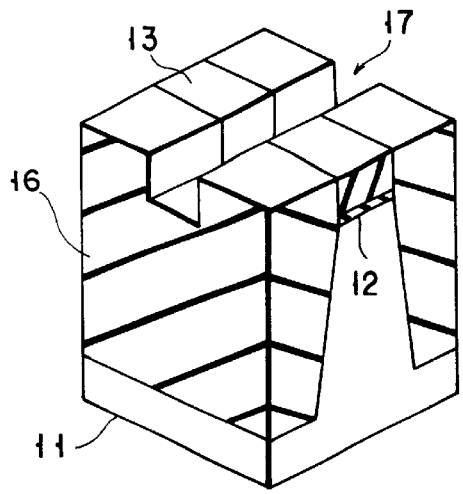
FIGS. 8A to 8F are perspective views, respectively, schematically showing the manufacturing steps according to the third embodiment of the present invention.

As shown in FIG. 8A, an oxide film 12 is removed with an HF-based solution from the bottom of a groove 17 for burying a gate wiring layer. As shown in FIG. 8B, a gate insulating film 51 is formed. Thereafter, a polysilicon film 52 serving as a gate electrode (gate wiring layer) is formed to a thickness of about 300 nm by LPCVD to fill the groove 17, and is flattened by CMP. The surface levels of the polysilicon film 52, a TEOS oxide film 16, and a silicon nitride film 13 are aligned with each other to realize a completely flat surface. In CMP, its conditions are controlled to leave the silicon nitride film 13 and the polysilicon film 52 having a thickness of about 100 nm.

Figure 8D:
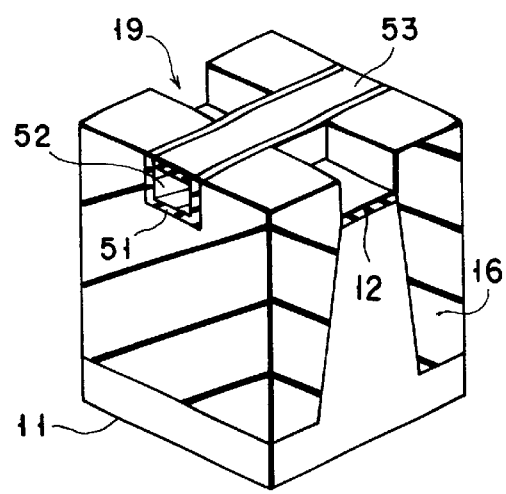
Figure 8B:
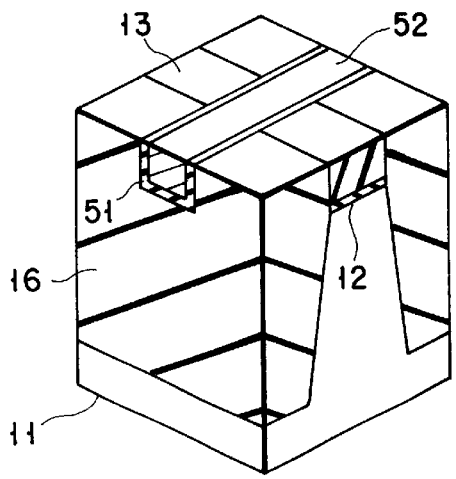
Figure 8E:
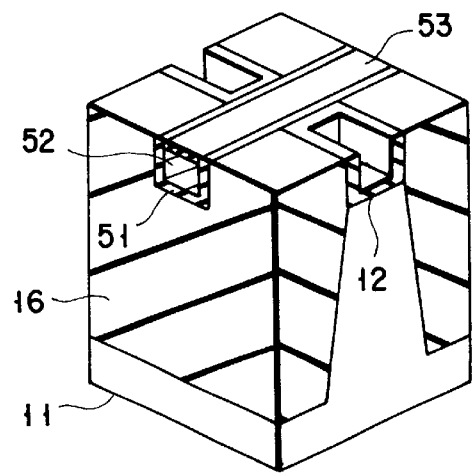
Figure 8C:
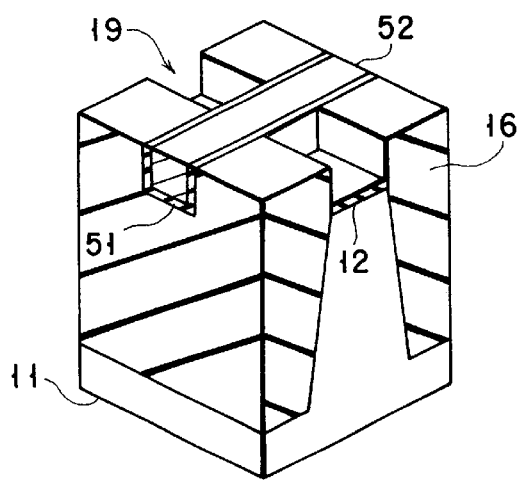

As shown in FIG. 8C, the silicon nitride film 13 is removed by etching with hot phosphoric acid, thereby forming a groove 19. As a result, the level of the polysilicon film 52 serving as a gate wiring layer is aligned with the level of the TEOS oxide film 16 for a device isolation region. A structure in which only a source/drain electrode formation region is recessed is formed.

As shown in FIG. 8D, the surface of the polysilicon film 52 is oxidized to form an oxide film 53 having a thickness of about 4 nm.

As shown in FIG. 8E, a silicon nitride film 21 having a thickness of about 15 to 20 nm is formed by LPCVD. While being selectively left on the sidewall of the groove (the sidewalls of the polysilicon film 52 and the TEOS oxide film 16), the silicon nitride film 21 is removed from the remaining region by entire surface RIE. After that, source and drain diffusion layers (not shown) are formed. As the formation method, ion implantation, solid phase diffusion, vapor phase diffusion, and the like are conceivable. If necessary, an elevated source/drain structure may be formed by epitaxial growth.

Figure 8F:
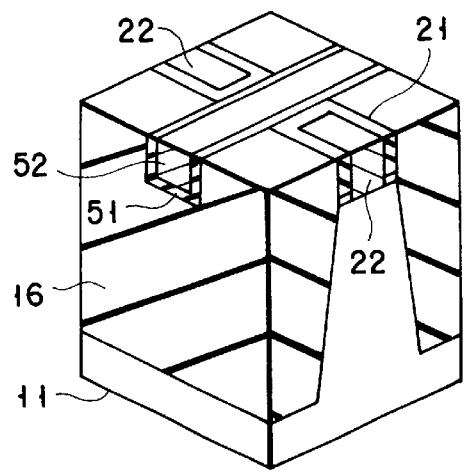

As shown in FIG. 8F, the thermal oxide film 12 is removed from the source/drain region by RIE or the like to expose the silicon surface. A silicide (Co silicide or Ti silicide) is sputtered to form a silicide film 22 having a thickness of about 100 nm. The silicide is removed by CMP from the polysilicon film 52 and the TEOS oxide film 16 (device isolation region), thereby leaving the silicide 22 on only the source/drain region. Consequently, the silicide film 22 can be self-aligned on the source/drain region without silicidation annealing. Therefore, crystal defects can be reduced.

Instead of burying the silicide film in the steps shown in FIGS. 8A to 8F, a tungsten film may be buried because a metal such as tungsten may be directly adhered to the source/drain region in order to reduce the resistance of the source/drain region. A transistor formed in this manner exhibits high speed and good electrical characteristics because of a small resistance in the source/drain region.

The subsequent steps follow the general LSI manufacturing process. More specifically, e.g., a TEOS interlayer insulating film is deposited, and contact holes for connecting the gate wiring layer, the source/drain electrode, and the upper wiring layer are formed in the interlayer insulating film. A metal wiring layer made of, e.g., aluminum is formed on the interlayer insulating film in which the contact holes are formed.

As described above, according to the first to third embodiments of the present invention, a MOSFET with a source/drain electrode made of a silicide can be obtained without silicidation annealing.

In a micropatterned device, a low-resistance silicide as a compound of a refractory metal and silicon is conventionally used for an electrode (source/drain electrode) on the source/drain region or a gate electrode. In the conventional device, however, dislocations easily occur near the interface between the silicide and silicon owing to stress along with volume expansion upon silicidation annealing. These dislocations degrade the reliability of a gate insulating film, and the characteristics of an electrically active region for forming a p-n junction, such as a channel region or a source/drain region.

When a source/drain electrode is self-aligned using a low-resistance material such as a silicide, the device reliability and the characteristics conventionally degrade.

To the contrary, according to the first to third embodiments, a MOSFET with a source/drain electrode made of a silicide can be obtained without silicidation annealing. By the first to third embodiments, a semiconductor device in which a source/drain electrode can be self-aligned using a low-resistance material such as a silicide, while the device reliability and the characteristics can be kept unchanged, and a method of manufacturing the same can be provided.

The fourth embodiment of the present invention will be described.

FIGS. 9A to 9H are perspective views, respectively, schematically showing the manufacturing steps according to the fourth embodiment of the present invention. Note that the steps in the fourth embodiment are the same as the steps shown in FIGS. 3A to 3D in the first embodiment, and subsequent steps are different from the steps in the first embodiment. Therefore, steps subsequent to the step shown in FIG. 3D will be explained.

Figure 9A:
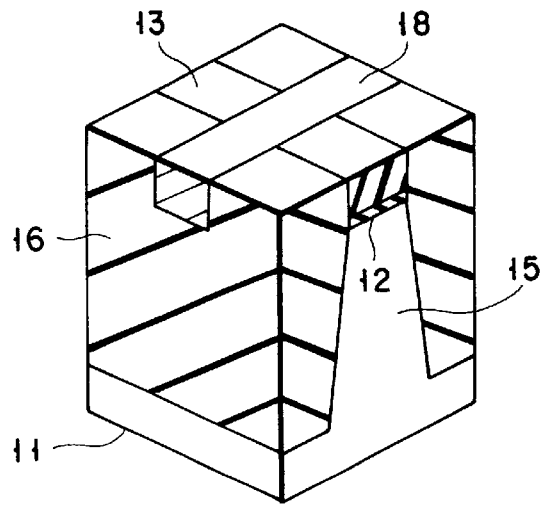
FIGS. 9A to 9H are perspective views, respectively, schematically showing the manufacturing steps according to the fourth embodiment of the present invention.

As shown in FIG. 9A, a hydrogen-containing silicon oxide film (to be referred to as an FOX film hereinafter) 18 is formed to a thickness of about 300 nm to fill a groove 17, and is flattened by CMP. The FOX film 18 has a composition of $H_{0.5}SiO_{0.5}$ and is characterized by an HF etching rate higher than that of a general $SiO_2$ film formed by thermal oxidation. The FOX film 18 left in the groove 17 is used as a dummy gate wiring layer.

In this manner, the surface levels of the FOX film 18, a TEOS oxide film 16, and a silicon nitride film 13 are aligned with each other to realize a completely flat surface. In CMP, its conditions are controlled to leave the silicon nitride film 13 and the FOX film 18 to a thickness of about 110 nm.

Figure 9C:
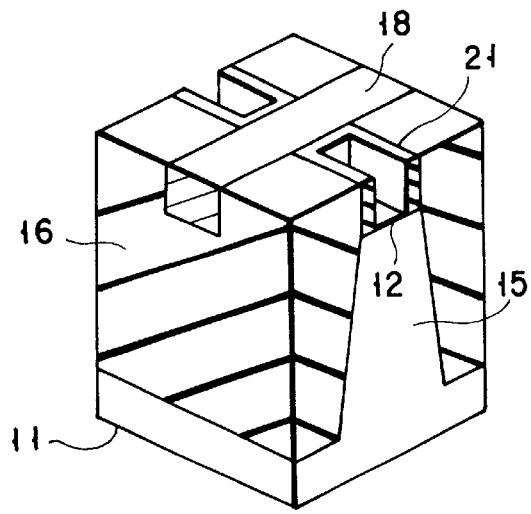
Figure 9B:
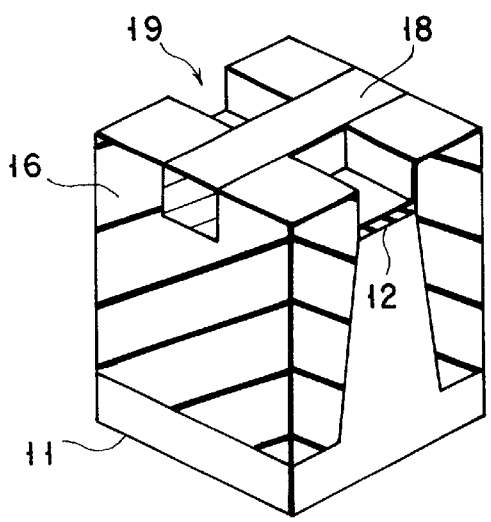

As shown in FIG. 9B, the silicon nitride film 13 is removed by etching with hot phosphoric acid, thereby forming a groove 19. As a result, the level of the FOX film 18 serving as a dummy gate electrode is aligned with the level of the TEOS oxide film 16 for a device isolation region. A structure in which only a source/drain electrode formation region is recessed is formed.

As shown in FIG. 9C, a silicon nitride film 21 having a thickness of about 10 to 20 nm is formed by LPCVD. While being selectively left on the sidewall of the groove (the sidewalls of the FOX film 18 and the TEOS oxide film 16), the silicon nitride film 21 is removed from the remaining region by entire surface RIE. At this time, the exposed portion of the oxide film 12 becomes thin or is removed by RIE. Thereafter, the silicon surface is exposed in the groove 19 by RIE or HF-based wet etching within a short time.

Figure 9D:
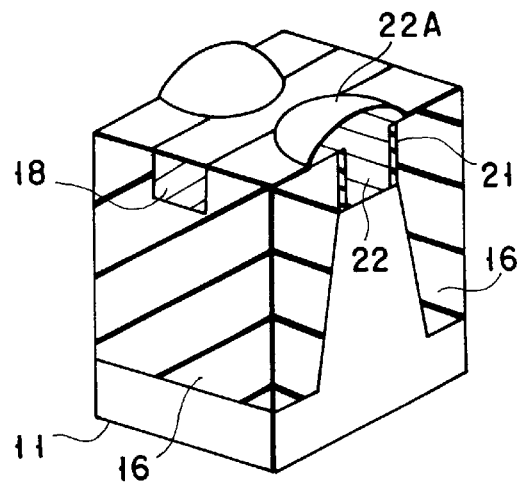

As shown in FIG. 9D, a source/drain formation region made of silicon is extended upward by epitaxial growth (a single-crystalline silicon film is formed). An overgrown portion such as a lateral growth portion 22A is removed by CMP to leave a crystalline silicon film 22 in only the groove 19.

Then, source and drain diffusion layers (not shown) for an nMOS and a PMOS are formed in the crystalline silicon film 22. As the formation method, ion implantation, solid phase diffusion, vapor phase diffusion, and the like are conceivable. Further, thermal process for activating a conductive impurity is performed.

Figure 9E:
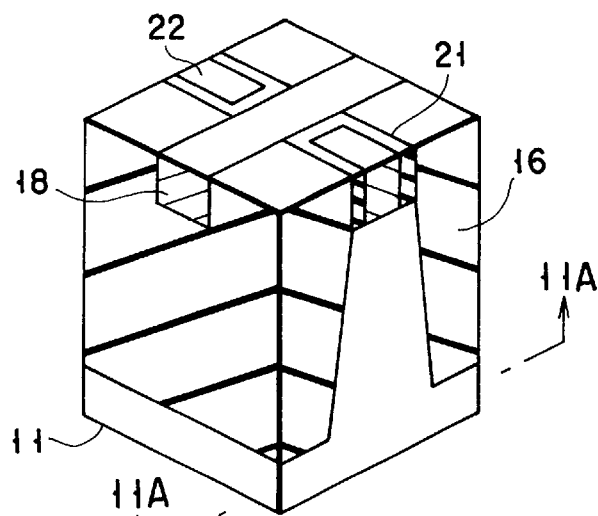
Figure 9G:
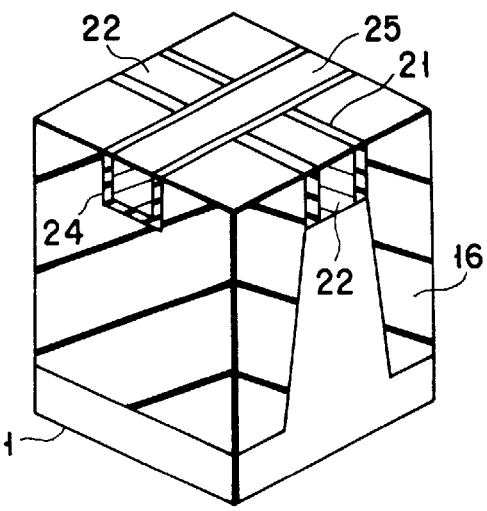
Figure 9F:
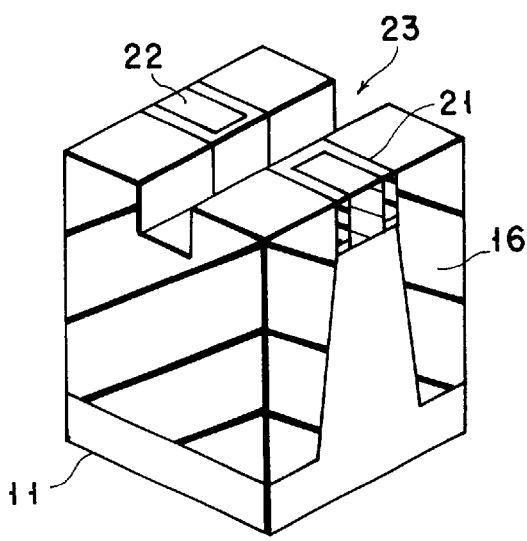

In the fourth embodiment, after the step shown in FIG. 9E, the FOX film 18 serving as a dummy gate wiring layer is removed by the HF solution or the like, and the underlaying oxide film 12 is removed by an HF-based etching solution to form a groove 23, as shown in FIG. 9F. The FOX film 18 can be selectively removed because of an HF etching rate higher than that of the TEOS-based oxide film 16, as described above.

The portion constituting part of the sidewall of the groove 23 in the nitride film 21 is removed by etching with hot phosphoric acid or the like. At this time, the upper portion of the remaining nitride film 21 may be etched. However, since the nitride film 21 is thin, its etching time suffices to be short. Therefore, even if the upper portion of the remaining nitride film 21 is etched, the removal amount is very small, so that the device characteristics are free from any adverse influence.

As shown in FIG. 9G, a gate insulating film 24 having an effective thickness ($T_{eff}$) of about 2 to 3 nm in conversion into an oxide film is formed by deposition or thermal oxidation. Since the source/drain region has already been formed (and activated), and no step at a high temperature of 600° C. or more is basically performed after this process step, the gate insulating film 24 can be made of a high-dielectric or ferroelectric film such as a $Ta_2O_5$ film or a $(Ba, Sr)TiO_3$ film. As a gate electrode (gate wiring layer), a metal material is available. When the gate insulating film is made of a high-dielectric or ferroelectric film, a gate wiring material must be selected in accordance with the type of gate insulating film in use. As the gate wiring layer, Ru, TiN, Al, W, and the like can be used. A TiN film, a WN film, or the like is desirably formed as a barrier metal between the gate insulating film and the gate electrode.

In the fourth embodiment, the gate insulating film 24 is made of a silicon oxide/nitride film. As shown in FIG. 9G, a barrier metal (TiN or tungsten nitride; not shown) having a thickness of about 5 to 10 nm is formed on the gate insulating film 24. A metal gate wiring material such as tungsten is deposited on the barrier metal by CVD and flattened by CMP to form a gate wiring layer 25.

If necessary, the metal gate wiring layer 25 is recessed by etching by about 30 nm (i.e., the metal gate wiring layer 25 has a thickness of about 70 nm). The formed groove is filled with silicon nitride by LPCVD and CMP to form a silicon nitride film serving as a cap film on the metal gate. By employing this process, even if a contact hole is erroneously formed above the gate wiring layer in the subsequent step, the silicon nitride film functions as an etching stopper to prevent short-circuiting between another wiring layer and the gate wiring layer.

Figure 9H:
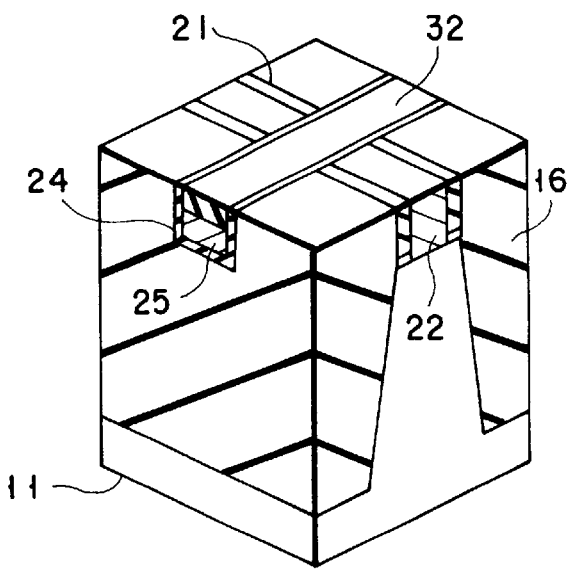

FIG. 9H shows a case wherein a silicon nitride film 32 is formed as a cap film on the metal gate wiring layer 25.

The subsequent steps follow the general LSI manufacturing process. More specifically, e.g., a TEOS interlayer insulating film is deposited, and contact holes for connecting the gate electrode, the source/drain electrode, and the upper wiring layer are formed therein. A metal wiring layer made of, e.g., aluminum is formed on the interlayer insulating film in which the contact holes are formed.

The fifth embodiment of the present invention will be described.

FIGS. 10A to 10E are perspective views, respectively, schematically showing the manufacturing steps according to the fifth embodiment of the present invention. Note that the steps in the fifth embodiment are the same as the steps shown in FIGS. 3A to 3D in the first embodiment, and subsequent steps are different from the steps in the first embodiment. Therefore, steps subsequent to the step shown in FIG. 3D will be explained.

Figure 10A:
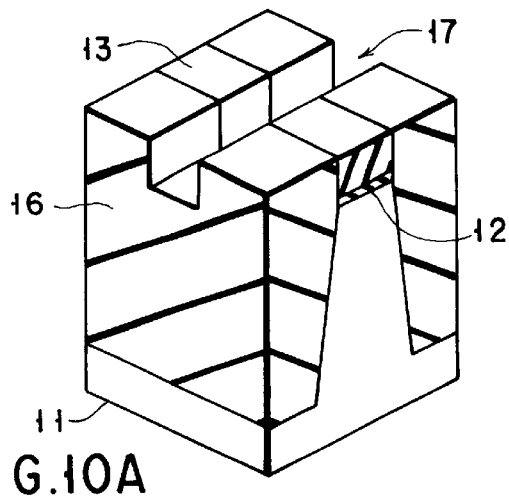
FIGS. 10A to 10E are perspective views, respectively, schematically showing the manufacturing steps according to the fifth embodiment of the present invention.
Figure 10B:
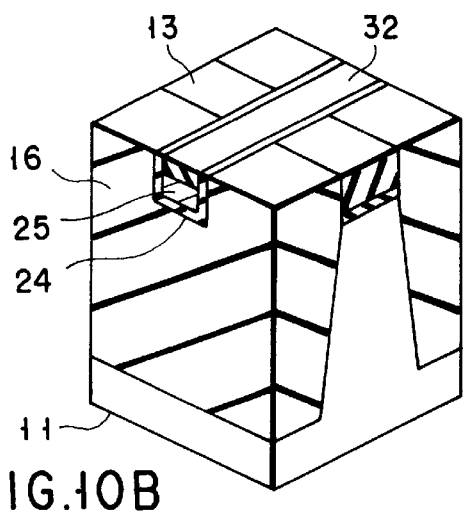

As shown in FIG. 10A, an oxide film 12 is removed with an HF-based solution from the bottom of a groove 17 for burying a gate electrode. As shown in FIG. 10B, e.g., an HTO film 24 is formed as a gate insulating film. Thereafter, a polysilicon film 25 serving as a gate electrode (gate wiring layer) is formed to a thickness of about 400 nm by LPCVD to fill the groove 17, and is flattened by CMP. The surface levels of the polysilicon film 25, a TEOS oxide film 16, and a silicon nitride film 13 are aligned with each other to realize a completely flat surface. In CMP, CMP conditions and film formation conditions (film thickness) are controlled to leave the silicon nitride film 13 and the polysilicon film 25 to a thickness of about 200 nm. If necessary, the polysilicon film 25 is doped for an nMOS and a pMOS.

The polysilicon film 25 is recessed by about 50 nm by RIE or CDE (i.e., the polysilicon film 25 has a thickness of about 150 nm). The formed groove is filled by LPCVD and CMP with a TEOS-based oxide film 32 serving as a cap film.

Figure 10C:
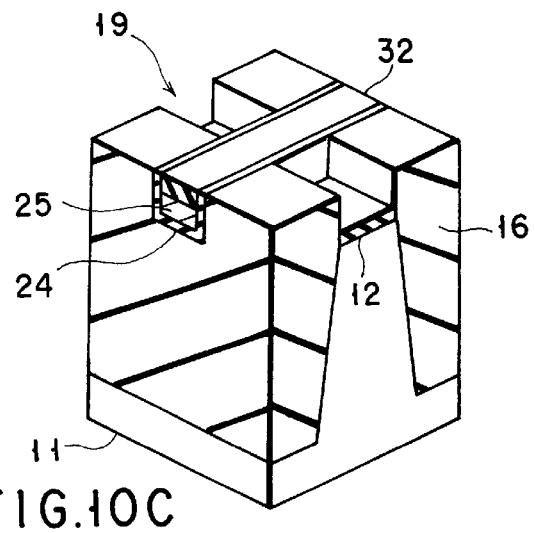

As shown in FIG. 10C, the silicon nitride film 13 is removed by etching with hot phosphoric acid, thereby forming a groove 19. As a result, the level of the TEOS-based oxide film 32 serving as a cap film is aligned with the level of the TEOS oxide film 16 for a device isolation region. A structure in which only a source/drain electrode formation region is recessed is formed.

Figure 10D:
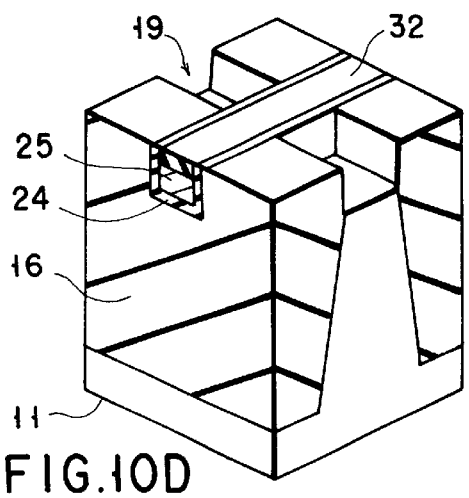

As shown in FIG. 10D, $SiO_2$-RIE is performed for a short time to remove the exposed oxide film 12 and expose the silicon surface in the groove 19.

Figure 10E:
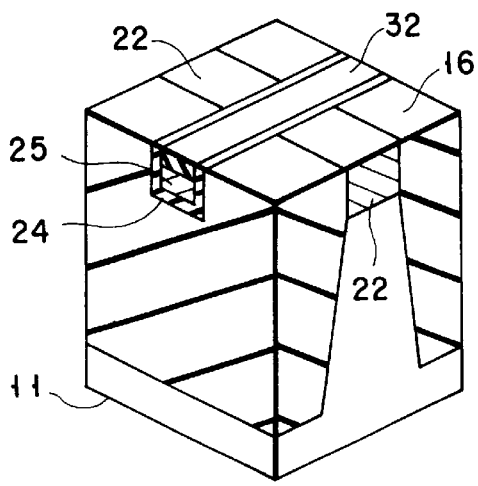

As shown in FIG. 10E, a source/drain formation region made of silicon is extended upward by epitaxial growth (a single-crystalline silicon film is formed). An overgrown portion such as a lateral growth portion is removed by CMP to leave a crystalline silicon film 22 in only the groove 19.

Then, source and drain regions (not shown) for an nMOS and a PMOS are formed in the crystalline silicon film. As the formation method, ion implantation, solid phase diffusion, vapor phase diffusion, and the like are conceivable. Further, thermal process for activating a conductive impurity is performed.

The subsequent steps follow the general LSI manufacturing process. More specifically, e.g., a TEOS interlayer insulating film is formed, and contact holes for connecting the gate electrode, the source/drain electrode, and the upper wiring layer are formed therein. A metal wiring layer made of, e.g., aluminum is formed on the interlayer insulating film in which the contact holes are formed.

The sixth embodiment of the present invention will be described with reference to FIGS. 9A to 9H.

The steps in the sixth embodiment are the same as those shown in FIGS. 3A to 3D except that a polysilicon film 13 is formed in place of the silicon nitride film 13.

As shown in FIG. 9A, a silicon nitride film 18 is formed to a thickness of about 300 nm to fill a groove 17, and is flattened by CMP. The silicon nitride film 18 is used as a dummy gate wiring layer. In this way, the surface levels of the silicon nitride film 18, a TEOS oxide film 16, and the polysilicon film 13 are aligned with each other to realize a completely flat surface. In CMP, its conditions are controlled to leave the polysilicon film 13 and the silicon nitride film 18 to a thickness of about 110 nm.

As shown in FIG. 9B, the polysilicon film 13 is removed by RIE, thereby forming a groove 19. As a result, the level of the silicon nitride film 18 serving as a dummy gate wiring layer is aligned with the level of the TEOS oxide film 16 for a device isolation region. A structure in which only a source/drain electrode formation region is recessed is formed.

As shown in FIG. 9C, a TEOS-based oxide film 21 having a thickness of about 15 to 20 nm is formed by LPCVD. While being selectively left on the sidewall of the groove (the sidewalls of the silicon nitride film 18 and the TEOS-based oxide film 16), the TEOS-based oxide film 21 is removed from the remaining region by entire surface RIE. At this time, the exposed oxide film 12 becomes thin or is removed by RIE. Thereafter, the silicon surface is exposed in the groove 19 by RIE or HF-based wet etching within a short time.

As shown in FIG. 9D, a source/drain formation region made of silicon is extended upward by epitaxial growth (a single-crystalline silicon film is formed). An overgrown portion such as a lateral growth portion 22A is removed by CMP to leave a crystalline silicon film 22 in only the groove 19.

Then, source and drain diffusion layers (not shown) for an nMOS and a pMOS are formed in the crystalline silicon film 22. As the formation method, ion implantation, solid phase diffusion, vapor phase diffusion, and the like are conceivable. Further, thermal process for activating a conductive impurity is performed.

In the sixth embodiment, after the step shown in FIG. 9E, the silicon nitride film 18 serving as a dummy gate wiring layer is removed with hot phosphoric acid to form a groove 23, as shown in FIG. 9F.

The portion constituting part of the sidewall of the groove 23 in the TEOS-based oxide film 21 is removed by etching with HF or the like. At this time, the upper portions of the remaining TEOS-based oxide film 21 and the TEOS-based oxide film 16 may be etched. However, since the TEOS-based oxide film 21 is thin, its etching time suffices to be short. Therefore, even if the upper portions of the remaining TEOS-based oxide film 21 and the TEOS-based oxide film 16 are etched, the removal amount is very small, so that the device characteristics are free from any adverse influence.

By the same method as described in the fourth embodiment, the structure shown in FIG. 9G or 9H is obtained.

The seventh embodiment of the present invention will be described.

FIGS. 11A to 11F are views, respectively, schematically showing the manufacturing steps according to the seventh embodiment of the present invention. Note that the steps in the seventh embodiment are the same as those in the sixth embodiment up to the step shown in FIG. 9E, and subsequent steps are different.

Figure 11A:
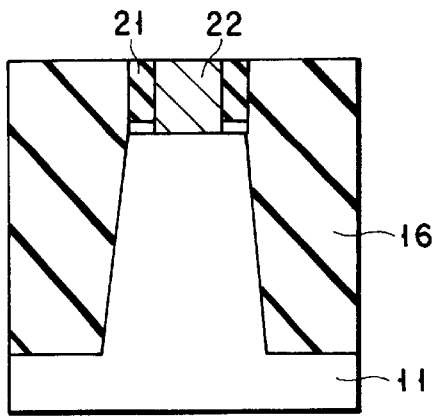
FIGS. 11A to 11F are views, respectively, schematically showing the manufacturing steps according to the seventh embodiment of the present invention.

The structure shown in FIG. 9E is obtained by the same method as described in the sixth embodiment. FIG. 11A is a sectional view taken along the line 11A—11A in the semiconductor device shown in FIG. 9E.

Figure 11B:
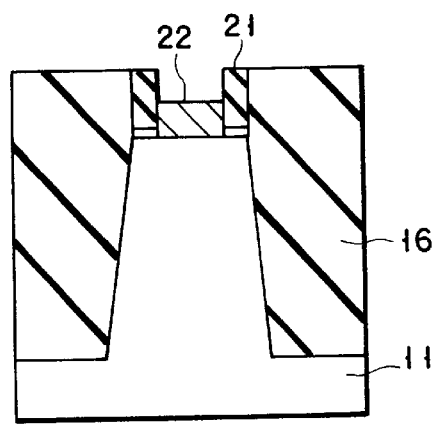

As shown in FIG. 11B, a crystalline silicon film 22 is recessed by RIE or the like by about 50 nm. After that, source and drain diffusion layers (not shown) for an nMOS and a pMOS are formed in the crystalline silicon film 22. As the formation method, ion implantation, solid phase diffusion, vapor phase diffusion, and the like are conceivable. Further, thermal process for activating a conductive impurity is performed.

Figure 11C:
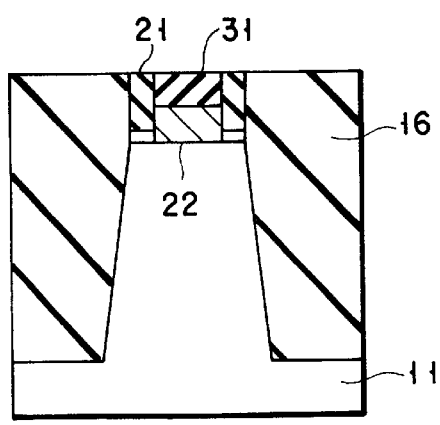

As shown in FIG. 11C, the groove formed by the recess is filled with a metal material by forming a metal film 31 made of cobalt silicide, tungsten, or the like by sputtering or CVD. The metal film 31 is left in only the groove by CMP.

Figure 11D:
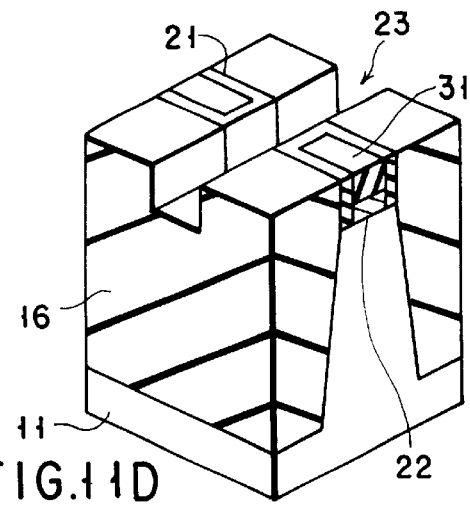

As shown in FIG. 11D, a silicon nitride film 18 serving as a dummy gate wiring layer is removed with hot phosphoric acid to form a groove 23.

Figure 11E:
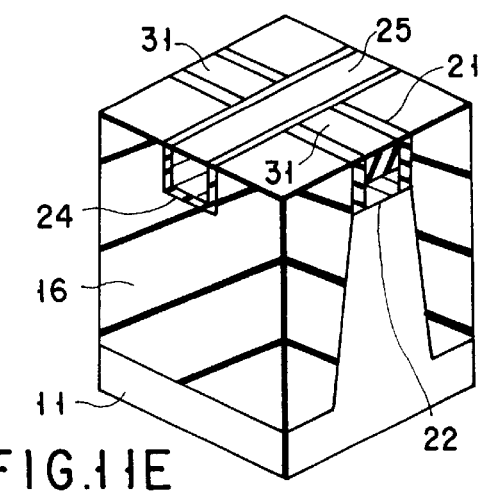

The structure shown in FIG. 11E is obtained by the same method described with reference to the sixth embodiment. In the seventh embodiment, a gate insulating film 24 is made of $Ta_2O_5$, and a gate wiring layer 25 is made of Al. If necessary, an $SiO_2$ film or an SiN film having a thickness of about 0.5 nm may be formed below the $Ta_2O_5$ film 24. In this case, the film can be formed at low temperature (600° C. or less) by using a radical oxidization or a radical nitrization.

Figure 11F:
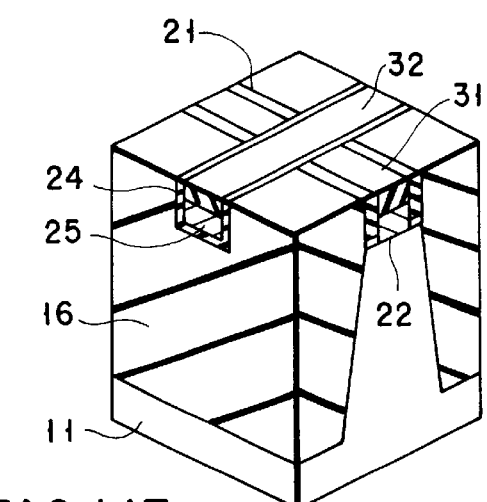

If necessary, as shown in FIG. 11F, the surface of the Al metal gate wiring layer 25 is oxidized to form an alumina ($Al_2O_3$) film 32 serving as a cap film on the gate wiring layer 25. By employing this process, even if a contact hole is erroneously formed above the gate wiring layer in the subsequent step, the alumina film 32 functions as an etching stopper to prevent short-circuiting between another wiring layer and the gate wiring layer.

The subsequent steps follow the general LSI manufacturing process. More specifically, e.g., a TEOS interlayer insulating film is deposited, and contact holes for connecting the gate electrode, the source/drain electrode, and the upper wiring layer are formed therein. A metal wiring layer made of, e.g., aluminum is formed on the interlayer insulating film.

The eighth embodiment of the present invention will be described with reference to FIGS. 12A to 12F.

FIGS. 12A to 12F are perspective views, respectively, schematically showing the manufacturing steps according to the eighth embodiment of the present invention. Note that the steps in the eighth embodiment are the same as those in the first embodiment up to the step shown in FIG. 3D, and subsequent steps are different from the steps in the first embodiment. The steps subsequent to the step shown in FIG. 3D will be explained.

Figure 12A:
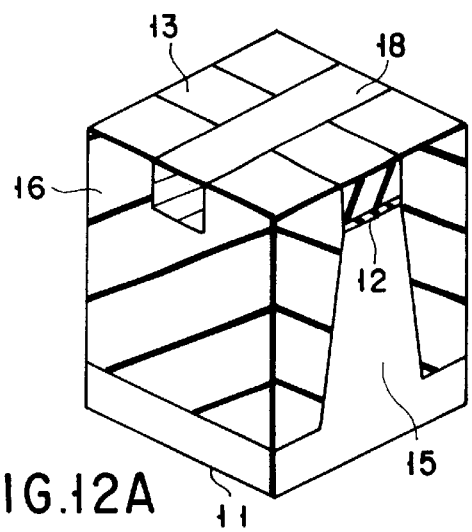
FIGS. 12A to 12F are perspective views, respectively, schematically showing the manufacturing steps according to the eighth embodiment of the present invention.

After the structure shown in FIG. 3D is formed, a dummy gate wiring layer 18 is formed in a groove 17, as shown in FIG. 12A. The dummy gate wiring layer 18 can be made of TiN, $WN_x$, W, Al, Ge, $RuO_x$, or the like. Since these materials can be easily removed by SH processing, they are preferably used for the dummy gate wiring layer 18. In the following description, the dummy gate wiring layer 18 is made of germanium.

The germanium film 18 is formed to a thickness of about 300 nm to fill the groove 17, and is flattened by CMP. Accordingly, the surface levels of the germanium film 18, a TEOS oxide film 16, and a silicon nitride film 13 are aligned with each other to realize a completely flat surface. In CMP, its conditions are controlled to leave the silicon nitride film 13 and the germanium film 18 to a thickness of about 110 nm.

Figure 12D:
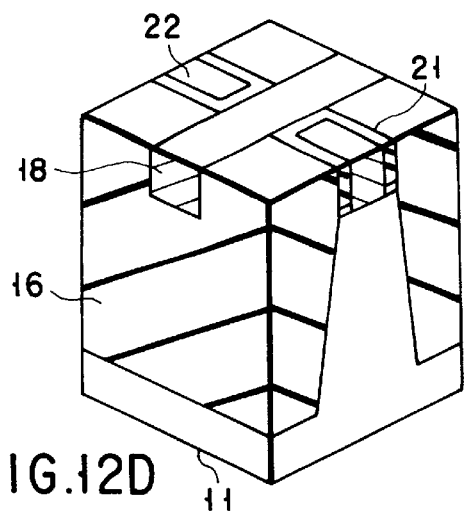
Figure 12B:
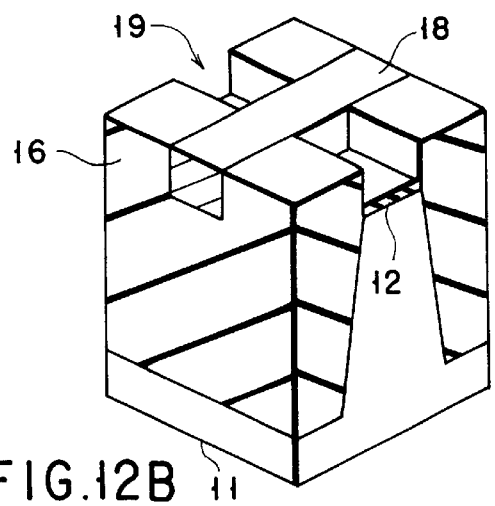

As shown in FIG. 12B, the silicon nitride film 13 is removed by etching with hot phosphoric acid, thereby forming a groove 19. The level of the germanium film 18 is aligned with the level of the TEOS oxide film 16 for a device isolation region. A structure in which only a source/drain electrode formation region is recessed is formed.

Figure 12E:
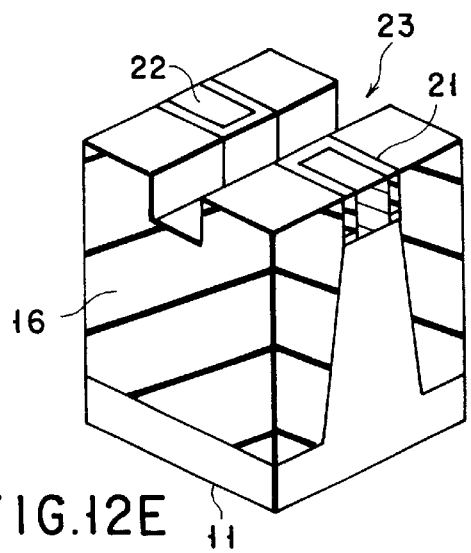
Figure 12C:
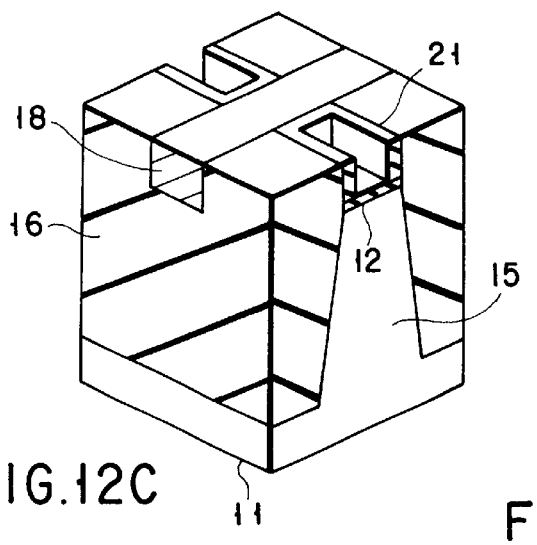
Figure 12F:
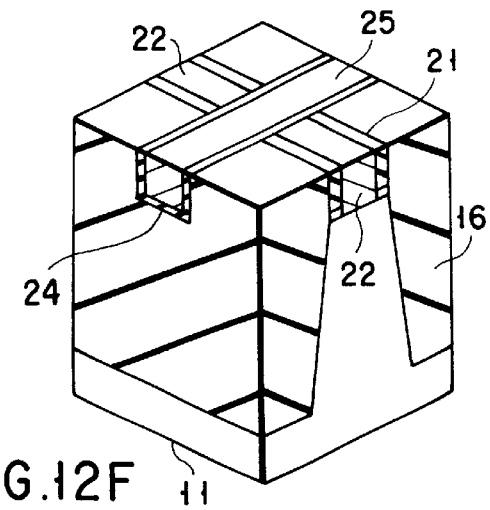

As shown in FIG. 12C, a silicon nitride film 21 having a thickness of about 10 to 20 nm is formed by LPCVD. The silicon nitride film 21 is selectively left on the sidewall of the groove 19 (the sidewalls of the germanium film 18 and the TEOS-based oxide film 16) by entire RIE. By RIE, the exposed oxide film 12 becomes thin or is removed. Thereafter, the silicon surface is exposed in the groove 19 by RIE or HF-based wet etching within a short time.

The obtained structure is cleaned with $H_2$, and a source/drain formation region made of silicon is extended upward by epitaxial growth (a single-crystalline silicon film is formed), as shown in FIG. 12D. An overgrown portion (not shown) such as a lateral growth portion is removed by CMP to leave a crystalline silicon film 22 in only the groove 19.

Source and drain diffusion layers (not shown) for an nMOS and a pMOS are formed in the crystalline silicon film 22. As the formation method, ion implantation, solid phase diffusion, vapor phase diffusion, and the like are conceivable. Further, thermal process (RTA and the like) for activating a conductive impurity is performed. Ti or Co is sputtered to form a silicide film on the source/drain region.

In the eighth embodiment, after the step shown in FIG. 12D, the germanium film 18 serving as a dummy gate wiring layer and the underlaying oxide film 12 are removed by SH processing and HF wet etching to form a groove 23, as shown in FIG. 12E.

The portion constituting part of-the sidewall of the groove 23 in the nitride film 21 is removed by etching with hot phosphoric acid or the like. At this time, the upper portions of the remaining nitride film 21 may be etched. However, since the nitride film 21 is thin, its etching time suffices to be short. Therefore, even if the upper portion of the remaining nitride film 21 is etched, the removal amount is very small, so that the device characteristics are free from any adverse influence.

By the same method as described in the fourth embodiment, the structure shown in FIG. 12H is obtained.

If necessary, the surface of the metal gate wiring layer 25 is recessed by about 30 nm by etching (i.e., the metal gate wiring layer 25 has a thickness of about 70 nm). The formed groove is filled with silicon nitride by LPCVD and CMP to form a silicon nitride film serving as a cap film on the metal gate. By adopting this process, even if a contact hole is erroneously formed above the gate wiring layer in the subsequent step, the silicon nitride film functions as an etching stopper to prevent short-circuiting between another wiring layer and the gate wiring layer.

The subsequent steps follow the general LSI manufacturing process. More specifically, e.g., a TEOS interlayer insulating film is deposited, and contact holes for connecting the gate electrode, the source/drain electrode, and the upper wiring layer are formed therein. A metal wiring layer made of, e.g., aluminum is formed on the interlayer insulating film.

According to the first to eighth embodiments described above, prior to formation of the source/drain electrode, the gate structure and the device isolation insulating film are so formed as to align their upper surface levels with each other, and to form a groove crossing the gate structure and divided by it. The source/drain electrode is formed in the groove. By the first to eighth embodiments, therefore, the source/drain electrode can be self-aligned. More specifically, in the first to eighth embodiments, since the upper surface level of the gate structure is equal to the upper surface level of the device isolation insulating film, source/drain electrode can be formed by burying a metal material. In the case where the groove is buried with a silicon by epitaxial growth, an overgrown portion such as a lateral growth portion can be removed by CMP. An insulating state between adjacent transistors can be maintained, and a high-density micropatterned transistor can be realized.

According to the fourth to eighth embodiments, a concave transistor can be obtained without RIE for a channel region formation portion of the substrate. Therefore, the channel region can be prevented from being damaged by RIE in manufacturing a concave transistor. That is, degradation in electrical characteristics of the device can be prevented.

In the first to eighth embodiments, the source/drain electrode can be made of a silicide by sputtering it without silicidation annealing. Accordingly, degradations in device reliability and characteristics can be prevented.

In the first to eighth embodiments, when an elevated source/drain structure is adopted, the source/drain diffusion layers can be made sufficiently thick, and its effective depth of junction can be decreased. Even upon a reduction in size, punch-through can be prevented and an insulating state between devices can be maintained.

Note that in the first to eighth embodiments, the same reference numerals denote the same parts unless otherwise specified.

The ninth embodiment of the present invention will be described with reference to FIGS. 13A to 13P.

Figure 13A:
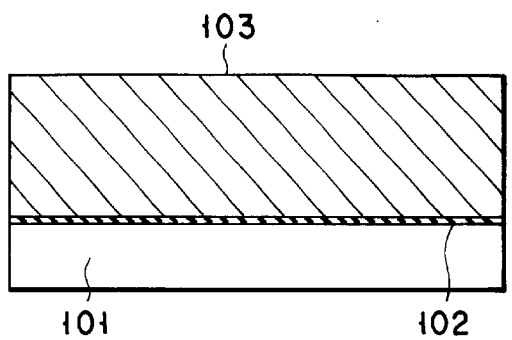
FIGS. 13A to 13R are views, respectively, schematically showing the steps in manufacturing a semiconductor device according to the ninth embodiment of the present invention.
Figure 13B:
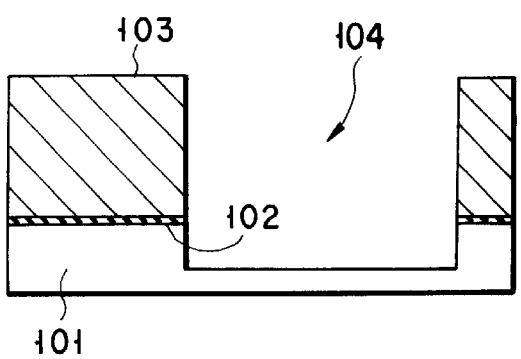
Figure 13C:
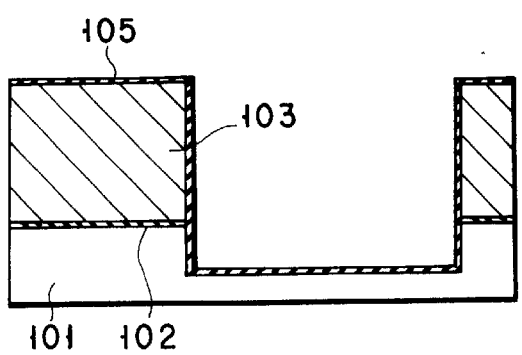
Figure 13D:
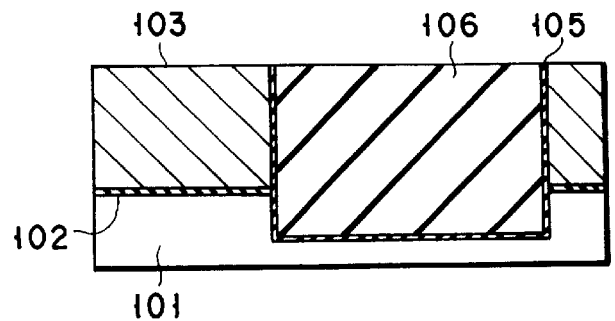
Figure 13E:
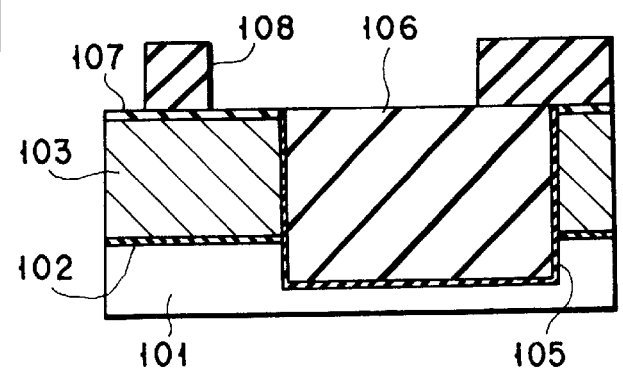
Figure 13F:
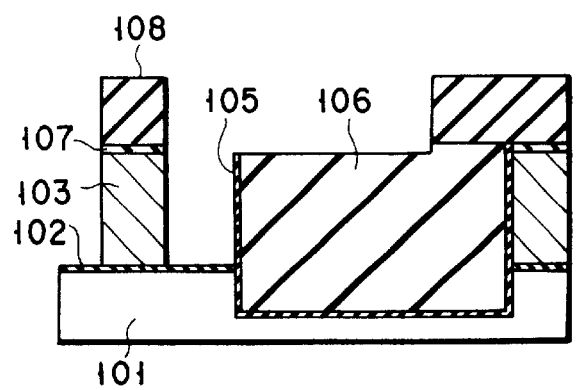
Figure 13G:
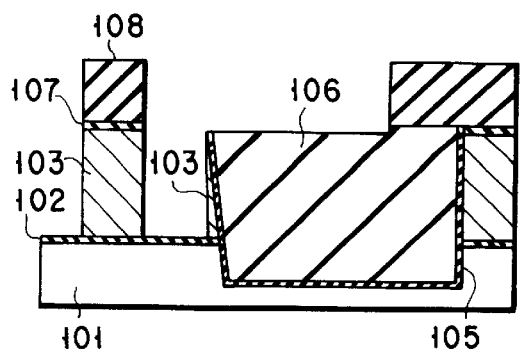
Figure 13H:
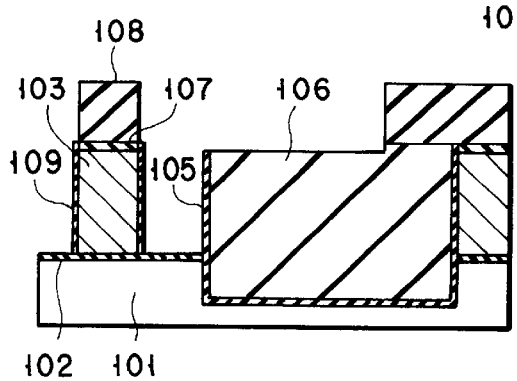
Figure 13I:
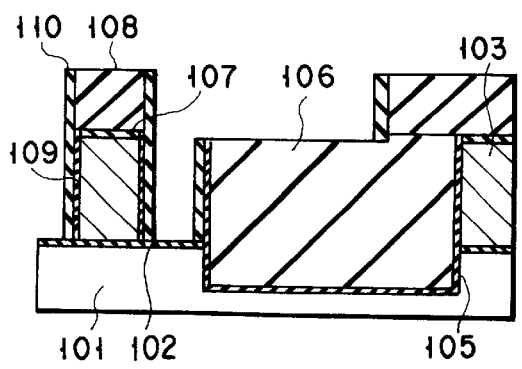
Figure 13J:
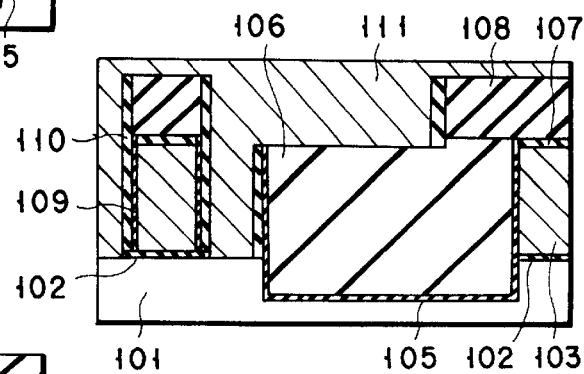
Figure 13K:
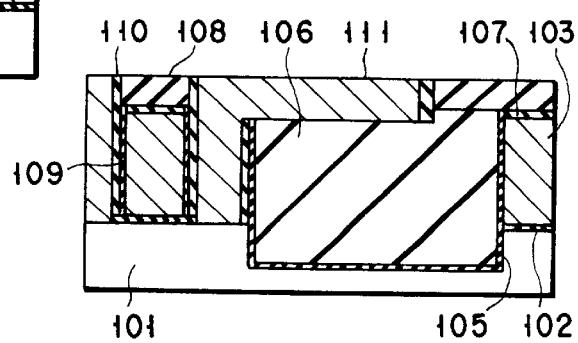
Figure 13L:
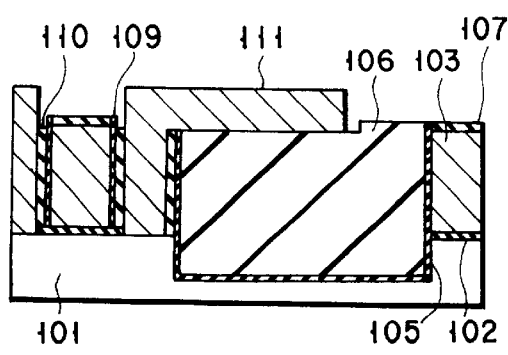
Figure 13M:
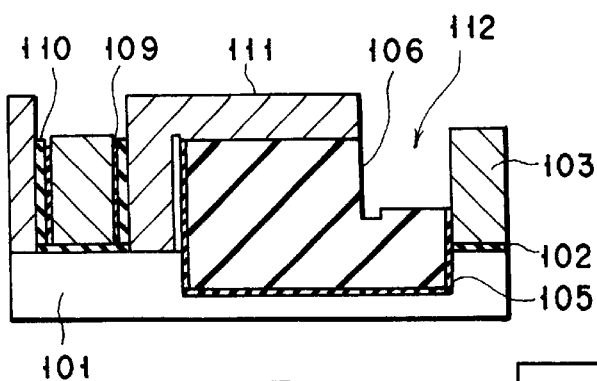
Figure 13P:
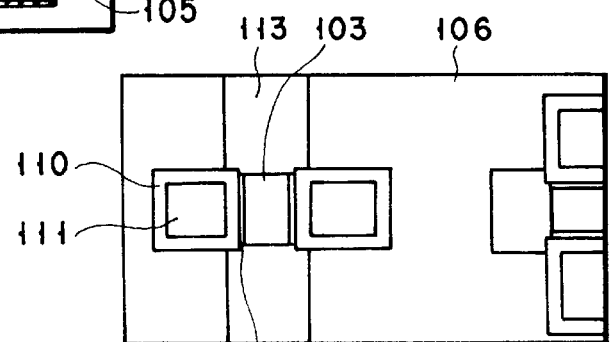

FIGS. 13A to 13P are views, respectively, schematically showing the steps in manufacturing a semiconductor device according to the ninth embodiment of the present invention. FIGS. 13A to 13O, 13Q, and 13R are sectional views, and FIG. 13P is a plan view.

As shown in FIG. 13A, a thermal oxide film 102 having a thickness of about 4 nm is formed on one surface of a silicon substrate 101. A polysilicon film 103 having a thickness of about 200 nm is formed on the thermal oxide film 102 by CVD.

As shown in FIG. 13B, the polysilicon film 103, the thermal oxide film 102, and the silicon substrate 101 are etched by lithography and RIE to form a groove 104. The groove 104 is used for device isolation later.

As shown in FIG. 13C, a thermal oxide film 105 is formed on the exposed surfaces of the polysilicon film 103 and the silicon substrate 101.

As shown in FIG. 13D, the groove 104 is filled with silicon oxide by forming a silicon oxide film 106 by CVD on the surface of the substrate 101 in which the groove 104 is formed. The silicon oxide film 106 is polished by CMP. The polishing is stopped when the polysilicon film 103 is exposed. Consequently, a device isolation region is formed.

As shown in FIG. 13E, a thermal oxide film 107 is formed on the exposed surface of the polysilicon film 103, and an SiN film 108 is grown to a thickness of about 150 nm on the thermal oxide film 107. The thermal oxide film 107 is used as an etching stopper. While being left in only a gate wiring formation region, the SiN film 108 is removed from the remaining region by lithography and RIE.

As shown in FIG. 13F, the exposed portion of the thermal oxide film 107 is removed by short-time RIE or wet etching. Using the SiN film 108 and the silicon oxide film 106 as a mask, the polysilicon film 103 is etched.

In the step shown in FIG. 13B, the groove 104 may be tapered forward. In this groove 104, the polysilicon film 103 is left on the sidewall of the silicon oxide film 106 by the above steps, as shown in FIG. 13G. Since this polysilicon film 103 functions as a gate electrode later, it may increase the parasitic capacitance between the gate electrode and a source/drain electrode. Accordingly, the taper angle of the groove 104 is set such that the entire polysilicon film 103 left on the sidewall of the silicon oxide film 106 is changed into an oxide film upon thermal oxidation.

After that, as shown in FIG. 13H, a thermal oxide film 109 having a thickness of about 4 nm is formed on the sidewall of the polysilicon film 103 in order to protect a gate edge. Note that when the groove 104 is tapered forward, the entire polysilicon film 103 left on the sidewall of the silicon oxide film 106 is oxidized. Further, ions are implanted into the substrate 101 and activated to form an extension in the surface region of the substrate 101. Next, an SiN film is formed by CVD and subjected to RIE to selectively leave it on only the sidewalls of the polysilicon film 103, the thermal oxide film 105, the thermal oxide film 107, and the SiN film 108, and to form an SiN sidewall 110, as shown in FIG. 13I.

At this time, a deeper diffusion region may be formed in the surface region of the substrate 101 by ion implantation. In the ninth embodiment, since an elevated source/drain structure is to be formed in the subsequent step, no deep diffusion region need be formed. That is, the extension suffices to be formed. Note that the sidewall 110 is formed to reduce the coupling capacitance between the source/drain electrode and the gate electrode, and to prevent short-circuiting between the source/drain electrode and the gate electrode.

The thermal oxide film 102 exposed by wet processing is removed. A polysilicon film 111 is formed by CVD, as shown in FIG. 13J, and flattened by CMP or resist etch-back, as shown in FIG. 13K. This flattening is performed until the SiN film 108 and the sidewall 110 are exposed. In this way, the entire region except for a gate wiring formation region is covered with the polysilicon film 111. A thermal oxide film (not shown) used as an etching stopper is formed on the surface of the polysilicon film 111.

As shown in FIG. 13L, part of the sidewall 110 and the SiN film 108 are removed by wet etching with hot phosphoric acid or the like, radical etching, or RIE.

The thermal oxide film (not shown) formed on the surface of the polysilicon film 111, and the thermal oxide film 105 are removed by wet processing.

As shown in FIG. 13M, a groove 112 is formed by removing the exposed portion of the silicon oxide film 106 by RIE using the polysilicon films 103 and 111 and the SiN sidewall 110 as a mask. The silicon oxide film 106 is removed not to expose the channel edge, i.e., the sidewall of the thermal oxide film 102. With this structure, decreases in gate breakdown voltage and transistor characteristics, which pose problems in a conventional STI structure, can be prevented.

Figure 13N:
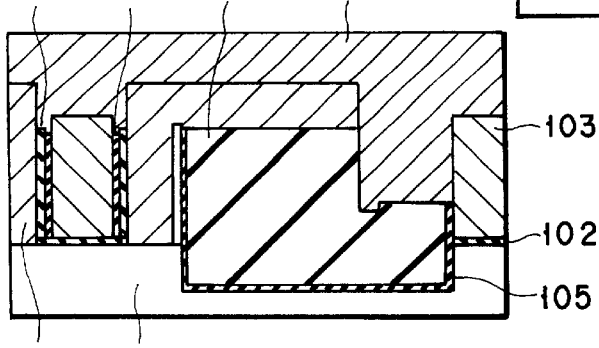
Figure 13Q:
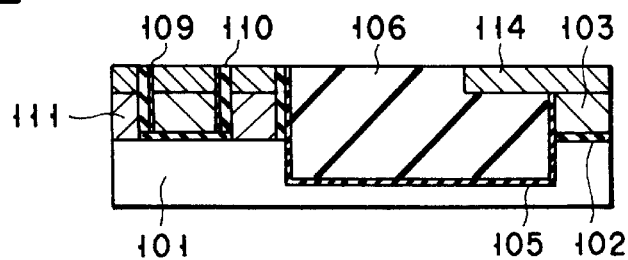
Figure 13O:
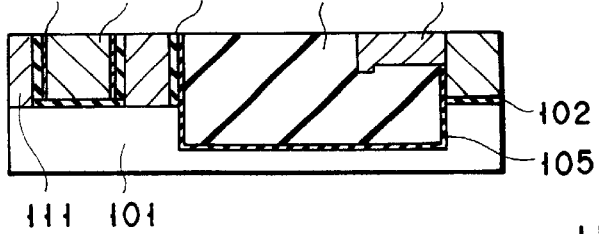

On the surface of the substrate 101 in which the groove 112 is formed, a polysilicon film 113 is grown, as shown in FIG. 13N, and flattened by CMP or resist etch-back, as shown in FIG. 13O. This flattening is performed until the silicon oxide film 106 is exposed.

FIG. 13P is a plan view showing the semiconductor device shown in FIG. 13O. As shown in FIG. 13P, the gate electrode formation region is formed of the polysilicon film 103, the source/drain electrode formation region is formed of the polysilicon film 111, and the gate wiring formation region is formed of the polysilicon film 113. Ions are simultaneously implanted into the polysilicon films 103, 111 and 113 and annealing for activation is performed. When the diffusion region formed in advance becomes excessively deep upon this annealing, no extension is formed in advance. Instead, in this step, an extension is formed by solid-phase-diffusing an ion-implanted dopant. As a result, an extension can be formed to a desired depth.

Figure 13R:
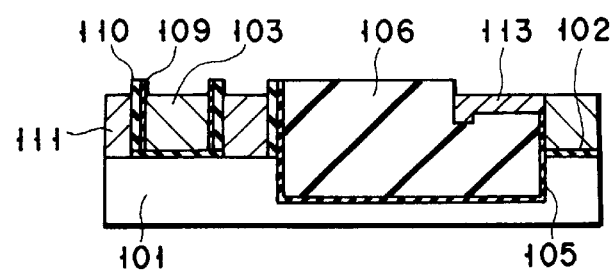

As shown in FIG. 13Q, silicidation is performed using Co, Ti, or the like, thereby forming a silicide film 114 in the surface regions of the polysilicon films 103, 111, and 113. More specifically, a gate electrode and a source/drain electrode are self-aligned. Note that if the silicide film 114 is also formed on the sidewall 110 due to variations in selective reaction, the surface of the resultant structure is slightly polished by CMP or the like. With this processing, the silicide film 114 formed on the sidewall 110 can be easily removed. Alternatively, as shown in FIG. 13R, the polysilicon films 103, 111, and 113 are properly etched back to make the sidewall 110 project from the polysilicon films 103, 111, and 113 before silicidation.

As described above, according to the ninth embodiment, a source/drain region can be prevented from being formed on STI in forming a MOSFET which has an elevated source/drain structure and a source/drain electrode made of a silicide. In addition, according to this embodiment, since no gate edge is exposed upon etch-back of STI, a MOSFET having good electrical characteristics can be obtained.

The 10th embodiment of the present invention will be described. In the 10th embodiment, in simultaneously forming a plurality of MOSFETs, the source or drain electrode of a given MOSFET and the source or drain electrode of another one, or the source or drain electrode of a certain MOSFET and the gate electrode of another one are electrically connected.

Figure 14G:
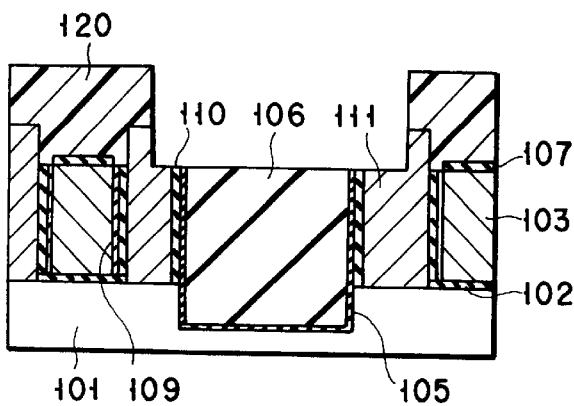
FIGS. 14A to 14R are views, respectively, schematically showing the steps in manufacturing a semiconductor device according to the 10th embodiment of the present invention.
Figure 14J:
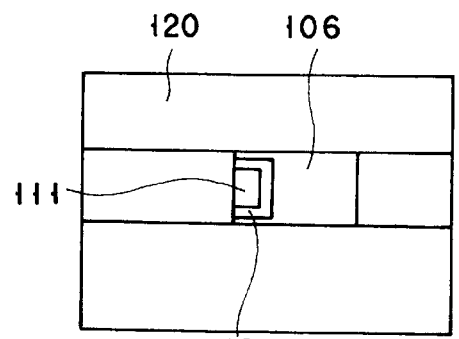
Figure 14H:
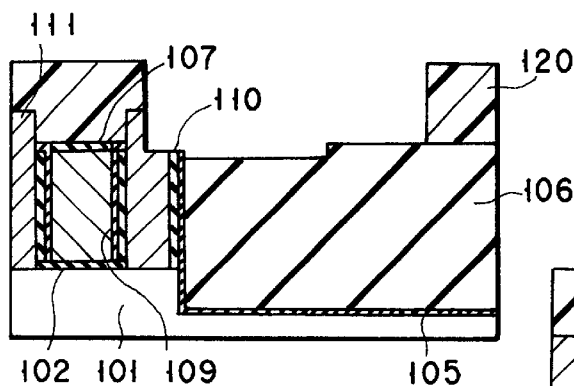
Figure 14K:
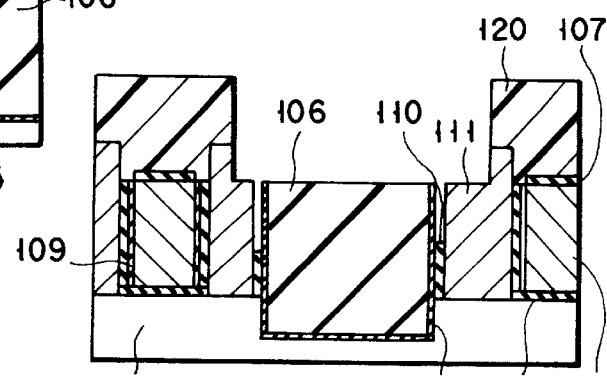
Figure 14I:
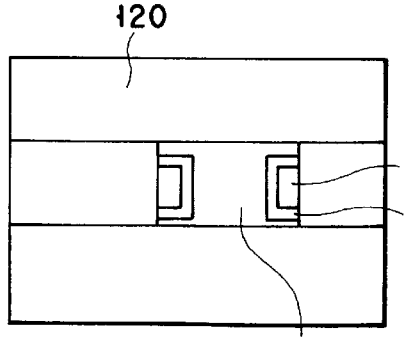
Figure 14L:
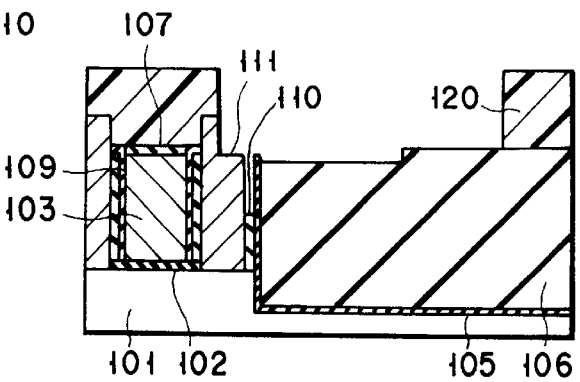
Figure 14M:
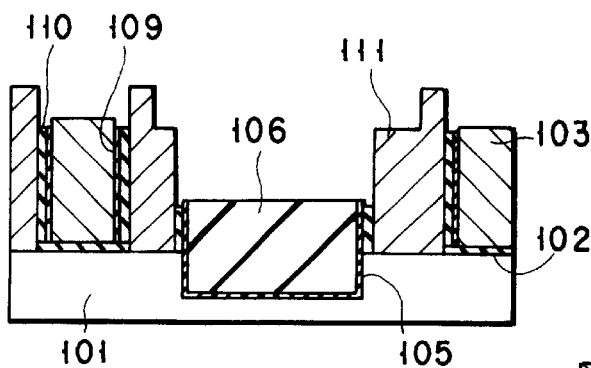
Figure 14P:
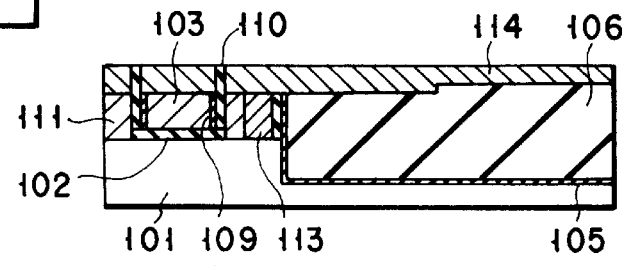
Figure 14N:
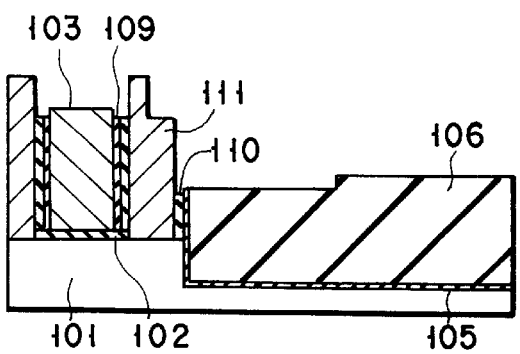
Figure 14Q:
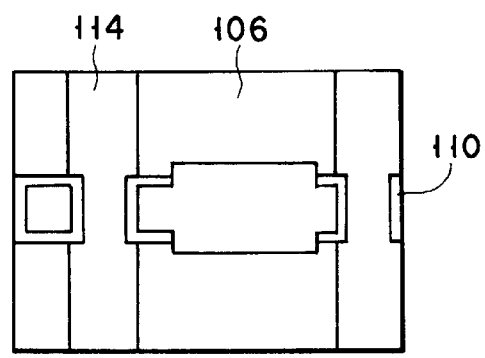
Figure 14O:
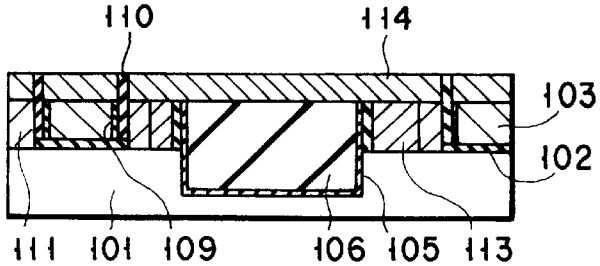
Figure 14R:
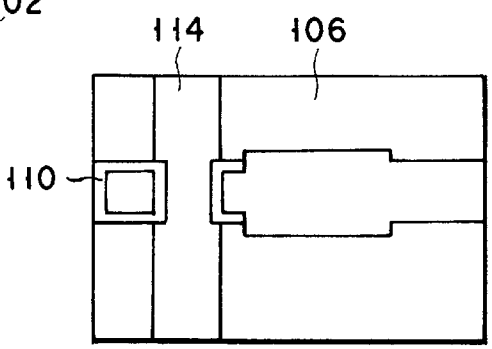

FIGS. 14A to 14R schematically show the steps in manufacturing a semiconductor device according to the 10th embodiment of the present invention. The two types of connection described above will be explained with reference to FIGS. 14A to 14R.

By the same method as described in the ninth embodiment with reference to FIGS. 13A to 13I, the structures shown in FIGS. 14A and 14B are obtained. FIG. 14C is a sectional view taken along the line 14C—14C in FIG. 14A, and FIG. 14D is a sectional view taken along the line 14D—14D in FIG. 14B.

By the same steps as described in the ninth embodiment with reference to FIGS. 13J to 13L, the structures shown in FIGS. 14E and 14F are obtained.

Thereafter, as shown in FIGS. 14G and 14H, a resist film 120 is formed, and an opening is formed by lithography. Using the resist film 120 as a mask, a polysilicon film 111 is removed to expose a silicon oxide film 106. FIGS. 14I and 14J are plan views, respectively, showing the semiconductor devices shown in FIGS. 14G and 14H.

As shown in FIGS. 14K and 14L, an SiN sidewall 110 is etched by RIE or the like using a thermal oxide film 105, the polysilicon film 111, and the resist film 120 as a mask. The SiN sidewall 110 is not necessarily completely removed. The SiN sidewall 110 is satisfactorily removed to a position lower than the bottom surface of a silicide film to be formed in the subsequent step.

Then, the resist film 120 is removed. By the same method as described in the ninth embodiment with reference to FIG. 13M, the structures shown in FIGS. 14M and 14N are obtained. Further, by the same method as described in the ninth embodiment with reference to FIGS. 13N to 13Q, the structures shown in FIGS. 14O and 14P are obtained. FIGS. 14Q and 14R are plan views, respectively, showing the semiconductor devices shown in FIGS. 14O and 14P.

An application example of the above-described method to manufacture of an SRAM having a CMOS-6tr-cell structure will be explained below.

FIGS. 15A to 15E are plan views, respectively, schematically showing the steps in manufacturing a semiconductor device according to the 10th embodiment of the present invention.

Figure 15A:
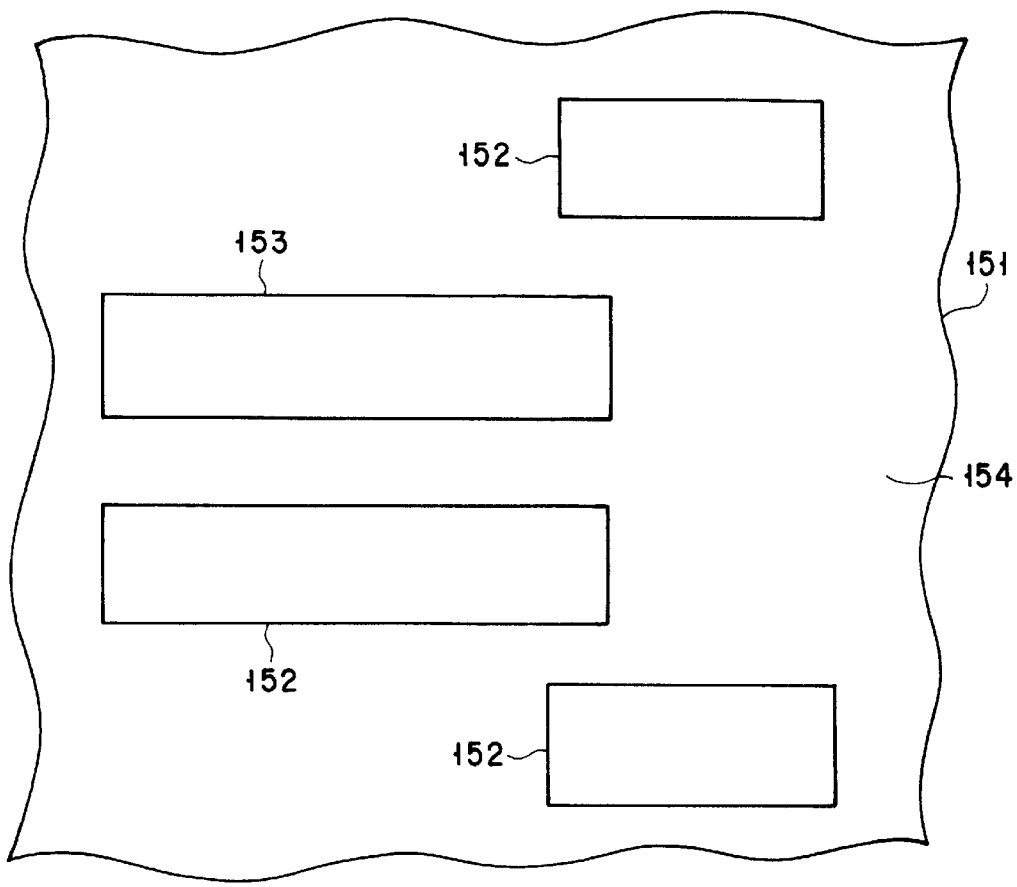
FIGS. 15A to 15E are plan views, respectively, schematically showing the steps in manufacturing the semiconductor device according to the 10th embodiment of the present invention.

The structure shown in FIG. 15A is obtained by the steps described in the ninth embodiment with reference to FIGS. 13A to 13D. In FIG. 15A, an NMOS device region 152, a pMOS device region 153, and a device isolation region 154 are formed on a substrate 151.

Figure 15B:
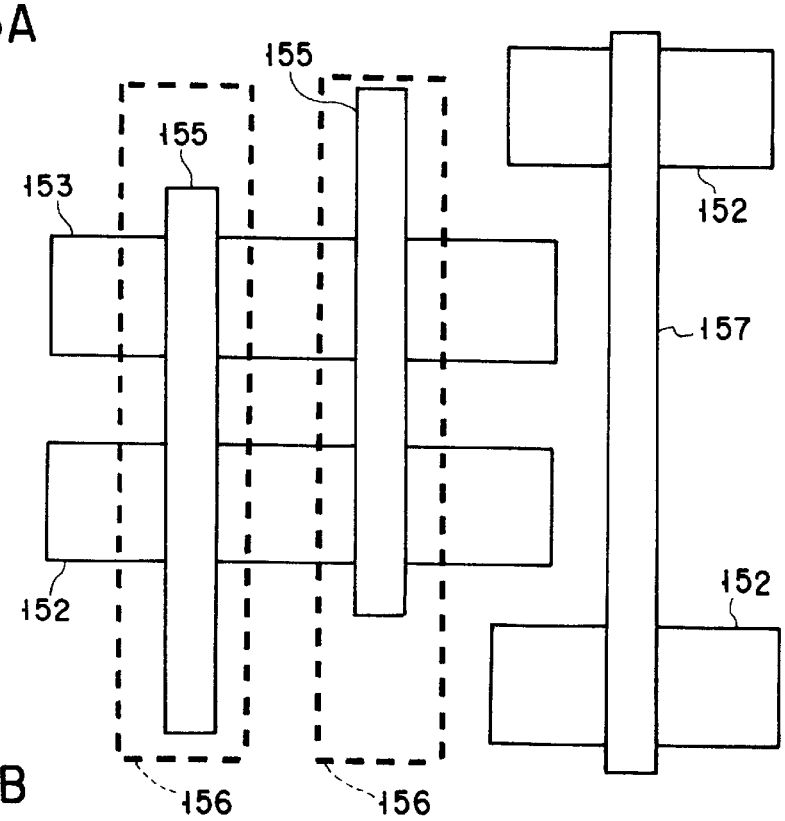

As shown in FIG. 15B, a gate wiring pattern 155 is formed to connect gate wiring layers of the nMOS and pMOS of inverter circuits 156 in a cell, and to form a word line 157.

Figure 15C:
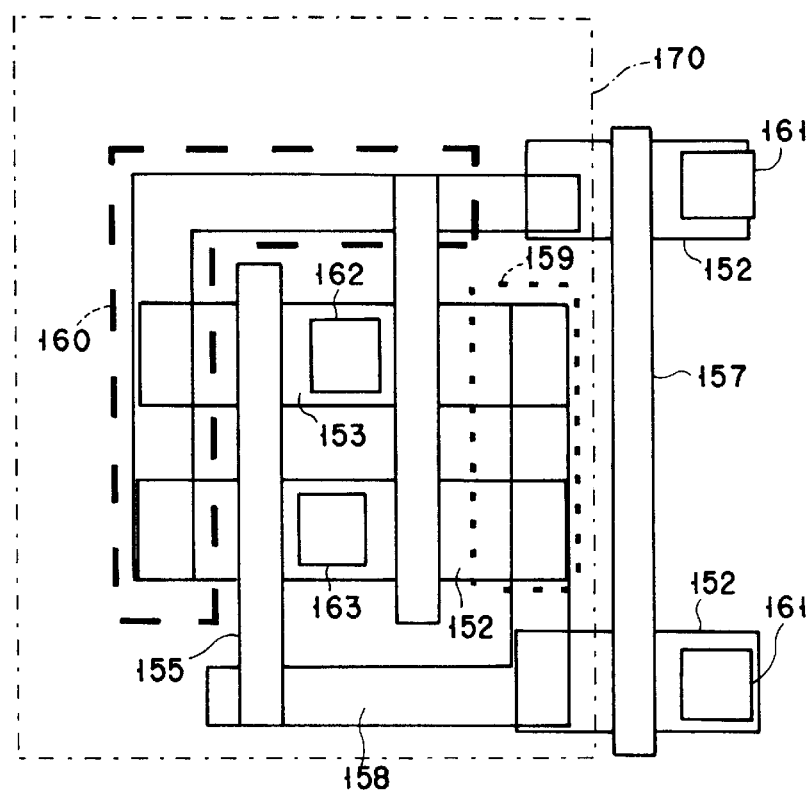

After that, as shown in FIG. 15C, a junction wiring region pattern 158 is formed. Conventionally, in a flip-flop circuit 170, a junction wiring 159 for connecting the source/drain electrode of a given device to that of another device, and a junction wiring 160 for connecting the source/drain electrode of a certain device to the gate electrode of another device are formed in separate layers. More specifically, in order to form at least one of the junction wiring 159 and 160, one or more wiring layers must be formed in addition to a layer in which a gate wiring is formed. To the contrary, according to the 10th embodiment, the above wiring can be formed in the layer in which the gate wiring is formed. Therefore, only a bit line, a V+ line, and a V− line are formed in an upper layer arranged on the gate wiring formation layer. That is, contact regions formed in the gate wiring formation layer are three, a bit contact region 161, a V− contact region 162, and a V+ contact region 163.

Figure 15D:
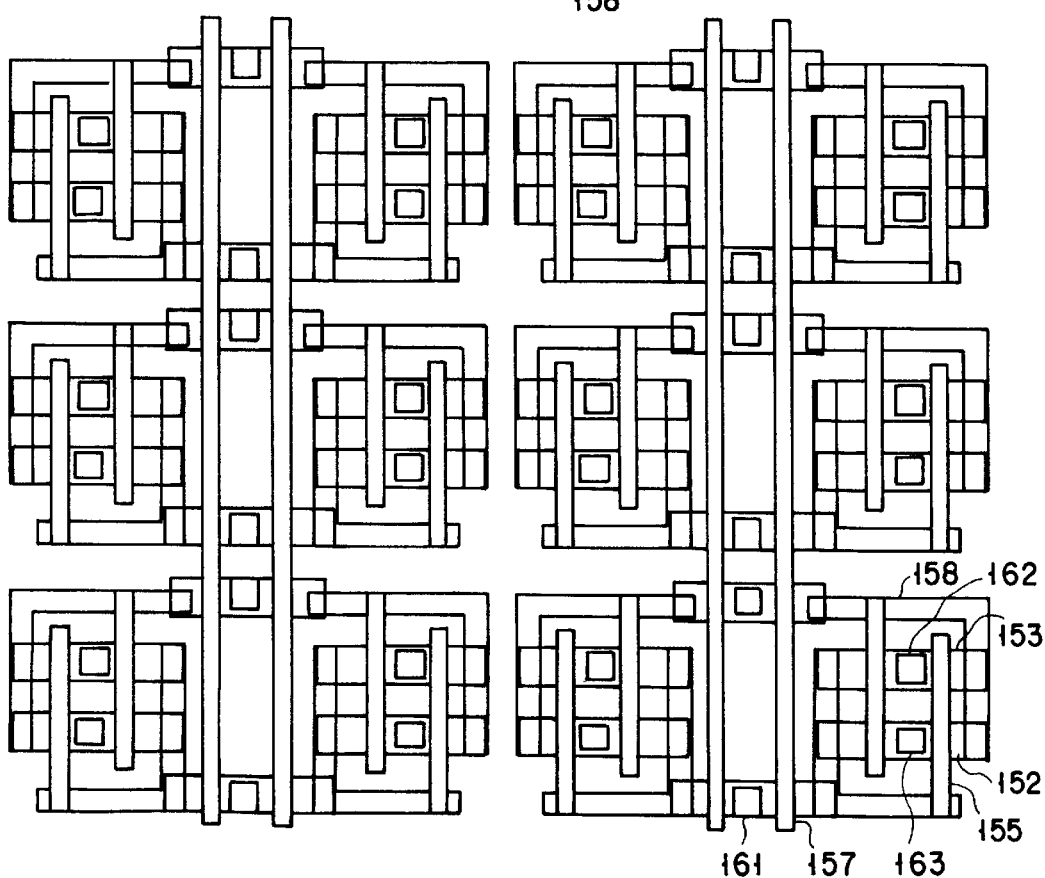
Figure 15E:
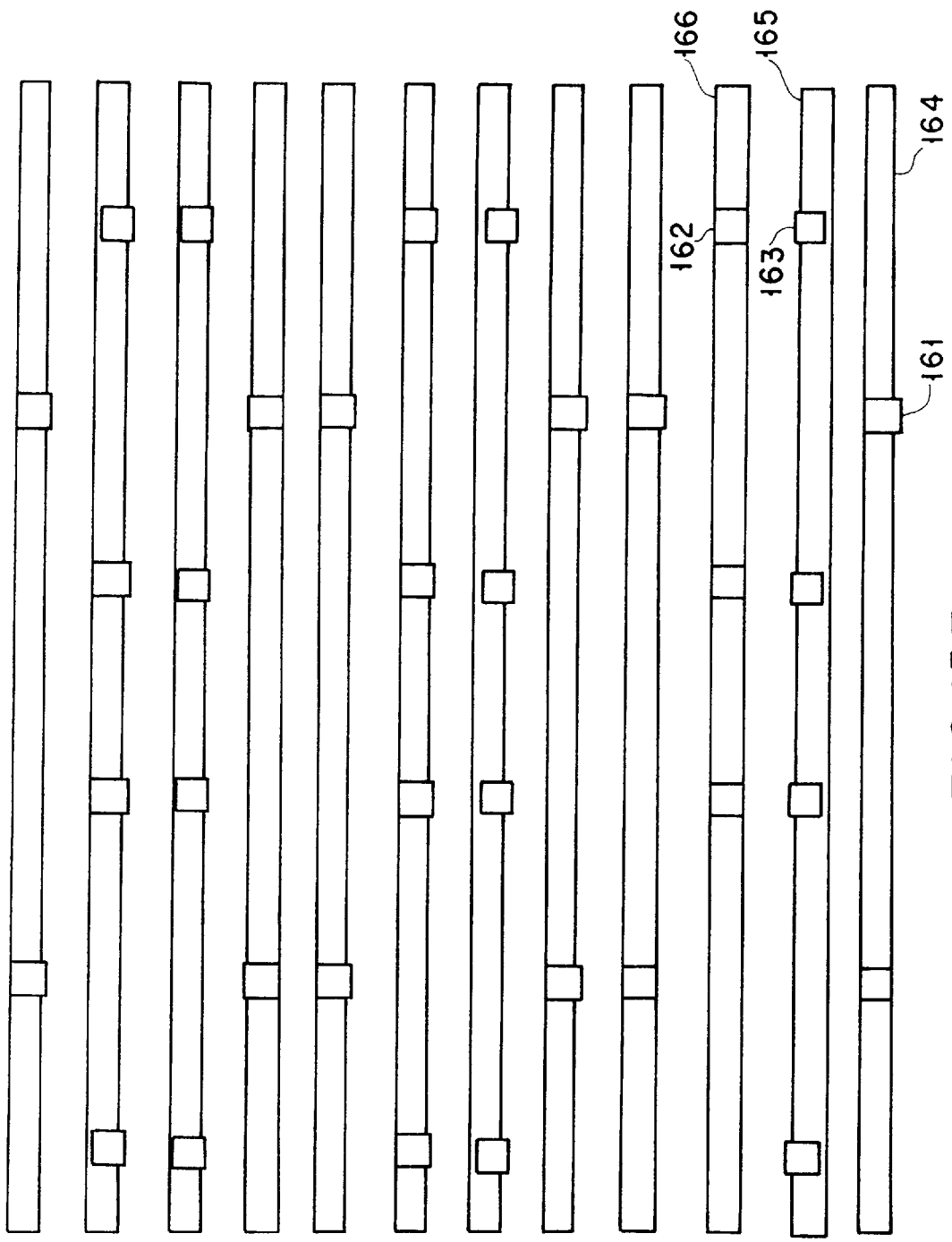

If cells are coupled to each other, as shown in FIG. 15D, the bit line 164, the V+ line 165, and the V− line 166 formed in the upper layer are arranged not to cross each other, as shown in FIG. 15E. For this reason, the bit line, the V+ line, and the V− line can be formed in the same layer. According to the 10th embodiment, therefore, all the wirings of an SRAM can be formed in the gate wiring layer and one upper wiring layer.

As described above, according to the 10th embodiment of the present invention, a wiring layer for connecting the source/drain electrode of a given MOSFET to that of another one, and a wiring layer for connecting the source/drain electrode of a certain MOSFET to the gate electrode of another one can be formed in a gate wiring formation layer. Accordingly, the number of steps greatly decreases. In a conventional structure, a large source/drain region is required to connect the source/drain electrode of a certain MOSFET to that of another one. In contrast to this, according to the 10th embodiment, the source/drain region can be reduced in size, compared to the conventional structure. As a result, the transistor characteristics can be improved, while an increase in diffusion capacitance is suppressed.

The 11th embodiment of the present invention will be described below. In the ninth embodiment, a source/drain electrode is formed after a gate electrode is formed in advance. In the 11th embodiment, however, a dummy gate wiring layer is formed in place of a gate electrode. According to the 11th embodiment, a MOSFET having a structure (to be referred to as a half-concave structure hereinafter) wherein part of the side surface of a gate electrode is used as a channel can be manufactured. The 11th embodiment will be described with reference to FIGS. 16A to 16X.

Figure 16A:
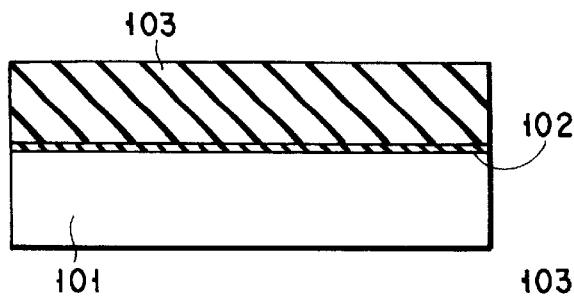
FIGS. 16A to 16X are sectional views, respectively, schematically showing the steps in manufacturing a semiconductor device according to the 11th embodiment of the present invention.
Figure 16B:
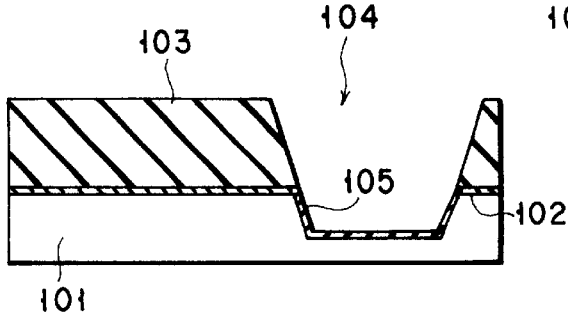
Figure 16C:
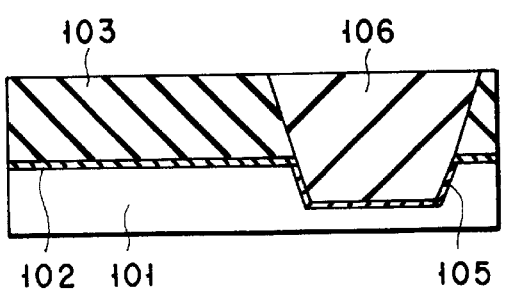
Figure 16D:
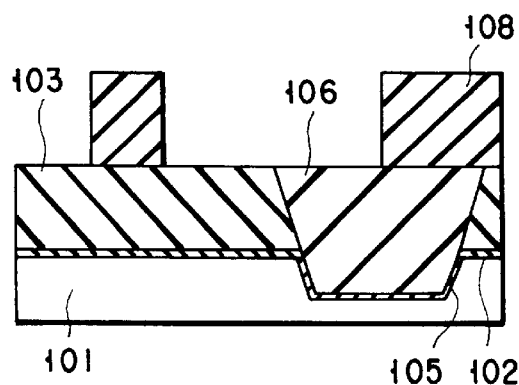
Figure 16E:
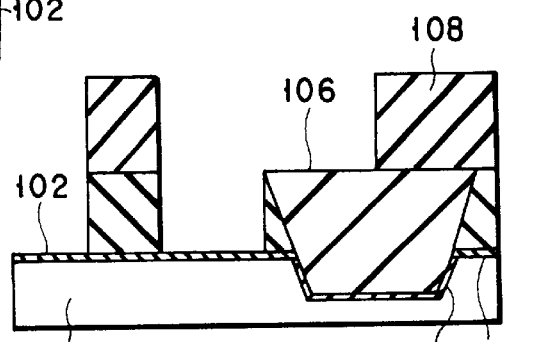
Figure 16F:
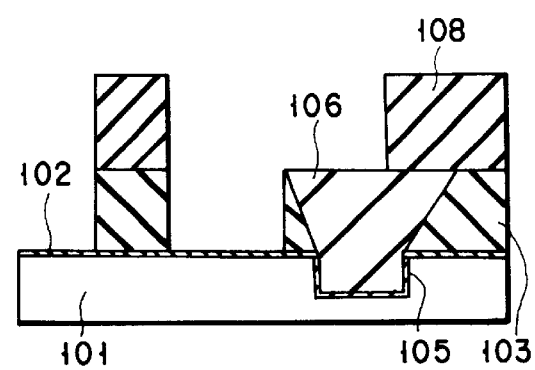
Figure 16G:
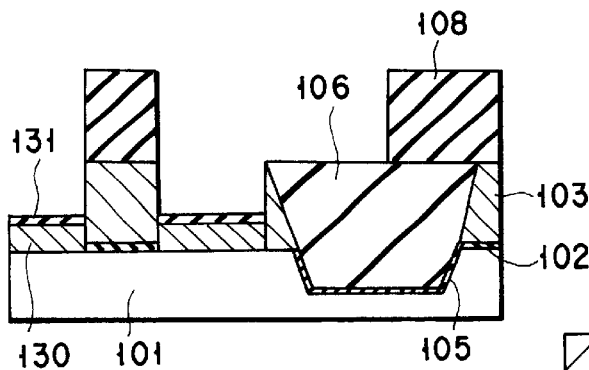
Figure 16J:
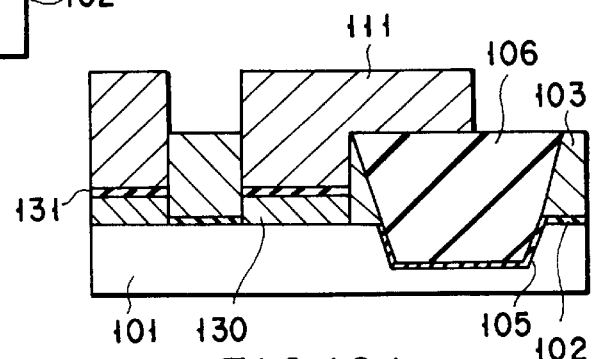
Figure 16H:
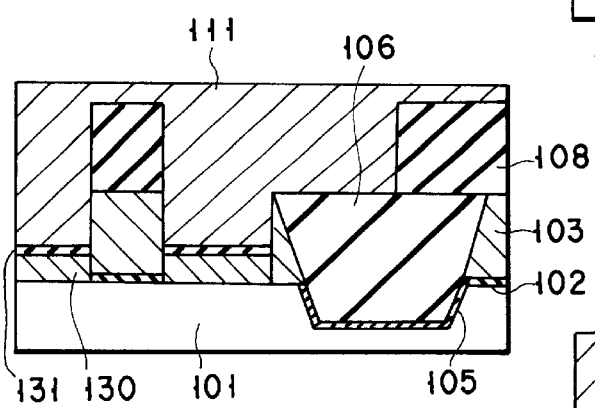
Figure 16K:
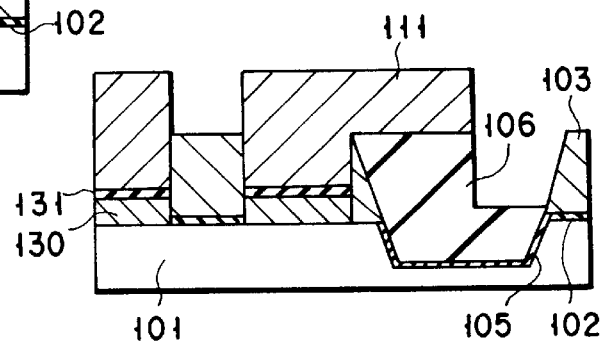
Figure 16I:
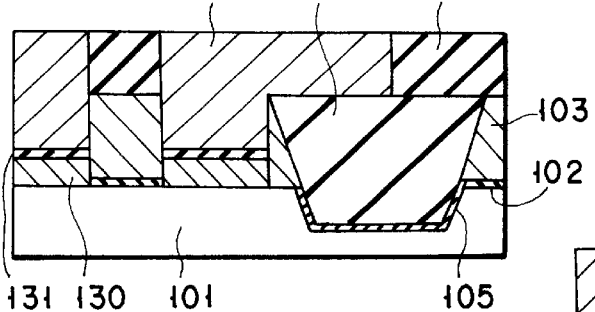
Figure 16L:
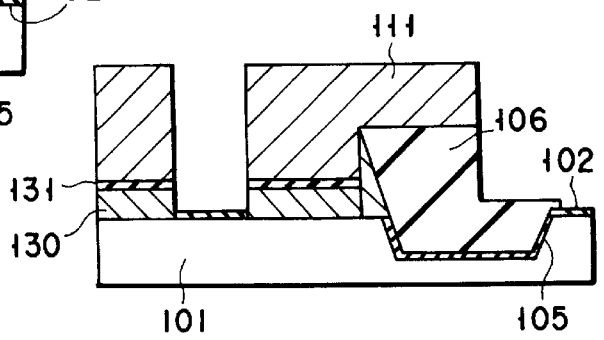
Figure 16M:
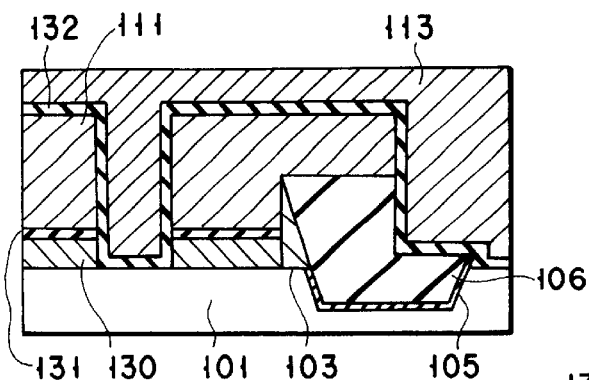
Figure 16P:
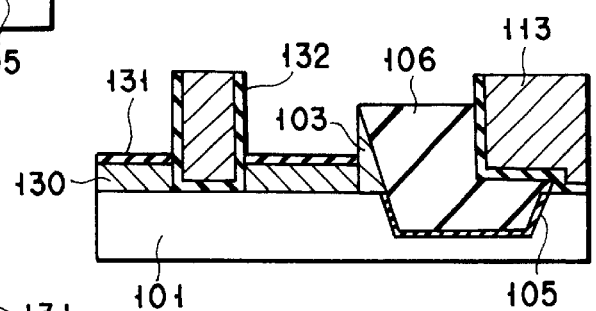
Figure 16N:
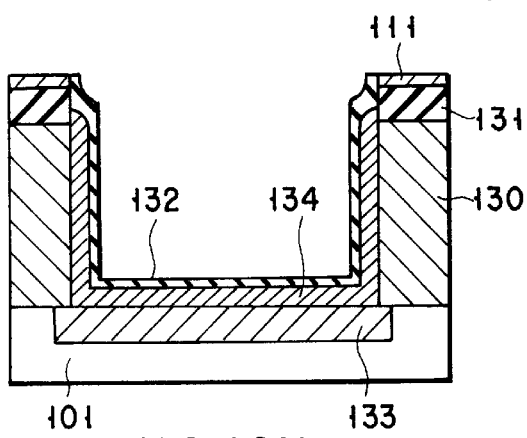
Figure 16Q:
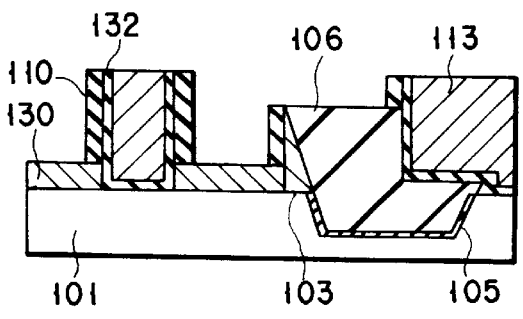
Figure 16:
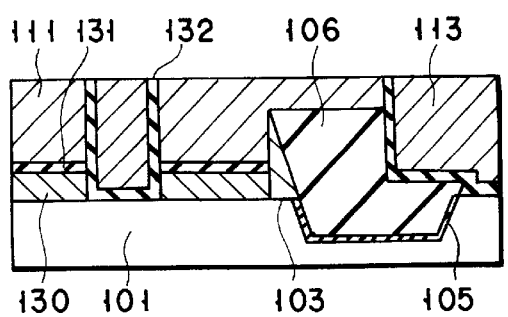
Figure 16R:
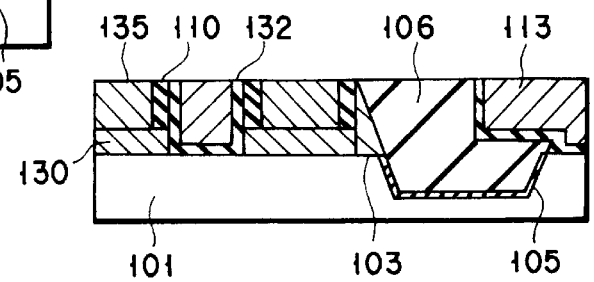
Figure 16S:
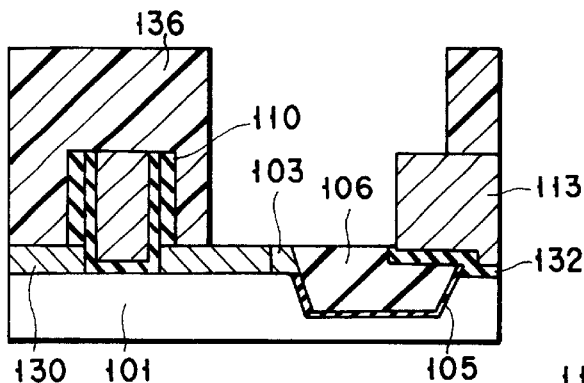
Figure 16V:
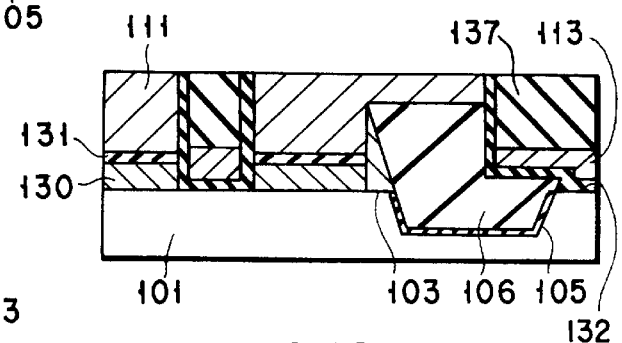
Figure 16T:
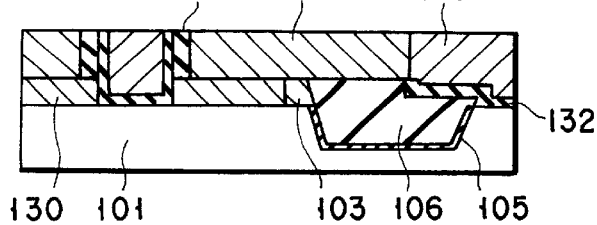
Figure 16W:
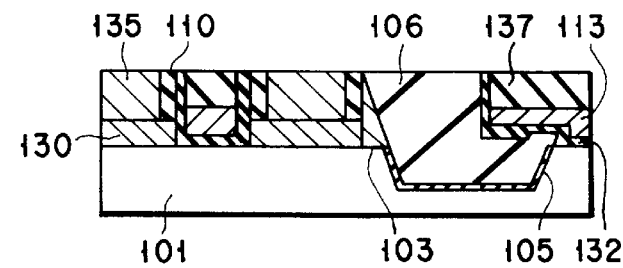
Figure 16U:
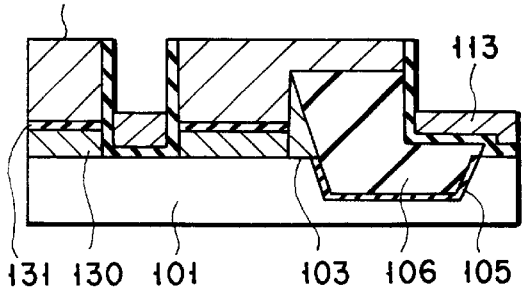
Figure 16X:
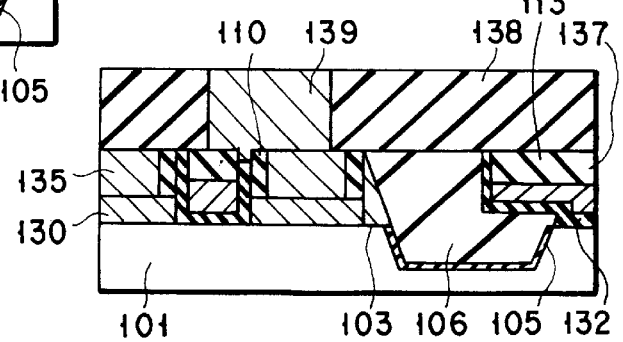

FIGS. 16A to 16X are sectional views, respectively, schematically showing the steps in manufacturing a semiconductor device according to the 11th embodiment of the present invention.

As shown in FIG. 16A, a thermal oxide film 102 having a thickness of about 4 nm is formed on one surface of a silicon substrate 101. The thermal oxide film 102 is used as an etching stopper in the subsequent step in order to protect the surface of the substrate 101. A silicon nitride film 103 having a thickness of about 150 nm is formed on the thermal oxide film 102 by CVD.

As shown in FIG. 16B, the silicon nitride film 103, the thermal oxide film 102, and the silicon substrate 101 are etched by lithography and RIE to form a groove 104. The groove 104 is used for device isolation later. In the 11th embodiment, the groove 104 is tapered forward. A thermal oxide film 105 is formed on the exposed surface of the silicon substrate 101.

As shown in FIG. 16C, the groove 104 is filled with silicon oxide by forming a silicon oxide film 106 by CVD on the surface of the substrate 101 in which the groove 104 is formed. The silicon oxide film 106 is polished by CMP. This polishing stops when the silicon nitride film 103 is exposed. In this way, a device isolation region is formed.

A silicon oxide film 108 having a pattern shown in FIG. 16D is formed to a thickness of about 300 nm on the silicon nitride film 103 and the silicon oxide film 106. The silicon oxide is used because of its high etching selectivity with respect to the silicon nitride film 103. Note that in this etching, the silicon oxide film 106 is also partially removed. When the silicon oxide film 106 is removed by an excessively large amount, an SiN film may be formed as an etching stopper between the silicon oxide film 108 and the silicon oxide film 106.

As shown in FIG. 16E, the silicon nitride film 103 is anisotropically etched by RIE or the like using the silicon oxide films 106 and 108 as a mask and the silicon oxide film 102 as an etching stopper. At this time, the silicon nitride film 103 between the silicon oxide film 106 and the substrate 101 in the forward tapered groove 104 is not etched and is left. That is, an SiN sidewall can be self-aligned around a source/drain electrode formation region. Therefore, according to the 11th embodiment, no SiN sidewall need be separately formed. When the sidewall is made sufficiently thick, and the STI region is made narrow, the groove 104 is formed as shown in FIG. 16F. In other words, the silicon nitride film 103 is etched into a tapered shape, whereas the substrate 101 is etched into a rectangular shape.

Then, the exposed portion of the silicon oxide film 102 is removed by wet etching with dilute hydrofluoric acid or the like. As shown in FIG. 16G, silicon is epitaxially grown on the exposed surface of the substrate 101 to form a crystalline silicon film 130. When a portion around the exposed surface of the substrate 101 is covered with a silicon oxide film, erroneous growth such as facet growth occurs in epitaxial growth. To the contrary, in the 11th embodiment, since a portion around the exposed surface of the substrate 101 is covered with the SiN film, the crystalline silicon film 130 can be uniformly formed with a sufficient thickness without any erroneous growth. Subsequently, a thermal oxide film 131 is formed on the surface of the crystalline silicon film 130. The thermal oxide film 131 is used as an etching stopper in the subsequent step.

A conductive impurity is doped in the crystalline silicon film 130 by ion implantation or the like, and an activation is performed. Instead of the above step, a mixture of a conductive impurity and silicon may be epitaxially grown. If no concave structure is required, no epitaxial growth is performed. If an extension is formed at this time, e.g., after implanting ions to form the extension, a silicon oxide sidewall is formed, then a diffusion region containing the ions at high concentration is formed, and the sidewall is removed by wet etching or the like. The sidewall can be removed by etching within a short time by forming it of, e.g., BPSG whose etching rate is higher than that of a general silicon oxide. Therefore, the silicon oxide film 106 can be prevented from being excessively removed. Forming a heavily doped diffusion region requires a higher activation temperature than the extension formation temperature. Accordingly, after a sidewall is formed, a heavily doped diffusion region is formed in advance. After the sidewall is removed, ions are implanted and an activation is performed to form an extension as a shallower junction region. With this processing, a shallower junction can be formed.

A polysilicon film 111 is formed by CVD, as shown in FIG. 16H, and flattened by CMP or resist etch-back, as shown in FIG. 16I. This flattening is performed until the silicon oxide film 108 is exposed. As a result, the entire region except for a gate wiring formation region is covered with the polysilicon film 111. Using the polysilicon film 111 as a mask, a groove can be formed in correspondence with the gate wiring formation region.

As shown in FIG. 16J, the silicon oxide film 108 is removed by RIE or the like using the polysilicon film 111 as a mask.

As shown in FIG. 16K, the silicon oxide film 106 is etched by RIE or the like using the silicon nitride film 103 and the polysilicon film 111 as a mask. This etching stops before a channel edge is exposed.

As shown in FIG. 16L, the exposed portion of the silicon nitride film 103 is anisotropically etched by RIE or the like using the polysilicon film 111 and the thermal oxide film 102 as a mask. At this time, when the etching selectivity is low between the silicon nitride film 103 and the polysilicon film 111, a thermal oxide film is formed on the surface of the polysilicon film 111 before RIE, thereby obtaining a sufficiently high etching selectivity.

As shown in FIG. 16M, the thermal oxide film 102 is removed with dilute hydrofluoric acid or the like, and a gate insulating film 132 is formed. The gate insulating film 132 may be formed by thermal oxidization or CVD. Thereafter, a film 113 made of a low-resistance material, e.g., W is formed. If necessary, a barrier layer is formed on the gate insulating film 132, and then the W film 113 is formed. Before the gate insulating film 132 is formed, a thin thermal oxide film may be formed and then removed. Alternatively, hydrogen annealing or the like may be performed. With this processing, the edge of the crystalline silicon film 130 can be rounded. By ion implantation into a channel region immediately before formation of the gate insulating film 132, a heavily doped channel region can be formed at only a desired portion of the device region. Therefore, the junction capacitance of the source/drain region can be reduced.

As shown in FIG. 16N, before forming the gate insulating film 132, a heavily doped channel region 133 may be formed by ion implantation or the like, and a film 134 made of Si or Si-Ge may be formed by selective epitaxial growth. As a result, a MOSFET having a retrograde channel structure can be obtained. In selective epitaxial growth, although Si or Si-Ge may also be epitaxially grown on the polysilicon film 111, it can be removed at the same time as etching the polysilicon film 111. FIG. 16N is an enlarged view showing the groove.

As shown in FIG. 16O, the W film 113 is flattened by CMP, resist etch-back, or the like. This flattening is performed until the polysilicon film 111 is exposed.

As shown in FIG. 16P, the polysilicon film 111 is etched by RIE or the like using the silicon oxide film 106, the W film 113, and the gate insulating film 132 as a mask. This etching need not be anisotropic etching, and may use radical atoms, which prevents the gate edge from damage. To repair a damaged gate edge, the obtained structure is oxidized in an atmosphere containing hydrogen, water, and nitrogen. Consequently, the gate edge of the crystalline silicon film 130 can be repaired without oxidizing the W film 113.

As shown in FIG. 16Q, an SiN film is formed and subjected to RIE to form an SiN sidewall 110 for preventing electrical short-circuiting between a source/drain electrode and a gate electrode. Subsequently, the thermal oxide film 131 is removed with dilute hydrofluoric acid or dry etching. Instead of SiN, the sidewall 110 may be made of, e.g., a silicon oxide having a lower dielectric constant. With this material, the parasitic capacitance can be reduced between the source/drain electrode and the gate electrode. In the step shown in FIG. 16G, a conductive impurity is doped in the crystalline silicon film 130. However, when the gate electrode is made of a refractory metal such as W, annealing described with reference to FIGS. 16M and 16N can be eliminated by performing ion implantation and activation annealing subsequent to the steps shown in FIGS. 16P and 16Q. Therefore, a shallower junction can be formed.

As shown in FIG. 16R, an Al film 135 is formed and flattened by CMP, resist etch-back, or the like. This flattening is performed until the silicon oxide film 106 is exposed. As a result, a source/drain electrode is formed. If necessary, a barrier layer is formed before forming the Al film 135.

In the above-described manner, a half-concave MOSFET can be obtained.

According to the 11th embodiment, in simultaneously forming a plurality of half-concave MOSFETs, the source electrode of a certain MOSFET and the drain electrode of another one, or the source or drain electrode of a given MOSFET and the gate electrode of another one can be electrically connected. The method will be described below.

After the step shown in FIG. 16Q, as shown in FIG. 16S, a resist film 136 is formed, and an opening is formed therein by lithography. Part of the silicon nitride film 103, and the SiN sidewall 110 are removed by etching using radical atoms or the like. Subsequently, the silicon oxide film 106 is etched by RIE or the like so as to align its level with the level of the crystalline silicon film 130. The etching rate is related to the thickness of a wiring layer to be formed later. Therefore, if the resistance of the wiring layer need not be so low, the etching rate may be set lower than the above rate.

The resist film 136 is removed. Further, the steps shown in FIGS. 16Q and 16R are performed to obtain the semiconductor device shown in FIG. 16T.

As described above, the 11th embodiment allows to simultaneously form a plurality of half-concave MOSFETs, electrically connect the source electrode of a given MOSFET to the drain electrode of another one, and electrically connect the source or drain electrode of a certain MOSFET to the gate electrode of another one.

According to the 11th embodiment, the silicon nitride film can be formed on only the gate electrode. The method and effects will be explained.

After the step shown in FIG. 16O, the W film 113 is etched back by RIE or SH processing, as shown in FIG. 16U. As shown in FIG. 16V, a silicon nitride film 137 is formed and flattened by CMP or resist etch-back. This flattening is performed until the polysilicon film 111 is exposed.

By performing the steps shown in FIGS. 16P to 16R, the semiconductor device shown in FIG. 16W can be obtained. In the semiconductor device wherein the silicon nitride film 137 is formed on only the gate electrode, the electrode and the source/drain electrode are hardly electrically short-circuited. The reason will be explained with reference to FIG. 16X.

In FIG. 16X, an insulating film 138 such as a silicon oxide film is formed on the MOSFET shown in FIG. 16W. To form an opening in the insulating film 138 in order to connect the source/drain electrode, a resist film (not shown) must be formed on the insulating film 138 by lithography. For example, when misalignment occurs, an opening may also be formed in the insulating film 138 above the gate electrode 113. In this case, if the opening of the insulating film 138 is filled with a metal 139 such as Al, the gate electrode 113 may be electrically short-circuited with the source/drain electrode 135. To the contrary, as shown in FIG. 16X, when the silicon nitride film 137 is formed on only the gate electrode 113, the gate electrode is covered with the silicon nitride film 137. Therefore, even if the opening is filled with the metal 139, the gate electrode 113 is not electrically short-circuited with the source/drain electrode 135. In addition, the gate insulating film 132 made of a silicon oxide film is partially etched upon forming the opening. However, since the upper surface of the gate electrode is at a position lower than the upper surface of the source/drain electrode, the opening can be formed without excessively etching the gate insulating film 132.

The 12th embodiment of the present invention will be described below. In the ninth embodiment, the resistance of the source/drain/gate electrode is decreased by adopting the elevated source/drain structure and using a silicide. If, however, a low resistance can be realized without using a silicide, no elevated source/drain structure need be employed. In the 12th embodiment, the gate electrode is given with a polymetal structure, and the source/drain electrode is made of W, Al, or the like without employing the elevated source/drain structure.

FIGS. 17A to 17H are sectional views, respectively, schematically showing the steps in manufacturing a semiconductor device according to the 12th embodiment of the present invention.

First, the same steps as described in the ninth embodiment with reference to FIGS. 13A to 13I are performed except that doping a conductive impurity in a polysilicon film 103 and activation are performed after the step shown in FIG. 13A.

Figure 17A:
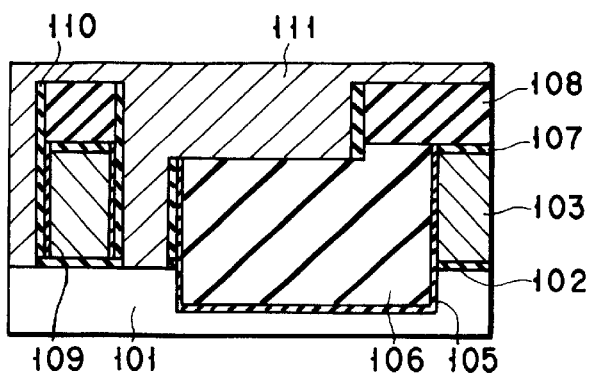
FIGS. 17A to 17H are sectional views, respectively, schematically showing the steps in manufacturing a semiconductor device according to the 12th embodiment of the present invention.

As shown in FIG. 17A, a W film 111 is formed. If necessary, a barrier layer is formed before forming the W film 111. As shown in FIG. 17B, the W film 111 is flattened by CMP or the like. In this way, the entire region except for a gate wiring formation region is covered with the W film 111.

Figure 17D:
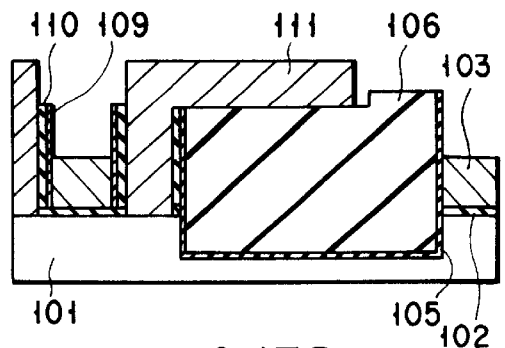
Figure 17B:
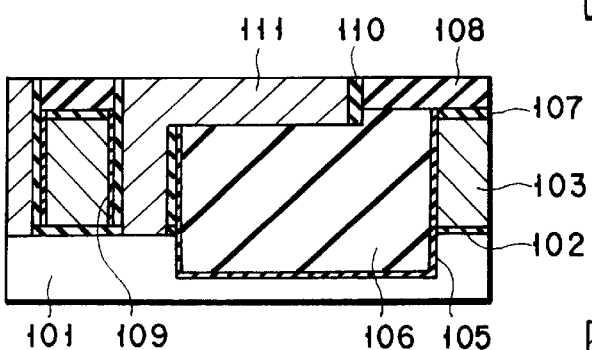
Figure 17E:
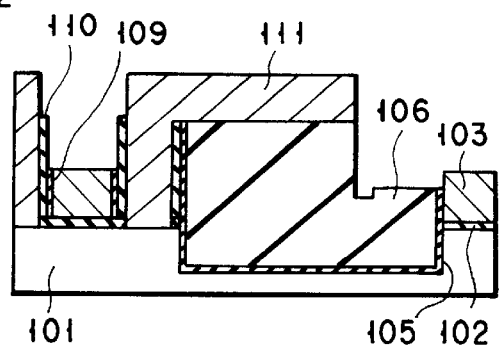
Figure 17C:
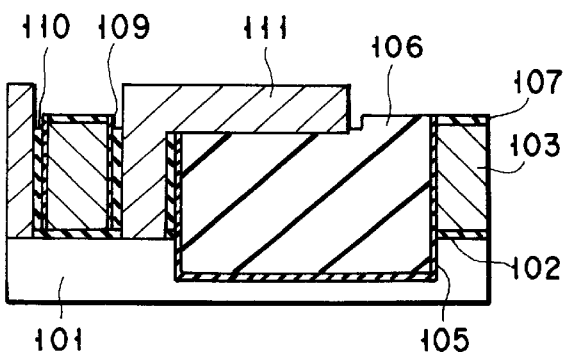

As shown in FIG. 17C, part of a sidewall 110, and an SiN film 108 are removed by radical etching or RIE using the W film 111 as a mask. At this time, a thermal oxide film 107 functions as an etching stopper.

As shown in FIG. 17D, a silicon oxide film 106 is removed by RIE or the like, and the polysilicon film 103 is etched back. In this case, the polysilicon film 103 is not completely removed in order to realize a gate electrode having a multilayered structure of polysilicon and a metal. As shown in FIG. 17E, the silicon oxide film 106 and the like are etched using the W film 111, the sidewall 110, and the polysilicon film 103 as a mask. The silicon oxide film 106 is removed to such a degree as not to expose the channel edge, i.e., the side surface of the silicon oxide film 102.

Figure 17F:
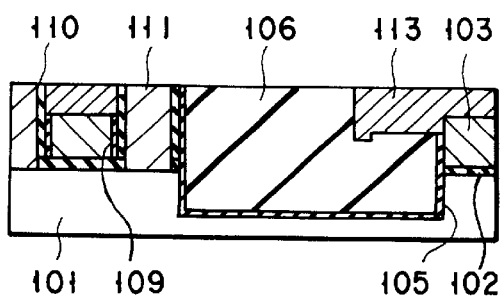

As shown in FIG. 17F, an Al film 113 is formed and flattened by CMP or the like. If necessary, a barrier layer is formed before forming the Al film 113. This flattening is performed until the silicon oxide film 106 is exposed. As a result, a MOSFET in which the gate electrode has a multi-layered polymetal structure of polysilicon and Al, and the source/drain electrode is made of W can be obtained.

According to the 12th embodiment, similar to the 10th embodiment, in forming a plurality of MOSFETs, the source electrode of a given MOSFET and the drain electrode of another one, or the source or drain electrode of a certain MOSFET and the gate electrode of another one can be simultaneously electrically connected. This will be explained with reference to FIGS. 17G and 17H.

Figure 17G:
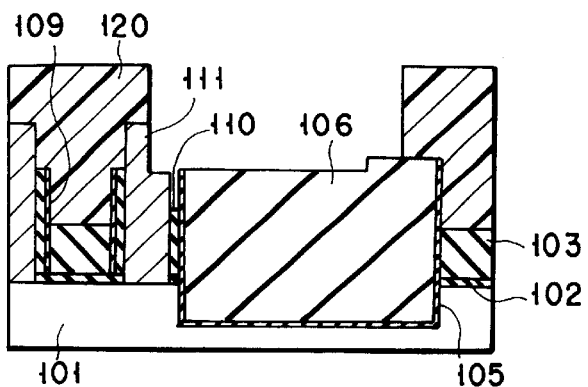
Figure 17H:
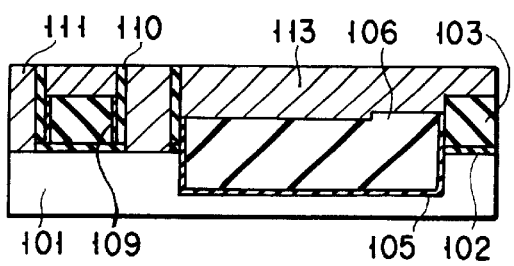

By the above-mentioned method, the structure shown in FIG. 17D is obtained. As shown in FIG. 17G, a resist film 120 is formed, and an opening is formed therein by lithography. Thereafter, the W film 111 is etched using the silicon oxide film 106 as an etching stopper. Then, the SiN sidewall 110 is etched back to have a level almost equal to the level of the polysilicon film 103.

After the resist film 120 is removed, the steps described with reference to FIGS. 17E and 17F are performed. With this processing, as shown in FIG. 17F, the source or drain electrode of a given MOSFET can be electrically connected to the gate electrode of another one at the same time as formation of a plurality of MOSFETs.

The 13th embodiment of the present invention will be described. In the ninth and 12th embodiments, flattening by CMP is performed three times. In the 13th embodiment, the number of flattening steps can be reduced to two by a resist recess technique. This will be explained with reference to FIGS. 18A and 18B.

In the 12th embodiment, in the steps shown in FIGS. 17A and 17B, the W film 111 is formed to cover the entire region except for a gate wiring region. In the 12th embodiment, the SiN film 108 is etched using the W film 111 as a mask. In contrast to this, according to the 13th embodiment, a resist film 111A is used instead of the W film 111, as shown in FIG. 18A.

More specifically, the same steps as described in the ninth embodiment with reference to FIGS. 13A to 13I are performed except that doping a conductive impurity is doped in a polysilicon film 103 and activation are performed after the step shown in FIG. 13A.

Figure 18A:
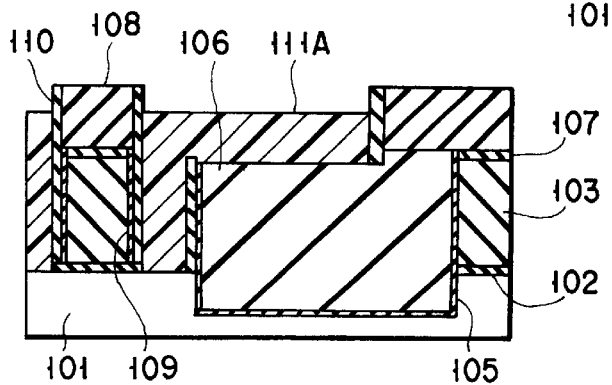
FIGS. 18A and 18B are sectional views, respectively, schematically showing the steps in manufacturing a semiconductor device according to the 13th embodiment of the present invention.

As shown in FIG. 18A, a resist film 111A is formed. Then, the resist is recessed to expose an SiN film 108, while the exposure amount is properly controlled. Using the resist film 111A with the opening formed in this manner as a mask, the SiN film 108 can be selectively etched.

Figure 18B:
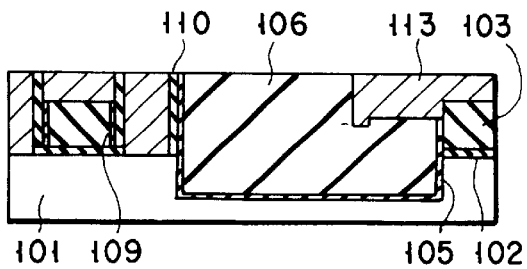

The steps described in the 12th embodiment with reference to FIGS. 17D and 17E are performed. After that, the resist film 111A is removed, and the step described in the 12th embodiment with reference to FIG. 17F is performed to obtain a MOSFET in which the source/drain/gate electrode is made of Al, as shown in FIG. 18B.

In the 13th embodiment, unlike the ninth, 11th, and 12th embodiments, the mask used in etching the SiN film 108 is made of a resist. For this reason, in the 13th embodiment, no flattening need be executed to form an opening in the mask. According to this embodiment, the number of CMP steps can be decreased, resulting in low manufacturing cost.

Figure 19A:
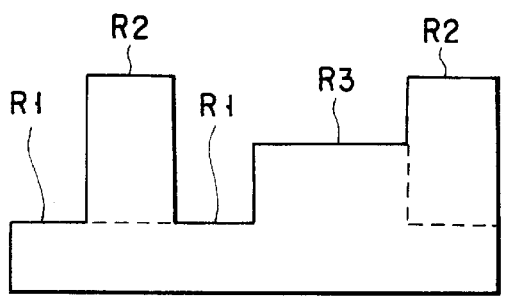
FIGS. 19A and 19B are sectional views, respectively, schematically showing a method of manufacturing a semiconductor device according to the ninth to 13th embodiments of the present invention.
Figure 19B:
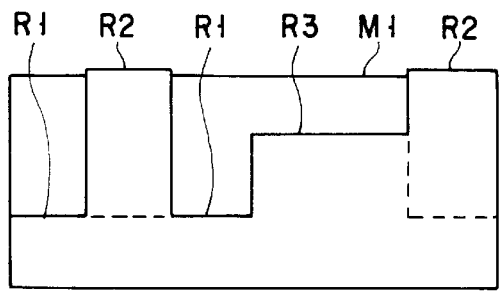

The process common to the ninth to 13th embodiments will be described with reference to FIGS. 19A and 19B. FIGS. 19A and 19B are sectional views, respectively, schematically showing the steps in manufacturing a semiconductor device according to the ninth and 13th embodiments of the present invention.

According to the ninth to 13th embodiments, a groove for burying a source/drain electrode, and a groove for burying a gate electrode are formed in different steps. That is, as shown in FIG. 19A, two types of grooves having different depths are formed in one major surface of a substrate. In FIG. 19A, reference symbol $R_1$ denotes a source/drain electrode formation region; $R_2$, a gate wiring formation region; and $R_3$, a device isolation region.

Each groove is filled with a mask material $M_1$. The mask material $M_1$ is selected to selectively remove the region $R_2$ with respect to the material $M_1$. The structure surface is flattened to expose the region $R_2$.

Then, the region $R_2$ is grooved using a thin film made of the material $M_1$ as a mask. The groove formed in this way is filled with a material (not shown) used for forming a gate wiring layer. The structure surface is flattened to expose the device isolation region $R_3$.

When the mask material $M_1$ is an electrode material used for the source/drain electrode, a MOSFET can be obtained by the above steps. When the mask material $M_1$ is a material to be removed, the mask material $M_1$ is removed, the formed groove is filled with an electrode material, and the structure surface is flattened to obtain a MOSFET.

According to a method of manufacturing a semiconductor device of the ninth to 13th embodiments, the gate wiring layer and the source and drain electrodes can be self-aligned. In the ninth and 12th embodiments, the material $M_1$ is polysilicon and W, and used to form a source/drain electrode. In the 11th and 13th embodiments, the material $M_1$ is polysilicon and a resist, and removed before forming a source/drain electrode. Note that in the 13th embodiment, after a gate insulating film is formed, a gate wiring layer, and source and drain electrodes are simultaneously buried.

According to the ninth to 13th embodiments, prior to formation of the source/drain electrode, the gate structure and the device isolation insulating film are so formed as to align their upper surface levels with each other, and to form a groove crossing the gate structure and divided by it. The source/drain electrode is formed in the groove, similar to the first to eighth embodiments. By the ninth to 13th embodiments, therefore, the same effects as those described in the first to eighth embodiments can be obtained in addition to the own effects. Note that in the ninth to 13th embodiments, the same reference numerals denote the same parts unless otherwise specified.

In the first to 13th embodiments described above, the device isolation region is formed to have an upper surface higher than the bottom surface of the source/drain electrode formation region. The effects obtained from this structure will be explained in more detail with reference to FIGS. 20A, 20B, 21A, and 21B.

Figure 20A:
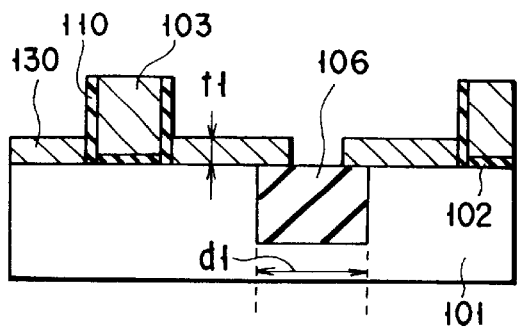
FIG. 20A is a sectional view schematically showing a method of manufacturing a conventional MOSFET.
Figure 20B:
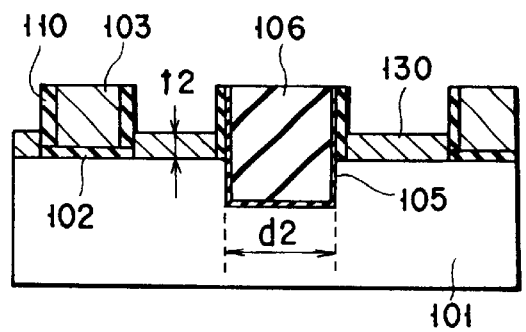
FIG. 20B is a sectional view schematically showing a method of manufacturing a MOSFET according to the first to 13th embodiments of the present invention.

FIG. 20A is a sectional view schematically showing a method of manufacturing a conventional MOSFET. FIG. 20B is a sectional view schematically showing a method of manufacturing a MOSFET according to the first to 13th embodiments of the present invention. FIGS. 20A and 20B show the intermediate steps for manufacturing a MOSFET having an elevated source/drain structure.

Figure 21A:
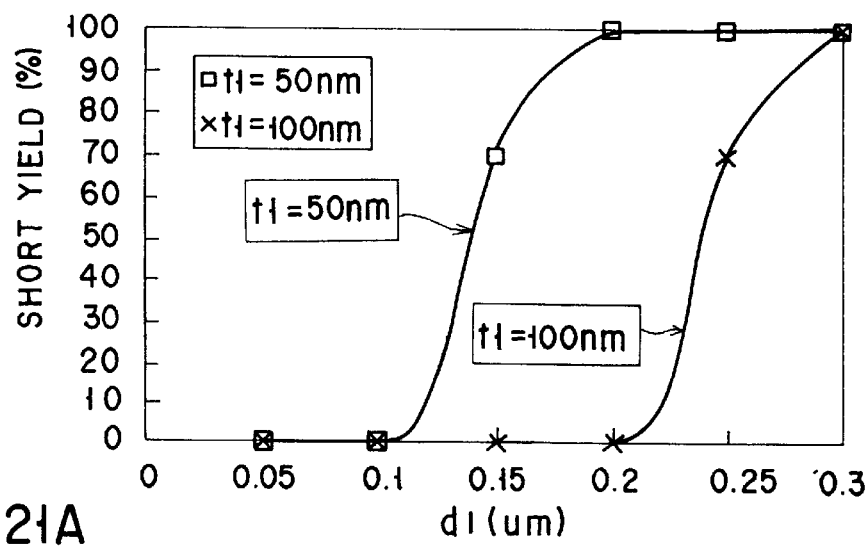
FIGS. 21A and 21B are graphs, respectively, showing the relationship between the width of the device isolation region and the short yield in the MOSFETs shown in FIGS. 20A and 20B.
Figure 21B:
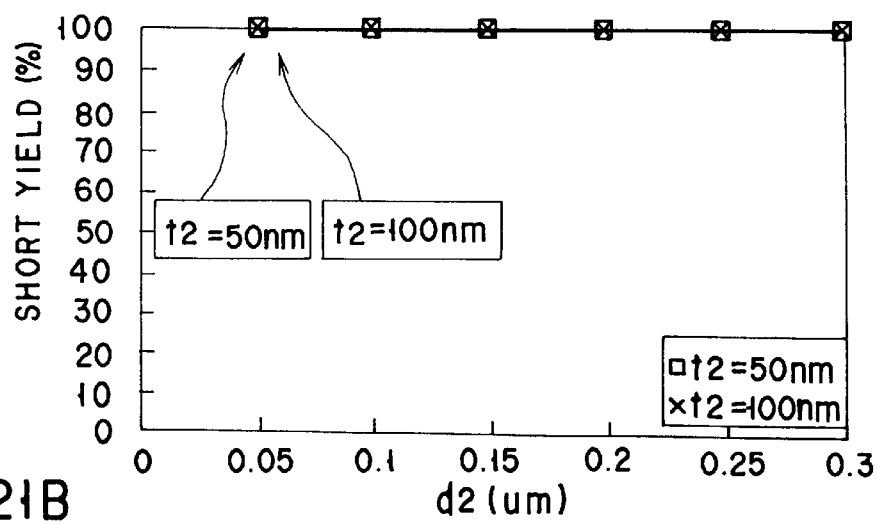

FIGS. 21A and 21B are graphs, respectively, showing the relationship between the width of the device isolation region and the short yield in the MOSFETs shown in FIGS. 20A and 20B. In FIGS. 21A and 21B, the abscissa represents a width $d_1$ or $d_2$ of the device isolation region 106, and the ordinate represents the short yield.

As shown in FIG. 20A, in the conventional MOSFET, the device isolation region 106 is formed to be completely buried in the surface region of the substrate 101. When the crystalline silicon film 130 is formed on the substrate 101 by selective epitaxial growth, the crystalline silicon film 130 also grows laterally. For example, when the crystalline silicon film 130 has a thickness $t_1$ of 50 nm, it also grows laterally by about 50 nm. For this reason, as shown in FIG. 21A, the yield starts decreasing at a width $d_1$ smaller than 0.2 μm in the device isolation region 106, and to 0% at a width $d_1$ of 0.1 μm or less. That is, substantially all adjacent MOSFETs are short-circuited. Further, in the conventional method, the width $d_1$ must be at least 0.3 μm for a thickness $t_1$ of 100 nm.

To the contrary, as shown in FIG. 20B, when the device isolation region 106 is formed to have an upper surface higher than the substrate surface, no short-circuiting occurs between adjacent MOSFETs. In other words, even if the width $d_2$ of the device isolation region 106 decreases to 0.1 μm, a high yield can be obtained independently of the thickness $t_2$ of the crystalline silicon film 130, as shown in FIG. 21B.

In the future, the wiring layer in semiconductor devices will be formed at a width of about 0.1 μm. In this case, the width $d_1$ or $d_2$ must decrease to about 0.15 μm. In addition, a source/drain electrode and a gate wiring layer made of cobalt silicide must be formed at a thickness of 50 nm or more in order to realize a low resistance.

In forming a 50-nm thick silicide film, a crystalline silicon film having a thickness of about 50 nm is consumed. Therefore, to realize a shallow junction at a depth of about 30 nm, and suppress the junction leakage by silicide at the source and drain portions, the thickness $t_1$ or $t_2$ must be 50 nm or more.

At a width $d_1$ of 0.15 μm, however, if a 50-nm thick crystalline silicon film 130 is formed by the conventional method, a high yield cannot be obtained. To obtain a high yield, the width $d_1$ must be 0.2 μm or more. This means that the integration degree cannot be increased from the one realized in a semiconductor device having a wiring width of about 0.15 μm. Moreover, micropatterning requires a lower resistance, so that the silicide film must be made thick. In this case, by the conventional method, the width $d_1$ must be increased. According to the conventional method, the integration degree decreases along with micropatterning.

In contrast to this, according to the first to 13th embodiments of the present invention, the yield is independent of the width $d_2$ of the device isolation region 106 and the thickness $t_2$ of the crystalline silicon film 130. Therefore, the integration degree can be increased without decreasing the yield.

Furthermore, in the conventional method, source and drain electrodes to be self-aligned must be made of silicide.

In the first to 13th embodiments of the present invention, however, source and drain electrodes can be made of a metal such as Al or Cu whose resistance is lower than that of silicide. With the use of silicide, the crystalline silicon film 130 must be made thick in order to prevent the junction leakage. With the use of the low-resistance metal, the crystalline silicon film 130 need not be made so thick, compared to the silicide film.

The 14th embodiment of the present invention will be described below. A method of manufacturing an nMOS will be explained, but a pMOS can also be manufactured by the same method by reversing the conductivity type of an impurity.

FIGS. 22A to 22K are sectional views, respectively, schematically showing the steps in manufacturing a semiconductor device according to the 14th embodiment of the present invention.

Figure 22A:
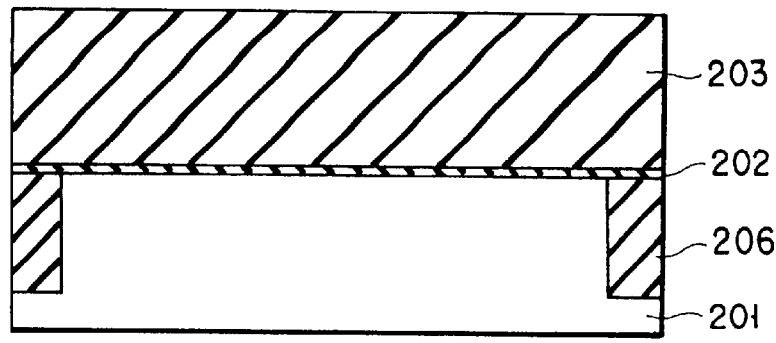
FIGS. 22A to 22K are sectional views, respectively, schematically showing the steps in manufacturing a semiconductor device according to the 14th embodiment of the present invention.

As shown in FIG. 22A, a trench device isolation 206 is formed in the surface region of one major surface of a substrate 201. Note that the substrate 201 is a p-type silicon substrate or a silicon substrate wherein a p-type well region is formed. The device isolation 206 need not always be a trench and may be formed by LOCOS. An oxide film 202 having a thickness of about 8 nm is formed on the substrate 201. Then, a thin film 203 made of, e.g., $Si_3N_4$ is formed on the oxide film 202.

Figure 22B:
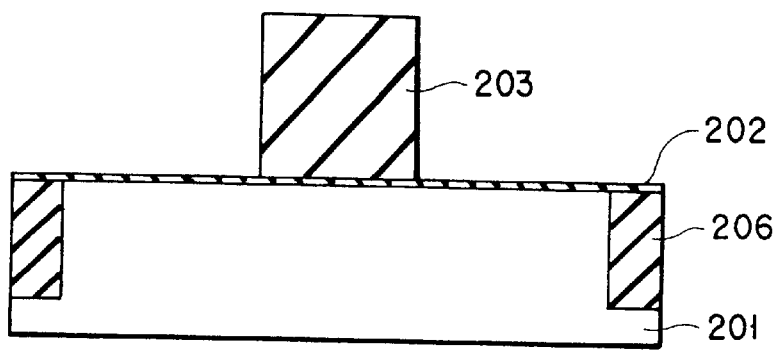

As shown in FIG. 22B, the thin film 203 is patterned to form a dummy gate wiring layer. The exposed portion of the oxide film 202 is removed with a solution containing dilute hydrofluoric acid and the like.

Figure 22C:
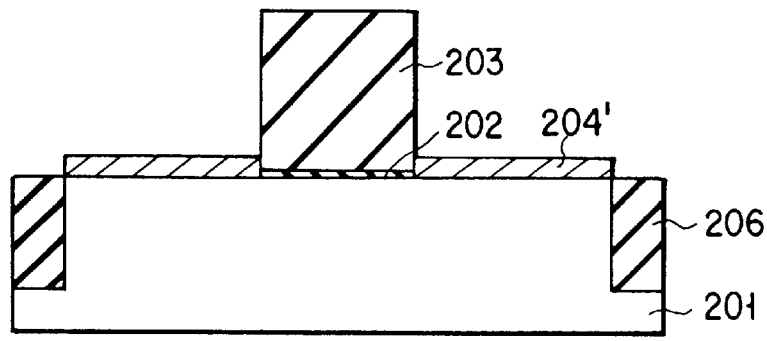
Figure 22D:
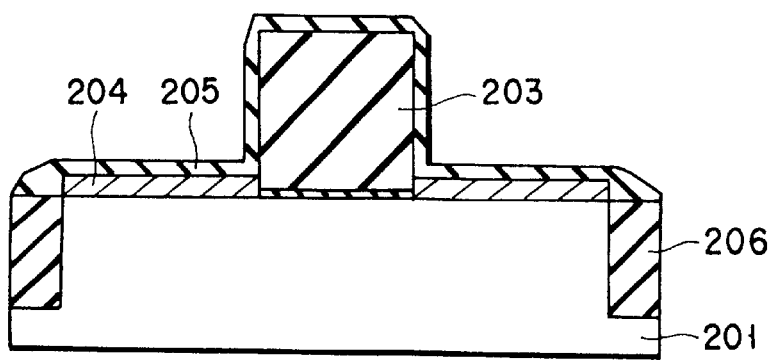

As shown in FIG. 22C, silicon is selectively epitaxially grown using the exposed portion of the substrate 201 as a seed, thereby forming a crystalline silicon film 204' having a thickness of about 20 nm. An insulating film 205 having a thickness of about 10 nm and made of $SiO_2$ or the like is formed on the crystalline silicon film 204' and the dummy gate wiring layer 203 as shown in FIG. 22D. As+ ions are implanted in the crystalline silicon film 204' at an acceleration energy of 20 keV and a concentration of $1 \times 10^{14}$ $cm^3$ to form an impurity diffusion region.

Figure 22E:
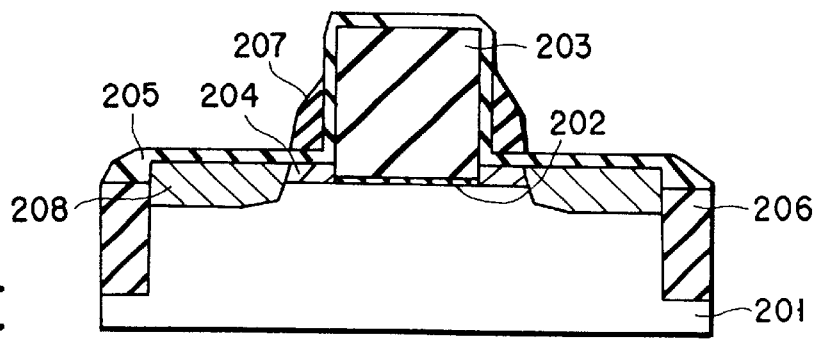

As shown in FIG. 22E, a gate sidewall 207 made of an insulator such as $Si_3N_4$ is formed on the side surface of the dummy gate wiring layer 203 via the insulating film 205. Using the gate sidewall 207 as a mask, $As^+$ ions and the like are implanted in the crystalline silicon film 204', thereby forming an extension 204 below the gate sidewall 207. Further, an $n^+$-type diffusion region 208 is formed adjacent to the extension 204. Note that the extension 204 is made shallower than the $n^+$-type diffusion region 208. The extension 204 and the $n^+$-type diffusion region 208 constitute source and drain diffusion layers.

In this step, the insulating film 205 is used as an etching stopper for etching performed in formation of the gate sidewall 207, and in addition, functions to prevent channeling upon ion implantation for forming the $n^+$-type diffusion region 208. The effective depth of the $n^+$-type diffusion region 208 formed in the above fashion, i.e., the depth from the oxide film 202 is smaller than an actual depth by the thickness of the extension 204. When a silicide film is to be formed in the source/drain region by SALICIDE method, the exposed portion of the insulating film 205 is removed, and a metal film (not shown) made of Ti, Co, or the like is formed after the above steps. The metal is reacted with Si constituting the $n^+$-type diffusion region 208 by RTA or the like, and the unreacted metal is removed by, e.g., a solution mixture containing sulfuric acid and hydrogen peroxide. As a result, a silicide film can be formed.

Figure 22F:
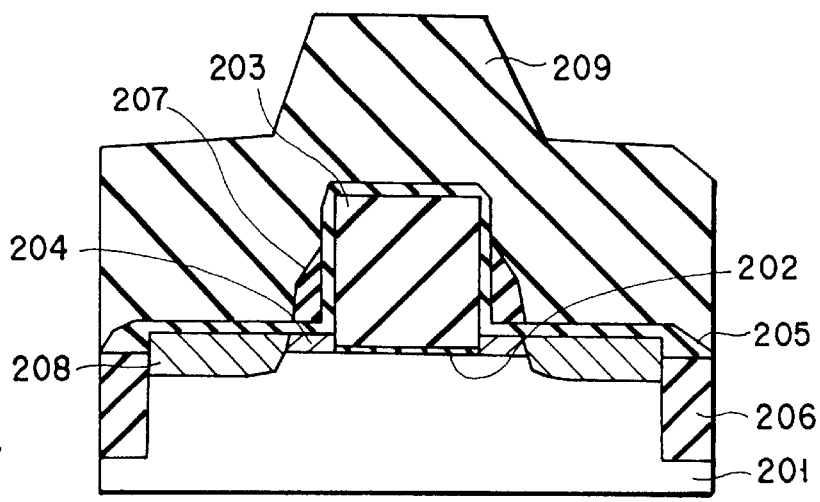
Figure 22G:
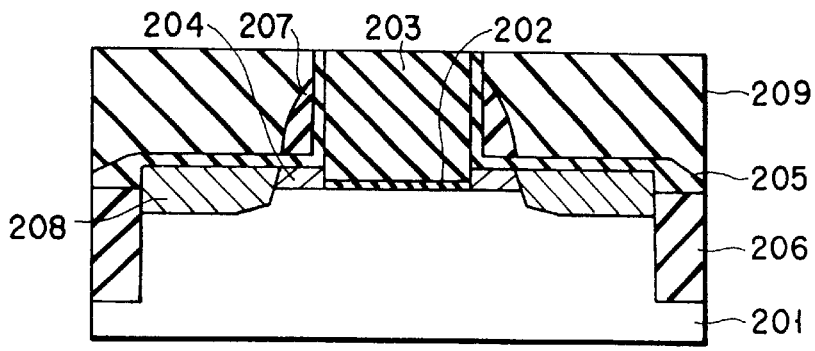

As shown in FIG. 22F, an insulating film 209 made of SiO$_2$ or the like is formed on the entire surface of the substrate 201 in which the n$^+$-type diffusion region 208 is formed. As shown in FIG. 22G, the resultant surface is flattened by CMP or the like. This flattening is performed not to expose the gate sidewall 207 and performed to expose the top surface of the dummy gate wiring layer 203.

Figure 22H:
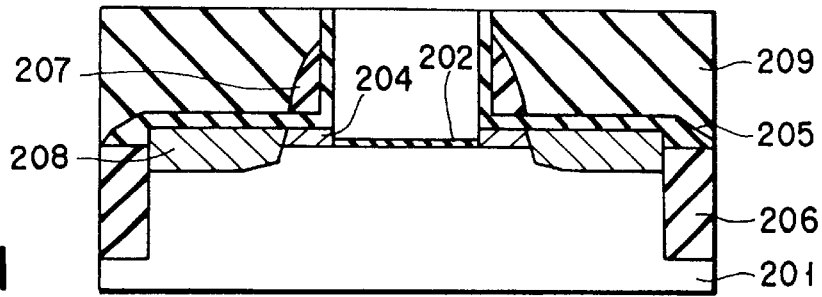

As shown in FIG. 22H, the dummy gate wiring layer 203 is removed. When the dummy gate wiring layer 203 is made of Si$_3$N$_4$, and the insulating film 209 is made of SiO$_2$, as in the 14th embodiment, the dummy gate wiring layer 203 can be selectively removed with hot phosphoric acid. In the 14th embodiment, the dummy gate wiring layer 203 is made of Si$_3$N$_4$, and the insulating films 205 and 209 are made of SiO$_2$. However, other materials are also available as far as only the dummy gate wiring layer 203 can be selectively removed in the step shown in FIG. 22G. Note that only the dummy gate wiring layer 203 is desirably removed by selective etching without damaging the channel portion. Further, ions may be implanted to adjust the threshold of the transistor. In this case, increase of the junction capacitance of the source/drain region is prevented because of that ions can be selectively implanted in only the channel portion.

Figure 22I:
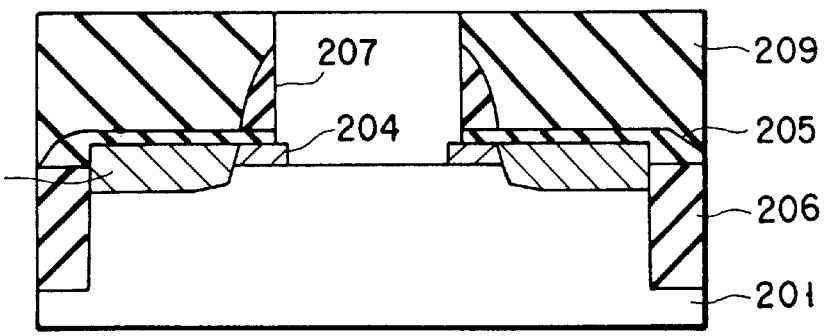
Figure 22J:
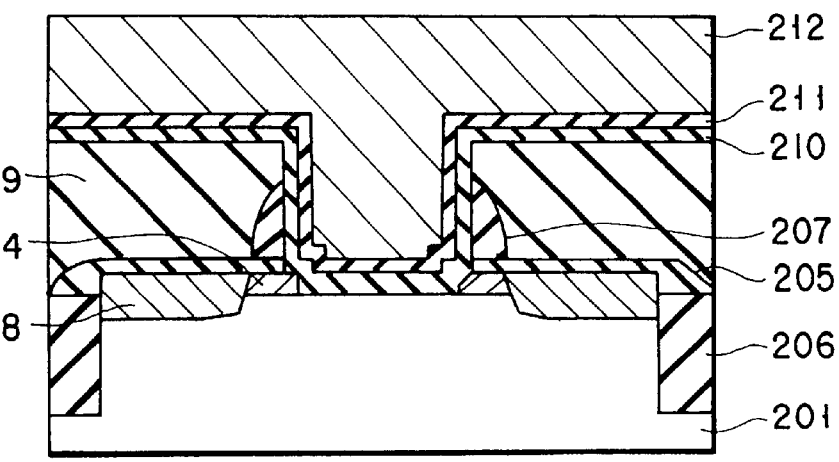

As shown in FIG. 22I, the exposed portion of the insulating film 205, and the oxide film 202 are removed with a dilute-hydrofluoric-acid-containing solution or the like. As shown in FIG. 22J, a gate insulating film 210, a reaction preventing film 211, and a gate electrode material film 212 are sequentially stacked.

The gate insulating film 210 is preferably made of a high-dielectric compound such as Ta$_2$O$_5$ and BST. The gate insulating film 210 is desirably formed by CVD. Using CVD, the gate insulating film 210 can be formed in conformity with the groove shape.

The reaction preventing film 211 is formed to prevent reaction between the gate insulating film 210 and the gate electrode material film 212. Therefore, when the gate insulating film 210 hardly thermally reacts with the gate electrode material film 212, or the gate electrode material hardly diffuses to the gate insulating film 210, the reaction preventing film 211 need not always be formed. The material constituting the reaction preventing film 211 is determined in accordance with a combination of the materials constituting the gate insulating film 210 and the gate electrode material. In general, the reaction preventing film is made of a metal nitride such as TiN, TaN, or WN$_x$, or a ternary compound containing a metal, nitrogen, and silicon.

The gate electrode material film 212 is preferably made of a material mainly containing a metal such as W or Al. The gate electrode material film 212 is desirably formed by CVD. Using CVD, the gate electrode material film 212 can be formed into a preferable shape. Alternatively, PVD may be employed so long as the gate electrode material film 212 can be formed into a preferable shape.

By the following method, the gate electrode material film 212 can be made of Al. More specifically, the groove is filled with amorphous silicon by low-pressure CVD, and Al and Ti are deposited on the amorphous silicon. The resultant structure is heated to a temperature of about 450° C. to diffuse Si in the groove into the Al layer. The diffused Si reacts with Ti to produce TiSi$_x$. TiSi$_x$ is a stable compound and immobile. Consequently, Si in the groove is substituted with Al.

Figure 22K:
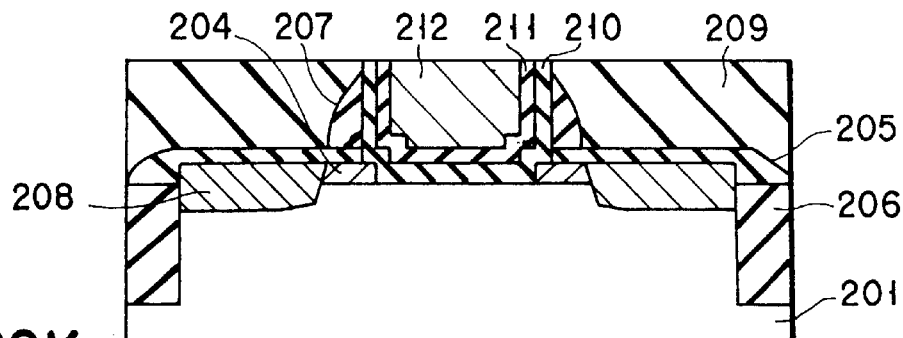

After the step shown in FIG. 22J, the structure surface is flattened by CMP or the like, as shown in FIG. 22K. This flattening is performed until the insulating film 209 is exposed. In this way, the gate electrode 212 is formed in the groove.

According to the 14th embodiment, since a overwrap between the source/drain diffusion layers and the gate electrode can be reduced, the parasitic capacitance can be reduced between the gate electrode and the source/drain diffusion layers. Moreover, according to the 14th embodiment, the source/drain diffusion layers can be made sufficiently thick, and its effective depth can be decreased. Even upon a reduction in size, punch-through can be prevented.

The 15th embodiment of the present invention will be described. The 15th embodiment is different from the 14th embodiment in that a CMOS is manufactured, and by a method of doping a conductive impurity for forming an extension.

FIGS. 23A to 23D are sectional views, respectively, schematically showing the steps in manufacturing a semiconductor device according to the 15th embodiment of the present invention.

Figure 23A:
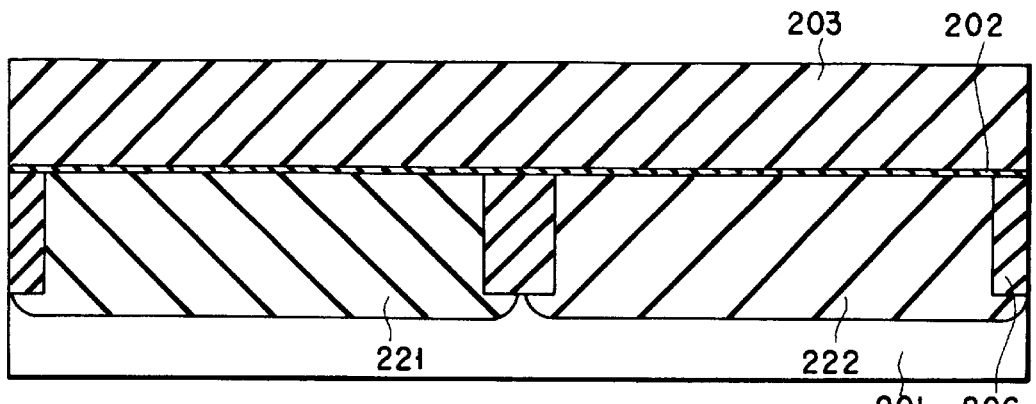
FIGS. 23A to 23D are sectional views, respectively, schematically showing the steps in manufacturing a semiconductor device according to the 15th embodiment of the present invention.

As shown in FIG. 23A, a device isolation 206, a p-type well region 221, and an n-type well region 222 are formed in the surface region of a silicon substrate 201. An oxide film 202, and a thin film 203 made of, e.g., Si$_3$N$_4$ are sequentially formed on the surface of the substrate 201 in which the device isolation 206 and the like are formed.

Figure 23B:
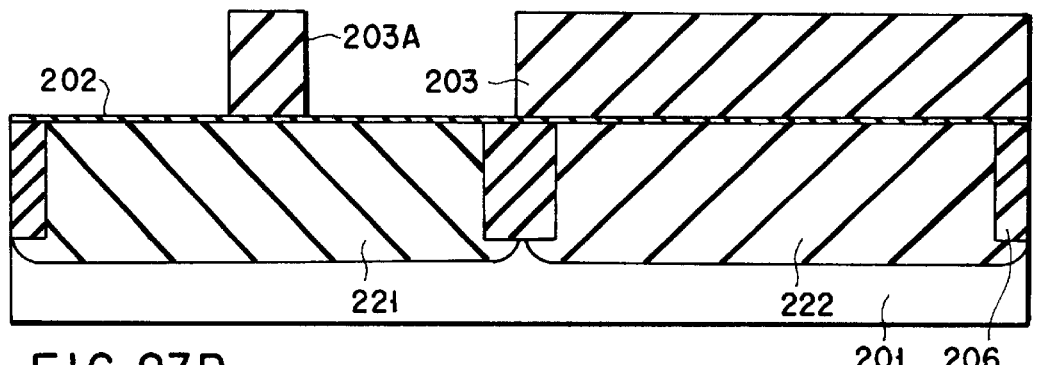
Figure 23C:
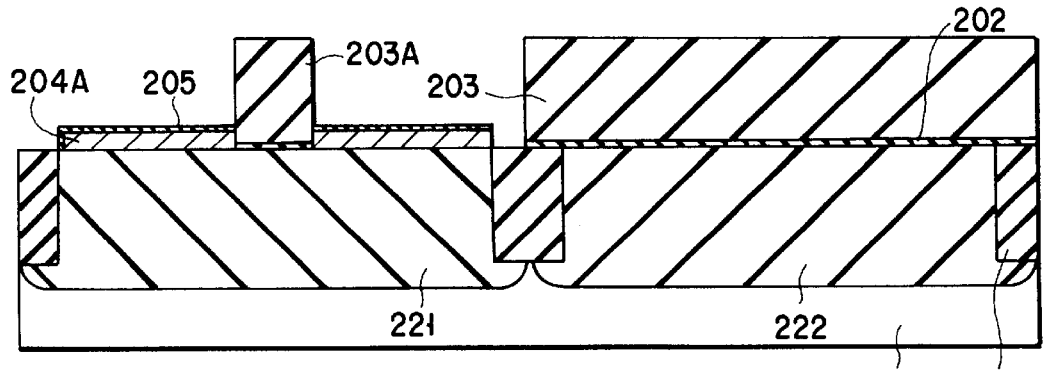

As shown in FIG. 23B, the thin film 203 above the p-type well region 221 is patterned to form a dummy gate wiring layer 203A. As shown in FIG. 23C, the exposed portion of the oxide film 202 is removed with a dilute-hydrofluoric-acid-containing solution or the like. Using the exposed surface of the substrate 201 as a seed, silicon is selectively epitaxially grown to form a crystalline silicon film 204A having a thickness of about 20 nm. Note that this selective epitaxial 5 growth is performed in an atmosphere containing AsH$_3$ gas and PH$_3$ gas, thereby doping an n-type impurity in the crystalline silicon film 204A. Thereafter, a silicon oxide film 205 having a thickness of about 10 nm is formed by oxidizing the surface of the crystalline silicon film 204A or performing CVD or the like.

Figure 23D:
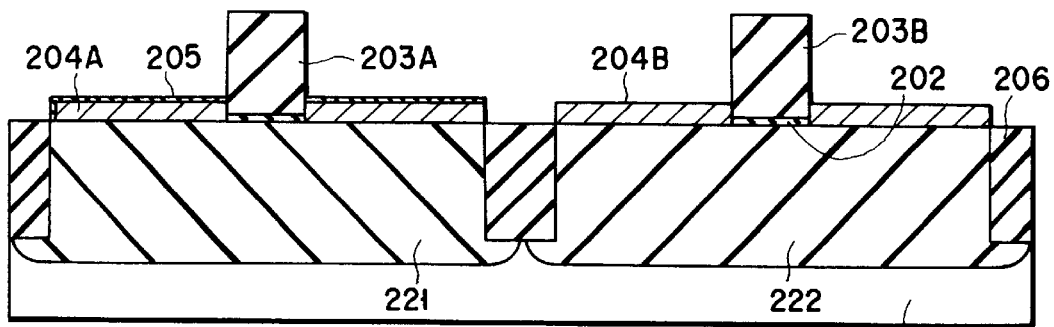

As shown in FIG. 23D, the thin film 203 above the n-type well region 222 is patterned to form a dummy gate wiring layer 203B. By the above method, the exposed portion of the oxide film 202 is removed with a dilute-hydrofluoric-acid-containing solution or the like. Using the exposed surface of the substrate 201 as a seed, silicon is selectively epitaxially grown to form a crystalline silicon film 204B having a thickness of about 20 nm. Note that this selective epitaxial growth is performed in an atmosphere containing B$_2$H$_6$ gas, thereby doping a p-type impurity in the crystalline silicon film 204B. Then, a silicon oxide film (not shown) having a thickness of about 10 nm is formed by oxidizing the surface of the crystalline silicon film 204B or performing CVD or the like.

The steps described in the 14th embodiment with reference to FIGS. 22E to 22K are performed to obtain a MISFET.

As described above, according to the 15th embodiment, the effects described in the 14th embodiment can be obtained. When ions are implanted to form an extension, the total of three PEPs (Photo Engraving Processes) are necessary in patterning and doping the gate electrode. According to the 15th embodiment, however, the number of PEPs can be reduced to two. In ion implantation, the impurity concentration decreases from the substrate surface to a deeper portion. In the 15th embodiment, however, no concentration gradient of the conductive impurity is generated. Therefore, an extension uniformly containing the conductive impurity at a high concentration can be formed. According to the 15th embodiment, the parasitic resistance can be further reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   a) forming, on one major surface of a substrate,
      a gate structure selected from the group consisting of
      a first gate structure comprising a dummy gate wiring layer and a dummy gate electrode, and
      a second gate structure comprising a gate wiring layer and a gate electrode, each of the gate wiring layer and the gate electrode being provided with an insulating film at least on a bottom surface thereof, and
      a device isolation insulating film having a first groove, such that said dummy gate electrode or said gate electrode divides said first groove, and such that an upper surface level of said gate structure is not higher than an upper level of said device isolation insulating film; and
   b) forming source and drain electrodes in the first groove by use of film forming and flattening,
      wherein said dummy gate wiring layer or said gate wiring layer is formed on the device isolation insulating film, connected to said dummy gate electrode or said gate electrode, and crossing said first groove.

2. A method according to claim 1, further comprising respectively forming a source diffusion layer and drain diffusion layer in a surface region of said substrate corresponding to the first groove before the formation of said source and drain electrodes.

3. A method according to claim 1, wherein the formation of said source and drain electrodes comprises:
   forming, on one entire major surface of said substrate, a first thin film made of either one of a material constituting said source and drain electrodes and a material used to form said source and drain electrodes; and
   removing a portion of said first thin film located outside the first groove by using CMP.

4. A method according to claim 1, wherein said gate structure is the first gate structure, and
   the method further comprises:
   removing said first gate structure to form a second groove after the formation of said source and drain electrodes; and
   forming an insulating film, a gate electrode, and a gate wiring layer in the second groove so that said gate electrode divides the gate wiring layer and positions between said source electrode and said drain electrode, and so that said insulating film is interposed between said gate wiring layer and an inner wall of the second groove.

5. A method according to claim 4, wherein said gate electrode and said gate wiring layer are simultaneously formed in one piece by:
   forming a second thin film made of either one of a material constituting said gate wiring layer and material used to form said gate wiring layer, on one entire major surface of said substrate; and
   removing a portion of said second thin film located outside the second groove by using CMP.

6. A method according to claim 4, further comprising, before the formation of said insulating film and said gate wiring layer:
   doping, with a conductive impurity, a surface region of said substrate corresponding to the second groove; and
   forming a semiconductor film on a bottom surface of the second groove by using epitaxial growth.

7. A method according to claim 1, wherein the formation of said gate structure and said device isolation insulating film comprises:
   forming said device isolation insulating film on one major surface of said substrate;
   forming a third groove in said device isolation insulating film;
   forming, on one entire major surface of said substrate, a third thin film made of a material constituting said gate structure;
   removing a portion of said third thin film located outside the third groove by using CMP; and
   forming the first groove, at least a part of the sidewall of which is constituted by said device isolation insulating film, so as to cross the gate structure.

8. A method according to claim 1, wherein said source and drain electrodes are made of a metal.

9. A method according to claim 1, wherein said gate structure is the second gate structure, and said gate electrode and said gate wiring layer are made of a metal.

10. A method of manufacturing a semiconductor device, comprising:
    a) forming, on one major surface of a substrate,
       a gate structure comprising either one of a dummy gate electrode and a gate electrode which is provided with an insulating film at least on a bottom surface thereof, and
       a device isolation insulating film having a first groove, such that said dummy gate electrode or said gate electrode divides said first groove, and such that an upper surface level of said gate structure is not higher than an upper level of said device isolation insulating film; and
    b) forming source and drain electrodes in the first groove by use of film forming and flattening,
       wherein the formation of said gate structure and said device isolation insulating film comprises forming a dummy wiring layer which is positioned above part of said device isolation insulating film, and said gate structure, and has an upper surface level higher than the upper surface level of said device isolation insulating film.

11. A method according to claim 10, further comprising, before the formation of said source and drain electrodes:
    forming a fourth thin film on one entire major surface of said substate;
    polishing said fourth thin film and exposing an upper surface of said dummy wiring layer; and
    removing said dummy wiring layer to form a fourth groove in said fourth thin film.

12. A method according to claim 11, further comprises removing at least a part of an exposed portion of said device isolation insulating film in the fourth groove to form an eighth groove in a bottom of said fourth groove, between the formation of the fourth groove and the formation of said source and drain electrodes.

13. A method according to claim 11, wherein said gate structure is the dummy gate electrode, and the method further comprises, between the formation of said fourth groove and the formation of said source and drain electrodes, removing said dummy gate electrode to form a seventh groove in a bottom of said fourth groove; and forming a gate electrode in the fourth groove.

14. A method according to claim 13, further comprising, after the formation of said device isolation insulating film and said gate structure:

removing a portion of said device isolation insulating film to form a fifth groove; and forming, in the fifth groove, a connection wiring layer connected to at least one of said source electrode, said drain electrode, and said gate wiring layer, wherein the formation of said gate wiring layer and the formation of said connection wiring layer are performed simultaneously.

15. A method according to claim 11, wherein said fourth thin film is made of either one of a material constituting said source and drain electrodes and material used to form said source and drain electrodes.

16. A method according to claim 11, further comprising removing said fourth thin film before the formation of said source and drain electrodes.

17. A method according to claim 11, further comprising, after the formation of said device isolation insulating film and said gate structure:

removing a portion of said device isolation insulating film to form a fifth groove; and forming, in the fifth groove, a connection wiring layer connected to at least one of said source electrode, said drain electrode, and said gate wiring layer.

18. A method according to claim 17, wherein the formation of said connection wiring layer and the formation of said source and drain electrodes are performed simultaneously.

19. A method according to claim 10, further comprising respectively forming a source diffusion layer and a drain diffusion layer in a surface region of said substrate corresponding to the first groove before the formation of said source and drain electrodes.

20. A method according to claim 10, wherein the formation of said source and drain electrodes comprises:

forming, on one entire major surface of said substrate, a first thin film made of either one of a material constituting said source and drain electrodes and a material used to form said source and drain electrodes; and removing a portion of said first thin film located outside the first groove by using CMP.

21. A method according to claim 10, wherein said source and drain electrodes are made of a metal.

22. A method according to claim 10, wherein said gate structure comprises said gate electrode, and said gate electrode and said gate wiring layer are made of a metal.

23. A method of manufacturing a semiconductor device, comprising:

a) forming, on one major surface of a substrate, a gate structure comprising either one of a dummy gate electrode and a gate electrode which is provided with an insulating film at least on a bottom surface thereof, and a device isolation insulating film having a first groove, such that said dummy gate electrode or said gate electrode divides said first groove, and such that an upper surface level of said gate structure is not higher than an upper level of said device isolation insulating film;

b) forming a semiconductor film using epitaxial growth on a bottom surface of the first groove;

c) respectively forming source and drain diffusion layers in said semiconductor film groove;

d) forming source and drain electrodes in the first groove by use of film forming and flattening after the formation of the source and drain diffusion layers.

24. A method according to claim 23, further comprising respectively forming a source diffusion layer and drain diffusion layer in a surface region of said substrate corresponding to the first groove before the formation of said source and drain electrodes.

25. A method according to claim 23, wherein the formation of said source and drain electrodes comprises:

forming, on one entire major surface of said substrate, a first thin film made of either one of a material constituting said source and drain electrodes and a material used to form said source and drain electrodes; and removing a portion of said first thin film located outside the first groove by using CMP.

26. A method according to claim 23, wherein said source and drain electrodes are made of a metal.

27. A method according to claim 23, wherein said gate structure comprises said gate electrode, and said gate electrode and said gate wiring layer are made of a metal.

28. A method of manufacturing a semiconductor device, comprising:

a) forming, on one major surface of a substrate, a gate structure comprising either one of a dummy gate electrode and a gate electrode which is provided with an insulating film at least on a bottom surface thereof, and a device isolation insulating film having a first groove, such that said dummy gate electrode or said gate electrode divides said first groove, and such that an upper surface level of said gate structure is not higher than an upper level of said device isolation insulating film; and b) forming source and drain electrodes in the first groove by use of film forming and flattening, wherein the formation of said gate structure and said device isolation insulating film comprises:

forming, on one entire major surface of said substrate, a third thin film made of a material constituting said dummy gate wiring layer;

forming a second forward-tapered groove in said third thin film;

forming said device isolation insulating film an one major surface of said substrate;

removing a portion of said device isolation insulating film located outside the second groove by using CMP; and anisotropically etching said third thin film to simultaneously form said gate structure and first groove, and a sidewall on a side surface of said device isolation insulating film.

29. A method according to claim 28, further comprising respectively forming a source diffusion layer and drain diffusion layer in a surface region of said substrate corresponding to the first groove before the formation of said source and drain electrodes.

30. A method according to claim 28, wherein the formation of said source and drain electrodes comprises:

forming, on one entire major surface of said substrate, a first thin film made of either one of a material constituting said source and drain electrodes and a material used to form said source and drain electrodes; and removing a portion of said first thin film located outside the first groove by using chemical mechanical polishing.

31. A method according to claim 28, wherein said source and drain electrodes are made of a metal.

32. A method according to claim 28, wherein said gate structure comprises said gate electrode, and said gate electrode and said gate wiring layer are made of a metal.

* * * * *

UNITED STATES PATENT AND TRADEMARK OFFICE
CERTIFICATE OF CORRECTION

PATENT NO. : 6,346,438 B1
DATED : February 12, 2002
INVENTOR(S) : Atsushi Yagishita et al.

It is certified that error appears in the above-identified patent and that said Letters Patent is hereby corrected as shown below:

Column 32,
Line 8, "film groove;" should read -- film; and --.
Line 52, "film an one" should read -- film on one --.

Signed and Sealed this

Seventeenth Day of September, 2002

Attest:

JAMES E. ROGAN
Attesting Officer
Director of the United States Patent and Trademark Office